US006894763B2

(12) United States Patent
Murakami et al.

(10) Patent No.: US 6,894,763 B2
(45) Date of Patent: May 17, 2005

(54) EXPOSURE APPARATUS AND METHODS UTILIZING PLURAL MASK AND OBJECT STAGES MOVABLE IN OPPOSITE DIRECTIONS, AND METHODS OF PRODUCING DEVICES USING THE SAME

(75) Inventors: Seiro Murakami, Chiba (JP); Takaharu Miura, Yamato (JP); Akikazu Tanimoto, Yokohama (JP); Yutaka Ichihara, Yokohama (JP); Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/424,815

(22) Filed: Apr. 29, 2003

(65) Prior Publication Data

US 2003/0218730 A1 Nov. 27, 2003

Related U.S. Application Data

(63) Continuation of application No. 09/575,375, filed on May 22, 2000, now abandoned, which is a continuation of application No. PCT/JP98/05275, filed on Nov. 24, 1998.

(30) Foreign Application Priority Data

Nov. 22, 1997 (JP) .............................................. 9-338044

(51) Int. Cl.$^7$ ........................ G03B 27/42; G03B 27/54; G03B 27/62; G01N 21/86
(52) U.S. Cl. ............................. 355/53; 355/67; 355/75; 250/548
(58) Field of Search ............................. 355/53, 67, 54, 355/55, 49, 77, 43; 250/442.1, 548, 205; 356/399, 400, 401; 318/625, 632

(56) References Cited

U.S. PATENT DOCUMENTS

| 4,458,994 A | 7/1984 | Jain et al. |
| 4,653,903 A | 3/1987 | Torigoe et al. |
| 4,734,746 A | 3/1988 | Ushida et al. |
| 4,769,680 A | 9/1988 | Resor, III et al. |
| 4,780,617 A | 10/1988 | Umatate et al. |
| 4,878,086 A | 10/1989 | Isohata et al. |

(Continued)

FOREIGN PATENT DOCUMENTS

| JP | A-56-49138 | 2/1954 |
| JP | A-57-183031 | 11/1982 |
| JP | A-2-297919 | 12/1990 |
| JP | A-2-297920 | 12/1990 |
| JP | A-2-310912 | 12/1990 |
| JP | A-3-49213 | 3/1991 |
| JP | A-9-312255 | 12/1997 |
| WO | WO98/24115 A1 | 6/1998 |
| WO | WO 98/40791 | 9/1998 |

*Primary Examiner*—Peter B. Kim
(74) *Attorney, Agent, or Firm*—Oliff & Berridge, PLC

(57) ABSTRACT

A mask stage RS1 and a substrate stage WS1 are synchronously moved, and a mask stage RS2 and a substrate stage RS2 are synchronously moved, in a state in which a mask on the mask stage RS1 and a mask on the mask stage RS2 are irradiated with illumination light beams from illumination optical systems IOP1, IOP2 respectively. The reaction force on a base board due to the movement of the stages can be canceled to suppress the vibration of an exposure apparatus by moving the mask stage RS1 and the mask stage RS2 in mutually opposite directions. The throughput can be improved by performing alignment operation on substrate stages WS3, WS4 concurrently with the exposure operation.

103 Claims, 16 Drawing Sheets

U.S. PATENT DOCUMENTS

| | | |
|---|---|---|
| 4,924,257 A | 5/1990 | Jain |
| RE33,836 E | 3/1992 | Resor, III et al. |
| 5,191,374 A | 3/1993 | Hazama et al. |
| 5,194,893 A | 3/1993 | Nishi |
| 5,220,454 A | 6/1993 | Ichihara et al. |
| 5,285,236 A | 2/1994 | Jain |
| 5,307,207 A | 4/1994 | Ichihara |
| 5,383,217 A | 1/1995 | Uemura |
| 5,448,332 A | 9/1995 | Sakakibara et al. |
| 5,473,410 A | 12/1995 | Nishi |
| 5,473,424 A | 12/1995 | Okumura |
| 5,477,304 A | 12/1995 | Nishi |
| 5,504,407 A | 4/1996 | Wakui et al. |
| 5,506,684 A | 4/1996 | Ota et al. |
| 5,534,970 A | 7/1996 | Nakashima et al. |
| 5,581,075 A | 12/1996 | Naraki et al. |
| 5,646,413 A | 7/1997 | Nishi |
| 5,677,758 A | 10/1997 | McEachern et al. |
| 5,686,997 A * | 11/1997 | Shirasu ................. 356/401 |
| 5,691,802 A | 11/1997 | Takahashi |
| 5,715,064 A | 2/1998 | Lin |
| 5,721,605 A | 2/1998 | Mizutani |
| 5,933,216 A | 8/1999 | Dunn |
| 5,969,441 A | 10/1999 | Loopstra et al. |
| 6,023,068 A | 2/2000 | Takahashi |
| 6,262,794 B1 * | 7/2001 | Miyajima ................. 355/53 |
| 6,262,796 B1 | 7/2001 | Loopstra et al. |

* cited by examiner

EXPOSURE APPARATUS AND METHODS UTILIZING PLURAL MASK AND OBJECT STAGES MOVABLE IN OPPOSITE DIRECTIONS, AND METHODS OF PRODUCING DEVICES USING THE SAME

CROSS-REFERENCE

This application is a Continuation application of Ser. No. 09/575,375 filed May 22, 2000 abandoned International Application PCT/JP98/05275 which was filed on Nov. 24, 1998 claiming the conventional priority of Japanese patent application No. 9-338044 filed on Nov. 22, 1997.

BACKGROUND OF THE INVENTION

1. Field of the Invention

The present invention relates to an exposure apparatus, an exposure method, and a method producing devices. In particular, the present invention relates to an exposure apparatus and an exposure method for transferring a pattern formed on a mask onto a substrate by the aid of a projection optical system. The present invention also relates to a method for producing microdevices based on the use of the exposure apparatus and the exposure method.

2. Description of the Related Art

Various exposure apparatuses have been hitherto used, for example, when semiconductor elements or liquid crystal display elements are produced by means of the photolithography step. At present, a projection exposure apparatus is generally used, in which a pattern formed on a photomask or reticle (hereinafter generally referred to as "reticle") is transferred via a projection optical system onto a substrate (hereinafter referred to as "photosensitive substrate", if necessary) such as a wafer or a glass plate applied with a photosensitive material such as photoresist on its surface. In recent years, a reduction projection exposure apparatus (so-called stepper) based on the so-called step-and-repeat system is predominantly used as the projection exposure apparatus, in which a photosensitive substrate is placed on a substrate stage which is movable two-dimensionally, and the photosensitive substrate is moved in a stepwise manner (subjected to stepping) by using the substrate stage to repeat the exposure operation for successively transferring a pattern formed on a reticle onto respective shot areas on the photosensitive substrate.

Recently, a projection exposure apparatus based on the step-and-scan system (scanning type exposure apparatus as described, for example, in Japanese Patent Application Laid-Open No. 7-176468 and U.S. Pat. No. 5,646,413 corresponding thereto), which is obtained by applying modification to the stationary type exposure apparatus such as the stepper, is also used relatively frequently. The projection exposure apparatus based on the step-and-scan system has, for example, the following merits. That is, (1) the projection optical system is easily produced because a large field can be exposed by using a smaller optical system as compared with the stepper, and a high throughput can be expected owing to the decrease in number of shots because a large field is exposed. Further, (2) an averaging effect is obtained owing to relative scanning for the reticle and the wafer with respect to the projection optical system, and it is possible to expect improvement in distortion and depth of focus. Moreover, it is considered that the scanning type projection exposure apparatus will be predominantly used in place of the stepper, because a large field will become essential in accordance with the increase in the degree of integration of the semiconductor element, which is 16 M (mega) bits at present and will become 64 M bits for DRAM, 256 M, and 1 G (giga) bits in future as the progress proceeds along with times.

Such a projection exposure apparatus is principally used as a mass-production machine for semiconductor elements or the like. Therefore, the projection exposure apparatus is necessarily required to have a processing ability such that how many sheets of wafers can be subjected to the exposure process for a certain period of time. That is, the projection exposure apparatus is necessarily required to improve the throughput.

In this context, in the case of the projection exposure apparatus based on the step-and-scan system, when large filed is exposed, the improvement in throughput is expected because the number of shots to be exposed on the wafer is decreased as described above. However, since the exposure is performed during the movement at a constant velocity in accordance with synchronized scanning for the reticle and the wafer, it is necessary to provide acceleration and deceleration areas before and after the constant velocity movement area. If a shot having a size equivalent to a shot size of the stepper is exposed, there is a possibility that the throughput is rather decreased as compared with the stepper.

The outline of the flow of the process in such a projection exposure apparatus is as follows.

(1) At first, a wafer load step is performed, in which a wafer is loaded on a wafer table by using a wafer loader.

(2) Next, a search alignment step is performed, in which the position of the wafer is roughly detected by using a search alignment mechanism. Specifically, the search alignment step is performed, for example, on the basis of the contour of the wafer, or by detecting a search alignment mark on the wafer.

(3) Next, a fine alignment step is performed, in which the position of each of the shot areas on the wafer is accurately determined. In general, the EGA (enhanced global alignment) system is used for the fine alignment step. In this system, a plurality of sample shots included in the wafer are selected beforehand, and positions of alignment marks (wafer marks) affixed to the sample shots are successively measured. Statistical calculation based on, for example, the so-called least square method is performed on the basis of results of the measurement and designed values of the shot array to determine all shot array data on the wafer (see, for example, Japanese Patent Application Laid-Open No. 61-44429 and U.S. Pat. No. 4,780,617 corresponding thereto). In this system, it is possible to relatively accurately determine the coordinate positions-of the respective shot areas at a high throughput.

(4) Next, an exposure step is performed, in which the pattern on the reticle is transferred onto the wafer via the projection optical system while successively positioning the respective shot areas on the wafer to be located at the exposure position on the basis of the coordinate positions of the respective shot areas having been determined in accordance with the EGA system or the like described above and the previously measured baseline amount.

(5) Next, a wafer unload step is performed, in which the wafer on the wafer table having been subjected to the exposure process is unloaded by using a wafer unloader. The wafer unload step is performed simultaneously with the wafer load step (1) described above. That is, a wafer exchange step is constructed by the steps (1) and (5).

As described above, in the conventional projection exposure apparatus, the roughly classified four operations are repeatedly performed by using one wafer stage, i.e., wafer exchange→search alignment→fine alignment→exposure→wafer exchange.

The throughput THOR [sheets/hour] of such a projection exposure apparatus can be represented by the following expression (1) assuming that the wafer exchange time is T1 [sec], the search alignment time is T2 [sec], the fine alignment time is T3 [sec], and the exposure time is T4 [sec].

$$THOR=3600/(T1+T2+T3+T4) \quad (1)$$

The operations of T1 to T4 are executed repeatedly and successively (sequentially) as in T1→T2→T3→T4→T1 .... Accordingly, if the individual elements ranging from T1 to T4 involve high speeds, then the denominator is decreased, and the throughput THOR can be improved. However, as for T1 (wafer exchange time) and T2 (search alignment time) described above, the effect of improvement is relatively small, because only one operation is performed for one sheet of wafer respectively. As for T3 (fine alignment time), the throughput can be improved if the sampling number of shots is decreased in the case of the use of the EGA system, or if the measurement time for a single shot is shortened. However, on the contrary, the alignment accuracy is deteriorated. Therefore, it is impossible to easily shorten T3.

On the other hand, T4 (exposure time) includes the wafer exposure time and the stepping time for movement between the shots. For example, in the case of the scanning type projection exposure apparatus based on, for example, the step-and-scan system, it is necessary to increase the relative scanning velocity between the reticle and the wafer in an amount corresponding to the reduction of the wafer exposure time. However, it is impossible to easily increase the scanning velocity because the synchronization accuracy is deteriorated.

Important conditions for such a projection exposure apparatus other than those concerning the throughput described above include (1) the resolution, (2) the depth of focus (DOF: Depth of Focus), and (3) the line width control accuracy. Assuming that the exposure wavelength is $\lambda$, and the numerical aperture of the projection lens is N.A. (Numerical Aperture), the resolution R is proportional to $\lambda/N.A.$, and the depth of focus (DOF) is proportional to $\lambda/(N.A.)^2$.

Therefore, in order to improve the resolution R (in order to decrease the value of R), it is necessary to decrease the exposure wavelength $\lambda$, or it is necessary to increase the numerical aperture N.A. Especially, in recent years, semiconductor elements or the like have developed to have high densities, and the device rule is not more than 0.2 $\mu$m L/S (line and space). For this reason, a KrF excimer laser is used as an illumination light source in order to perform exposure for the pattern. However, as described above, the degree of integration of the semiconductor element will be necessarily increased in future. Accordingly, it is demanded to develop an apparatus provided with a light source having a wavelength shorter than that of the KrF excimer laser. Representative candidates for the next generation apparatus provided with the light source having the shorter wavelength as described above include, for example, an apparatus having a light source of an ArF excimer laser, and an electron beam exposure apparatus. However, in the case of the electron beam exposure apparatus, an inconvenience arises such that the throughput is extremely lowered as compared with the light beam exposure apparatus.

It is conceived to increase the numerical aperture N.A., as another method to increase the resolution R. However, if N.A. is increased, there is a demerit that DOF of the projection optical system is decreased. DOF can be roughly classified into UDOF (Usable Depth of Focus: a part to be used by user: for example, difference in level of pattern and resist thickness) and the overall focus difference of the apparatus itself. Up to now, UDOF has contributed to DOF in a greater degree. Therefore, the development of the exposure apparatus has been mainly directed to the policy to design those having a large DOF. Those practically used as the technique for increasing DOF include, for example, modified illumination.

By the way, in order to produce a device, it is necessary to form, on a wafer, a pattern obtained by combining, for example, L/S (line and space), isolated L (line), isolated S (space), and CH (contact hole). However, the exposure parameters for performing optimum exposure differ for every shape of the pattern such as L/S and isolated line described above. For this reason, a technique called ED-TREE (except for CH concerning a different reticle) has been hitherto used to determine, as a specification of the exposure apparatus, common exposure parameters (for example, coherence factor $\sigma$, N.A., exposure control accuracy, and reticle drawing accuracy) so that the resolution line width is within a predetermined allowable error with respect to a target value, and a predetermined DOF is obtained. However, it is considered that the following technical trend will appear in future.

(1) In accordance with the improvement in process technology (improvement in flatness on the wafer), the difference in pattern level will be progressively lowered, and the resist thickness will be progressively decreased. There will be a possibility that the UDOF may change from an order of 1 $\mu$m→not more than 0.4 $\mu$m.

(2) The exposure wavelength changes to be short, i.e., g-ray (436 nm)→i-ray (365 nm)→KrF excimer laser (248 nm). However, investigation will be made for only a light source based on the ArF excimer laser (193 nm) and the $F_2$ laser (157 nm) in future. Further technical hurdle is high. Thereafter, the progress will proceed to EB exposure.

(3) It is expected that the scanning exposure such as those based on the step-and-scan system will be predominantly used for the projection exposure apparatus, in place of the stationary exposure such as those based on the step-and-repeat system. The step-and-scan system makes it possible to perform exposure for a large field by using a projection optical system having a small diameter (especially in the scanning direction), in which it is easy to realize high N.A. corresponding thereto.

In the background of the technical trend as described above, the double exposure method is reevaluated as a method for improving the limiting resolution. Trial and investigation are made such that the double exposure method will be used for an ArF exposure apparatus to perform exposure up to those having 0.1 $\mu$m L/S. In general, the double exposure method is roughly classified into the following three methods.

(1) L/S's and isolated lines having different exposure parameters are formed on different reticles, and the exposure is doubly performed for each of them on an identical wafer under an optimum exposure condition.

(2) When the phase shift method or the like is introduced, L/S has a higher limiting resolution at an identical DOF as compared with the isolated line. By utilizing this fact, all patterns are formed with L/S's by using the first reticle, and L/S's are curtailed for the second reticle to form the isolated lines.

(3) In general, when the isolated line is used, a high resolution can be obtained with a small N.A. as compared with L/S (however, DOF is decreased). Accordingly, all patterns are formed with isolated lines, and the isolated lines, which are formed by using the first and second reticles respectively, are combined to form L/S's.

The double exposure method described above has two effects of the improvement in resolution and the improvement in DOF.

However, in the double exposure method, the exposure process must be performed several times by using a plurality of reticles. Therefore, inconveniences arise in that the exposure time (T4) is not less than two-fold as compared with the conventional apparatus, and the throughput is greatly deteriorated. For this reason, actually, the double exposure method has not been investigated so earnestly. The improvement in resolution and depth of focus (DOF) has been hitherto made by means of, for example, the use of a short exposure wavelength, modified illumination, and phase shift reticle.

However, it is doubtless that the realization of exposure up to 0.1 $\mu$m L/S based on the use of the aforementioned double exposure method for the ArF exposure apparatus makes a prevailing choice for the development of the next generation machine aimed at mass production of 256 M bits or 1 G bits DRAM. It has been demanded to develop a new technique for improving the throughput in order to solve the problem of the double exposure method as the bottleneck for the purpose as described above.

In view of the above, it is considered that if two or more of the four operations described above, i.e., the wafer exchange, the search alignment, the fine alignment, and the exposure operation can be simultaneously dealt with in a concurrent manner even partially, the throughput can be improved as compared with the case in which the four operations are performed in the sequential manner. For this purpose, it is premised that a plurality of substrate stages are provided. Theoretically, this arrangement is considered to be easy. However, actually, there are an extremely large number of problems to be solved in order to provide a plurality of substrate stages and exhibit a sufficient effect thereby. For example, a case may be assumed, in which the scanning exposure is performed for a substrate on a first substrate stage, during which the alignment is performed for a substrate on a second substrate stage. The reaction force, which is caused by the acceleration or deceleration of the first substrate stage and a first reticle stage, acts as disturbance on the second stage, and it causes a factor of the alignment error. In order to realize the highly accurate overlay, it is necessary that the alignment is executed for the substrate on the identical substrate stage, and then the exposure is performed by executing the position adjustment for the pattern on the mask and the photosensitive substrate by using the result of the alignment. Therefore, no practical solution can be obtained by a simple countermeasure, i.e., for example, if one of the two substrate stages is exclusively used for the exposure, and the other is exclusively used for the alignment.

The present invention has been made taking the circumstances as described above into consideration, a first object of which is to provide an exposure apparatus and an exposure method which make it possible to improve the throughput.

A second object of the present invention is to provide an exposure apparatus and an exposure method which make it possible to improve the throughput and realize the highly accurate exposure for a fine pattern.

A third object of the present invention is to provide a method for producing devices, which makes it possible to produce a microdevice at low cost.

SUMMARY OF THE INVENTION

According to a first aspect of the present invention, there is provided an exposure apparatus which transfers patterns formed on masks onto substrates, the exposure apparatus comprising:

first and second mask stages (RS1, RS2) which are movable in a first direction while holding the masks (R1, R2) respectively; illumination optical systems (12A, 12B, BMU1, BMU2, IOP1, IOP2) which radiate illumination light beams onto the respective masks; first and second projection optical systems (PL1, PL2) which project the illumination light beams outgoing from the respective masks onto the substrates (W1, W2); first and second substrate stages (WS1, WS2) which are arranged on the same side as that of the first and second mask stages with respect to the first and second projection optical systems respectively and which are movable while holding the substrates (W1, W2) respectively; and a driving unit (22, 40) which synchronously moves the first mask stage and the first substrate stage in the first direction at a velocity ratio corresponding to a projection magnification of the first projection optical system and which synchronously moves the second mask stage and the second substrate stage in the first direction at a velocity ratio corresponding to a projection magnification of the second projection optical system.

According to the present invention, the mask on the first mask stage and the mask on the second mask stage are irradiated with the illumination light beams from the illumination optical systems respectively. In this state, the driving unit is operated so that the first mask stage and the first substrate stage are synchronously moved in the first direction at the velocity ratio corresponding to the projection magnification of the first projection optical system, and the second mask stage and the second substrate stage are synchronously moved in the first direction at the velocity ratio corresponding to the projection magnification of the second projection optical system. Accordingly, the pattern on the mask on the first mask stage is successively transferred onto the substrate on the first substrate stage by the aid of the first projection optical system, simultaneously with which the pattern on the mask on the second mask stage is successively transferred onto the substrate on the second substrate stage by the aid of the second projection optical system. That is, the transfer of the mask patterns is simultaneously performed in a concurrent manner for the two substrates, i.e., the substrate on the first substrate stage and the substrate on the second substrate stage. Therefore, it is possible to improve the throughput.

In this arrangement, in view of the simultaneous concurrent process for the two substrates, there is no special limitation for the direction of the movement of the respective stages during the synchronous movement. However, it is also preferable that the first mask stage (RS1) and the second mask stage (RS2) are moved during the synchronous movement in mutually opposite directions concerning the first direction, and the first substrate stage (WS1) and the second substrate stage (WS2) are moved during the synchronous movement in mutually opposite directions concerning the first direction. In this arrangement, the respective reaction forces, which are generated during the acceleration and deceleration before and after the synchronous movement of the respective mask stages, are counteracted with each other to some extent. Further, the respective reaction forces, which are generated during the acceleration and deceleration before and after the synchronous movement of the respective substrate stages, are counteracted with each other to some extent. Therefore, it is possible to decrease the force in the first direction exerted on the body of the exposure apparatus including support members for the respective stages. Accordingly, it is possible to reduce the synchronization error between the respective sets of the stages. In this case, it is feared that any angular moment or torque having a certain magnitude is exerted on the body. However, little force is generated in a direction perpendicular to the first direction in the movement plane of the stage. Therefore, it is easy to suppress the angular moment or torque, for example, as compared with a case in which any variation (or vibration) of the body in directions of six degrees of freedom is prevented.

In the exposure apparatus described above, it is desirable that the respective mask stages (RS1, RS2) and the respective substrate stages (WS1, WS2) are moved on an identical plane. In this arrangement, it is possible to construct a driving system for the four stages by using a so-called two-dimensional linear actuator (plane motor). Further, only the angular moment acts in the identical plane (neither pitching nor rolling arises) on the body including the support members for the respective stages. Therefore, it is possible to easily suppress the vibration or the like.

It is also preferable that the exposure apparatus described above further comprises a third substrate stage (WS3) which is movable on the same plane as that for the first and second substrate stages (WS1, WS2); and a first mark detection system (28A) which detects a position adjustment mark formed on the substrate. In this arrangement, the patterns on the masks are transferred to the substrates on the first and second substrate stages in accordance with the scanning exposure as described above, during which the position adjustment mark formed on the substrate on the third substrate stage can be detected by using the first mark detection system. Therefore, the exposure operations for the substrates on the two substrate stages are simultaneously performed in a concurrent manner together with the mark position detection operation (alignment operation) for the substrate on the one substrate stage.

In this arrangement, it is also preferable that the driving unit (22, 40) moves the third substrate stage (WS3) in synchronization with the first mask stage (RS1) or the second mask stage (RS2), in place of the first substrate stage (WS1) or the second substrate stage (WS2). In this arrangement, the third substrate stage, for which the detection of the mark position has been completed, is exchanged with the first substrate stage or the second substrate stage. Accordingly, it is possible to perform the scanning exposure in order to transfer the mask pattern onto the substrate on the third substrate stage, immediately after the completion of the exposure operation for the substrates on the first and second substrate stages. In this case, the alignment time for the substrate on the third substrate stage is completely overlapped with the exposure time for the substrates on the first and second substrate stages. Therefore, it is possible to further improve the throughput as compared with the case in which the alignment and the exposure are successively performed in a repeated manner for the substrates on the first and second substrate stages.

It is also preferable that the exposure apparatus described above further comprises a fourth substrate stage (WS4) which is movable on the same plane as that for the first, second, and third substrate stages (WS1, WS2, WS3) while holding the substrate; and a second mark detection system (28B) which detects a position adjustment mark formed on the substrate. In this arrangement, the patterns on the masks are transferred to the substrates on the first and second substrate stages in accordance with the scanning exposure as described above, during which the position adjustment mark formed on the substrate on the third substrate stage can be detected by using the first mark detection system, and the position adjustment mark formed on the substrate on the fourth substrate stage can be detected by using the first mark detection system. Therefore, the exposure operations for the substrates on the two substrate stages are simultaneously performed in a concurrent manner together with the mark position detection operation (alignment operation) for the substrates on the two substrate stages.

In this arrangement, it is also preferable that the driving unit (22, 40) moves the third substrate stage (WS3) and the fourth substrate stage (WS4) in synchronization with the first mask stage (RS1) and the second mask stage (RS2) respectively, in place of the first substrate stage (WS1) and the second substrate stage (WS2). In this arrangement, the third substrate stage, for which the detection of the mark position has been completed, is exchanged with the first substrate stage, and the fourth substrate stage, for which the detection of the mark position has been completed, is exchanged with the second substrate stage. Accordingly, it is possible to perform the scanning exposure in order to transfer the mask patterns onto the substrate on the third substrate stage and the substrate on the fourth substrate stage, immediately after the completion of the exposure operation for the substrates on the first and second substrate stages. In this case, the alignment time for the substrate on the third substrate stage and the substrate on the fourth substrate stage is completely overlapped with the exposure time for the substrates on the first and second substrate stages. Therefore, it is possible to further improve the throughput as compared with the case in which the alignment and the exposure are successively performed in a repeated manner for the substrates on the first and second substrate stages.

In the exposure apparatus described above, it is desirable that the respective mask stages (RS1, RS2) have a substantially identical mass, and the respective substrate stages (WS1, WS2) have a substantially identical mass, because of the following reason. That is, in this arrangement, when the synchronous movement of the first mask stage and the first substrate stage is performed simultaneously with the synchronous movement of the second mask stage and the second substrate stage at an identical target scanning velocity, the reaction forces, which are generated during the acceleration and deceleration of the respective stages, are offset respectively for the mutual mask stages and for the mutual substrate stages. As a result, no force in the first direction is exerted at all on the body including the support members for supporting the respective stages.

In the exposure apparatus described above, it is desirable that the respective projection optical systems (PL1, PL2) have an identical projection magnification, and a mass of each of the mask stages (RS1, RS2) is equal to a value obtained by multiplying a mass of each of the substrate stages (WS1, WS2, WS3, WS4) by the projection magnification, because of the following reason. That is, in this arrangement, the driving unit is operated so that the first mask stage and the first substrate stage (or the third substrate stage) are synchronously moved in the first direction at the velocity ratio corresponding to the projection magnification of the first projection optical system, and the second mask stage and the second substrate stage (or the fourth substrate stage) are synchronously moved in the first direction at the velocity ratio corresponding to the projection magnification of the second projection optical system. If it is assumed, during this process, that the respective stages are moved in a non-contact manner with respect to the support members (driven by linear motors or the like), the law of conservation of momentum holds between the mask stages and the substrate stages which are mutually moved in the synchronized manner. Accordingly, it is possible to perform the scanning with substantially no synchronization error without providing any special apparatus such as a synchronous control circuit and an active vibration-preventive apparatus.

In the exposure apparatus described above, it is desirable that the driving unit drives the first and second mask stages (RS1, RS2) and the first and second substrate stages (WS1, WS2) on an identical straight line, because of the following reason. That is, in this arrangement, the reaction forces, which are generated during the acceleration and deceleration of the stages, are offset respectively for the mutual mask stages and for the mutual substrate stages, in the same manner as in the exposure apparatus described above. As a result, no force in the first direction is exerted at all on the body including the support members for supporting the respective stages. Additionally, no angular moment is exerted as well. Therefore, it is possible to perform the scanning with substantially no synchronization error without providing any special apparatus such as a synchronous control circuit and an active vibration-preventive apparatus.

It is also preferable that the exposure apparatus described above further comprises a mask exchange mechanism (20) which exchanges the mask on the first mask stage (RS1) for the mask on the second mask stage (RS2). In this arrangement, for example, a mask, on which a first divided pattern is formed, is placed on the first mask stage, and a mask, on which a second divided pattern is formed, is placed on the second mask stage. In this state, the first divided pattern and the second divided pattern are respectively transferred to the substrate on the first substrate stage and the substrate on the second substrate stage respectively in accordance with the scanning exposure. After that, the mask exchange mechanism is operated so that the mask on the first mask stage is exchanged with the mask on the second mask stage. The second divided pattern and the first divided pattern are respectively transferred to the substrate on the first substrate stage and the substrate on the second substrate stage respectively in accordance with the scanning exposure. Accordingly, a combined pattern of the first divided pattern and the second divided pattern can be easily transferred to the substrate on the first substrate stage and the substrate on the second substrate stage. That is, it is possible to realize the double exposure for the two substrates simultaneously with ease. Therefore, it is possible to improve the throughput, and it is possible to realize the highly accurate exposure for the fine pattern owing to the improvement in the resolving power and the depth of focus.

It is also preferable that each of the projection optical systems is a cata-dioptric system, and the illumination light beam has a wavelength of not more than 20 nm. In this arrangement, it is possible to highly accurately transfer a fine pattern of not more than submicron order while the projection optical system does not have too large size.

According to a second aspect of the present invention, there is provided an exposure method for transferring patterns formed on masks onto substrates, the method comprising a first step of irradiating the first mask with an illumination light beam (EL), while synchronously moving the first mask (R1) and the first substrate (W1) in a first direction at a velocity ratio corresponding to a projection magnification of a first projection optical system (PL1), so that the pattern formed on the first mask is transferred to a first comparted area on the first substrate via the first projection optical system; and a second step of irradiating the second mask with an illumination light beam (EL), while synchronously moving the second mask (R2) and the second substrate (W2) in the first direction at a velocity ratio corresponding to a projection magnification of a second projection optical system (PL2), simultaneously with the first step, so that the pattern formed on the second mask is transferred to a second comparted area on the second substrate via the second projection optical system.

According to this aspect, the transfer of the pattern on the first mask to the first comparted area on the first substrate in accordance with the scanning exposure in the first step is performed simultaneously with the transfer of the pattern on the second mask to the second comparted area on the second substrate in accordance with the scanning exposure in the second step. That is, the transfer processes of the mask patterns are simultaneously performed in a concurrent manner for the two substrates of the first substrate and the second substrate. Therefore, it is possible to improve the throughput.

In this process, it is also preferable that the exposure method further comprises a third step of detecting position adjustment marks formed on a third substrate (WS3) and a fourth substrate (WS4) which are different from the first and second substrates respectively, simultaneously with the first and second steps. In this process, the exposure operation for the two substrates is simultaneously performed in a concurrent manner together with the mark position-detecting operation (alignment operation) for the two substrate. In this case, the alignment time for the third substrate and the fourth substrate is completely overlapped with the exposure time for the first and second substrates. Therefore, it is possible to further improve the throughput.

It is also preferable that the exposure method described above further comprises a third step of irradiating the second mask with the illumination light beam (EL), while synchronously moving the second mask (R2) and the first substrate (W1) in the first direction at the velocity ratio corresponding to the projection magnification of the first projection optical system (PL) after completing the first and second steps, so that the pattern formed on the second mask is overlay-transferred to the first comparted area on the first substrate (W) via the first projection optical system (PL1); and a fourth step of irradiating the first mask with the illumination light beam, while synchronously moving the first mask (R1) and the second substrate (W2) in the first direction at the velocity ratio corresponding to the projection magnification of the second projection optical system (PL2), simultaneously with the third step, so that the pattern formed on the first mask is overlay-transferred to the second comparted area on the second substrate via the second projection optical system.

In this process, for example, a first divided pattern is previously formed on the first mask, and a second divided pattern is formed on the second mask beforehand. Accordingly, the first divided pattern and the second divided pattern are simultaneously transferred to the first comparted area of the first substrate and the second comparted area of the second substrate respectively in accordance with the scanning exposure in the first and second steps, and then the scanning exposure in the third and fourth steps is performed so that the second divided pattern is transferred to the first comparted area on the first substrate, and the first divided pattern is transferred to the second comparted area on the second substrate. Accordingly, a combined pattern of the first divided pattern and the second divided pattern can be easily transferred to the first comparted area on the first substrate and the second comparted area on the second substrate. That is, the double exposure for the two substrates can be simultaneously realized with ease. Therefore, it is possible to improve the throughput. Further, it is possible to perform the highly accurate exposure for the fine pattern owing to the improvement in the resolving power and the depth of focus.

According to a third aspect of the present invention, there is provided an exposure apparatus which is used in a photolithography process to produce a microdevice, the exposure apparatus comprising a first mask stage (RS1) which holds a first mask (R1); a first projection optical system (PL1) which has at least two reflecting optical elements (M1, M2, M3); a first substrate stage (WS1) which holds a first substrate (W1) on a side of the first mask stage with respect to the first projection optical system; a second mask stage (RS2) which holds a second mask (R2); a second projection optical system (PL2) which has at least two reflecting optical elements (M1, M2, M3); a second substrate stage (RS2) which holds a second substrate (W2) on a side of the second mask stage with respect to the second projection optical system; and a driving unit (22, 40) which drives the first and second substrate stages in mutually opposite directions concerning a predetermined direction when the first and second substrates are subjected to scanning exposure respectively.

According to this aspect, when the first and second substrates are subjected to the scanning exposure, the mask on the first mask stage and the mask on the second mask stage are irradiated with the illumination light beams respectively. In this state, the driving unit is operated so that the first and second substrate stages are driven in the mutually opposite directions concerning the predetermined direction. Accordingly, the transfer of the mask pattern is performed simultaneously for the first substrate and the second substrate in a concurrent manner. Therefore, it is possible to improve the throughput. In this arrangement, it is possible to decrease the force in the predetermined direction exerted on the body of the exposure apparatus including the support members for the first and second substrate stages. Accordingly, it is possible to reduce the synchronization error between the first mask stage and the first substrate stage and between the second mask stage and the second substrate stage.

According to a fourth aspect of the present invention, there is provided an exposure method for transferring a device pattern onto substrates, the exposure method comprising a first step of arranging a first substrate (W1) on a side of a first mask (R1) with respect to a first projection optical system (PL1) so that the first mask and the first substrate are synchronously moved to transfer a pattern on the first mask onto the first substrate; and a second step of arranging a second substrate (W2) on a side of a second mask (R2) with respect to a second projection optical system (PL2) so that the second mask and the second substrate are synchronously moved to transfer a pattern on the second mask onto the second substrate; wherein the first and second steps are executed substantially simultaneously, and the first and second substrates are moved in mutually opposite directions concerning a predetermined direction.

According to this aspect, in the first and second steps, the pattern on the first mask is transferred onto the first substrate by the aid of the first projection optical system, substantially simultaneously with which the pattern on the second mask is transferred onto the second substrate by the aid of the second projection optical system. In this process, the first and second substrates are moved in the mutually opposite directions concerning the predetermined direction. Therefore, it is possible to reduce the synchronization error between the first mask and the first substrate and between the second mask and the second substrate, because of the same reason as that for the invention as defined in claim 16 described above.

In the exposure method described above, in view of the improvement in throughput, there is no special limitation for the movement direction of the first and second masks. Therefore, for example, it is also preferable that the first mask is moved in a direction opposite to the first substrate concerning the predetermined direction, and the second mask is moved in a direction opposite to the second substrate concerning the predetermined direction. In this case, as in the invention as defined in claim 19, it is desirable that the first and second masks and the first and second substrates are moved on an identical straight line.

In the exposure method described above, it is also preferable that a reaction force, which is generated by the synchronous movement of the first mask (R1) and the first substrate (W1), is mutually counteracted by a reaction force which is generated by the synchronous movement of the second mask (R2) and the second substrate (W2).

In the exposure method described above, it is also preferable that the first substrate and the second substrate are moved in mutually opposite directions concerning a direction perpendicular to the predetermined direction respectively after the first and second steps. In this case, for example, when the first and second substrates are subjected to stepping to scanning start positions for the next shot areas respectively after the first mask pattern and the second mask pattern are transferred, for example, to the respective certain shot areas on the first substrate and the second substrate in the first and second steps, then the reaction force generated by the acceleration or deceleration of the first substrate and the reaction force generated by the acceleration or deceleration of the second substrate during the stepping are offset to some extent.

According to a fifth aspect of the present invention, there is provided a method for producing a device, comprising a lithography step based on the use of the exposure apparatus as defined in the first and third aspects. In this aspect, the throughput can be improved owing to the exposure apparatus according to each of the inventions described above. As a result, it is possible to produce a microdevice at low cost.

According to a sixth aspect of the present invention, there is provided a method for producing a device, based on the use of the exposure method as defined in the second and fourth aspects.

According to a seventh aspect of the present invention, there is provided an exposure apparatus for radiating energy beams onto exposure patterns formed on masks to expose objective exposure members with the patterns, the exposure apparatus comprising:

a plurality of mask stages which are movable while holding the masks respectively;

a plurality of object stages which are movable while holding the objective exposure members respectively;

a common base board which movably supports the plurality of mask stages and the plurality of object stages; and a plurality of projection systems which project the energy beams outgoing from the respective masks onto the corresponding objective exposure members, wherein:

the objective exposure members are exposed with the patterns on the respective masks by synchronously moving the respective mask stages and the object stages corresponding thereto with respect to the respective projection systems.

The exposure apparatus according to the present invention is provided with the plurality of subunits of the exposure apparatus each composed of the mask stage, the object stage, and the projection system. The exposure operation can be started by simultaneously operating the subunits. For example, the first mask stage of the first subunit and the second mask stage of the second subunit can be simultaneously moved with respect to the respective projection systems. Any one of the first and second mask stages is supported on the common base board. Therefore, when the control is made so that the movement directions of the mask stages are opposite to one another, it is possible to cancel the reaction force on the base board generated during the movement of the individual mask stages, especially during the acceleration or deceleration to start and complete the movement (scanning). When the control is made so that the movement directions of the first and second mask stages are opposite to one another, the first and second object stages, which correspond to the first and second mask stages, are also moved in the opposite directions. Thus, it is possible to cancel the reaction force on the base board generated during the movement of the individual object stages, especially during the acceleration or deceleration to start and complete the movement. Therefore, according to the exposure apparatus of the present invention, the reaction forces, which are generated by the stage movement in the two subunits, can be canceled in the apparatus, and thus it is possible to reduce the vibration of the main apparatus body and the synchronization error between the stages caused thereby. Further, the exposure operation can be simultaneously executed in the plurality of subunits of the exposure apparatus. Therefore, it is possible to improve the throughput.

The term "common base board" may herein include not only a board-shaped member which has one flat surface, but also a board-shaped member which is provided with a plurality of surfaces for movably supporting one mask stage and the other mask stage in which the heights of the respective surfaces are different from each other. That is, it is sufficient to use a board-shaped member in which the plurality of mask stages and the plurality of object stages are movably supported on at least a part of the board-shaped member respectively. Arbitrary structures and arbitrary materials may be used therefor. However, in view of the fact that the reaction forces, which are generated when the mask stages are moved in the mutually opposite directions, are canceled as described above to easily achieve the object that the vibration of the exposure apparatus is suppressed, it is preferable to use a board-shaped member which has one flat surface and on the surface of which the plurality of mask stages and the plurality of object stages are freely movable.

In the exposure apparatus of the present invention, the mask stages and the object stages may be supported in a floating manner over the base board. The exposure apparatus may further comprise a driving unit such as a linear actuator which makes it possible to support the plurality of mask stages and the plurality of object stages in a non-contact manner and move them over/the base board. The exposure apparatus may further comprise a control unit which controls the driving unit, wherein the control unit controls the driving unit so that at least two of the mask stages are moved in mutually opposite directions.

The exposure apparatus of the present invention may further comprise a support stand, wherein the base board may be fixed on the support stand. In another embodiment, as shown in FIG. 15, it is also preferable that the exposure apparatus further comprises a surface plate, wherein the base board is supported movably on the surface plate, and the base board is movable with respect to the surface plate in response to a reaction force generated by the movement of the stage when the mask stage and/or the object stage is moved. In this arrangement, even when the reaction force on the base board is not canceled in the case of the movement of the single mask stage or in the case of the movement of the plurality of mask stages, the base board can be moved with respect to the surface plate in response to the residual reaction force. During this process, the momentum of the base board is equal to the momentum of the stage. Even when any unbalanced load is generated by the change of the position of the average center of gravity of the stage, it is possible to cancel the unbalanced load by means of the movement of the center of gravity of the base board. Accordingly, it is possible to hold the center of gravity of the entire apparatus at a predetermined position. Even when the stage is moved, especially when a plurality of stages are moved along complicated loci, the exposure apparatus itself is prevented from vibration. When the base board is supported movably over the surface plate, the base board can be allowed to float over the surface plate in a non-contact manner, for example, by using a linear actuator.

The exposure apparatus may be constructed such that the energy beam from a radiation system is radiated from a back surface of the base board, and it is transmitted through the mask on the mask stage supported on a front surface of the base board. The exposure apparatus may further comprise a plurality of radiation systems which radiate the energy beams onto the respective projection systems. The plurality of projection systems may be arranged symmetrically on the base board.

The exposure apparatus may further comprise interferometers which measure positions of the plurality of mask stages and the plurality of object stages on the base board. In this arrangement, the plurality of mask stages and the plurality of object stages may include reflecting members which reflect beams radiated from the interferometers respectively. When a two-dimensional position on the base board is determined by using a rectangular coordinate system defined, on the base board, by a predetermined first axis and a second axis perpendicular thereto; then at least one stage of the plurality of mask stages and the plurality of object stages may include a reflecting surface extending in a direction of a third axis intersecting the first axis and the second axis; and a position of the one stage in the direction of the third axis may be measured by the interferometer by radiating the beam to the reflecting-surface and receiving a reflected light beam therefrom. The exposure apparatus may further comprise a calculating unit which calculates a position coordinate of the one stage on the rectangular coordinate system defined by the first axis and the second axis on the basis of the measured position in the direction of the third axis.

For example, the position of the stage, which is obtained when the interferometer is reset when the measuring beam of the interferometer is firstly radiated onto the reflecting surface, is determined to be the origin position (0, 0) of the rectangular coordinate system defined by the first axis (X axis) and the second axis (Y axis). The position (X, Y) after the movement of the stage can be calculated from the movement distance in the third axis direction measured by the interferometer and the angle of the reflecting surface to intersect the first axis or the second axis. That is, the calculating unit makes it possible to calculate the position coordinate of the stage on the rectangular coordinate system defined by the first axis and the second axis, by using only the measured value of the first interferometer. It is sufficient that only the reflecting surface, which is directed in the direction intersecting the coordinate axis on the rectangular coordinate system, is provided on the stage. Therefore, the number of interferometers and the number of reflecting surfaces can be decreased, and it is possible to realize the exposure apparatus having the simple structure, as compared with the illustrative conventional exposure apparatus in which reflecting mirrors are provided on movable members in the rectangular axis direction on the rectangular coordinate system, and the position of the movable member in the rectangular axis is measured by using a plurality of interferometers respectively. It is also possible to simplify the measurement of the position of the objective exposure member such as a photosensitive substrate, and consequently it is possible to simplify the position control as well. Further, the degree of freedom is improved for the arrangement of the reflecting surfaces. As a result, the degree of freedom is improved for the design of the shape of the stage. Consequently, it is unnecessary to use, as the stage, rectangular stages such as those having square or oblong configurations. For example, when the reflecting surface is arranged obliquely on such a rectangular stage, it is possible to eliminate a portion disposed outside the reflecting surface. Accordingly, it is also possible to use a triangular stage as shown in FIG. 16. Therefore, it is possible to realize a small size and a light weight of the mask or the object stage which is movable two-dimensionally while holding the mask or the object.

The exposure apparatus is preferably a projection exposure apparatus, especially a scanning type projection exposure apparatus to be used in a lithography step for producing a device. In this case, the objective exposure member may be, for example, a photosensitive substrate which is sensitive to the energy beam including, for example, a particle beam such as an electron beam, and an electromagnetic wave or a light beam having an arbitrary wavelength such as visible light, ultraviolet light, and X-ray.

According to an eighth aspect of the present invention, there is provided an exposure apparatus for exposing second objects with energy beams radiated to first objects each having a pattern, the exposure apparatus comprising:

a plurality of first movable members which holds the first objects, the first movable members being arranged on a first surface plate for relatively moving the first objects with respect to the energy beams;

a plurality of second movable members which holds the second objects, the second movable members being arranged on the first surface plate for relatively moving the second objects with respect to the energy beams in synchronization with the movement of the first objects during scanning exposure for the second objects; and illumination optical systems each of which includes at least one optical element arranged on a side opposite to the first object with respect to the first surface plate in order to radiate the energy beam to the first object held by each of the first movable members.

According to a ninth aspect of the present invention, there is provided an exposure method for exposing substrates with energy beams radiated onto masks, comprising:

synchronously moving the first mask and the first substrate therefor, and synchronously moving the second mask and the second substrate therefor, in order to perform scanning exposure for the first and second substrates with the energy beams respectively, wherein the first and second masks or the first and second substrates are moved in opposite directions on an identical plane. The synchronous movement of the first mask and the first substrate may be performed substantially simultaneously with the synchronous movement of the second mask and the second substrate. The first and second masks and the first and second substrates may be arranged on the identical plane. The first and second masks and the first and second substrates may be moved in the opposite directions respectively.

According to a tenth aspect of the present invention, there is provided a method for producing an exposure apparatus which transfers patterns formed on masks onto substrates, the method comprising the steps of:

providing first and second mask stages which are movable in a first direction while holding the masks respectively;

providing illumination optical systems which radiate illumination light beams onto the respective masks;

providing first and second projection optical systems which project the illumination light beams outgoing from the respective masks onto the substrates respectively;

providing first and second substrate stages which are arranged on the same side as that of the first and second mask stages with respect to the first and second projection optical systems respectively and which are movable while holding the substrates respectively; and providing a driving unit which synchronously moves the first mask stage and the first substrate stage in the first direction at a velocity ratio corresponding to a projection magnification of the first projection optical system and which synchronously moves the second mask stage and the second substrate stage in the first direction at a velocity ratio corresponding to a projection magnification of the second projection optical system.

According to an eleventh aspect of the present invention, there is provided a method for producing an exposure apparatus which is used in a photolithography step to produce a microdevice, the method comprising the steps of:

providing a first mask stage which holds a first mask;

providing a first projection optical system which has at least two reflecting optical elements;

providing a first substrate stage which holds a first substrate on a side of the first mask stage with respect to the first projection optical system;

providing a second mask stage which holds a second mask;

providing a second projection optical system which has at least two reflecting optical elements;

providing a second substrate stage which holds a second substrate on a side of the second mask stage with respect to the second projection optical system; and providing a driving unit which drives the first and second substrate stages in mutually opposite directions concerning a predetermined direction when the first and second substrates are subjected to scanning exposure respectively.

According to a twelfth aspect of the present invention, there is provided a method for producing an exposure apparatus for radiating energy beams onto exposure patterns formed on masks to expose objective exposure members with the patterns, the method comprising the steps of:

providing a plurality of mask stages which are movable while holding the masks respectively;

providing a plurality of object stages which are movable while holding the objective exposure members respectively;

providing a common base board which movably supports the plurality of mask stages and the plurality of object stages; and providing a plurality of projection systems which project the energy beams outgoing from the respective masks onto the corresponding objective exposure members respectively, wherein:

the exposure apparatus is operated such that the objective exposure members are exposed with the patterns on the respective masks by synchronously moving the respective mask stages and the object stages corresponding thereto with respect to the respective projection systems.

BEST MODE FOR CARRYING OUT THE INVENTION

An embodiment of the present invention will be explained below on the basis of FIGS. 1 to 14.

Figure 1:
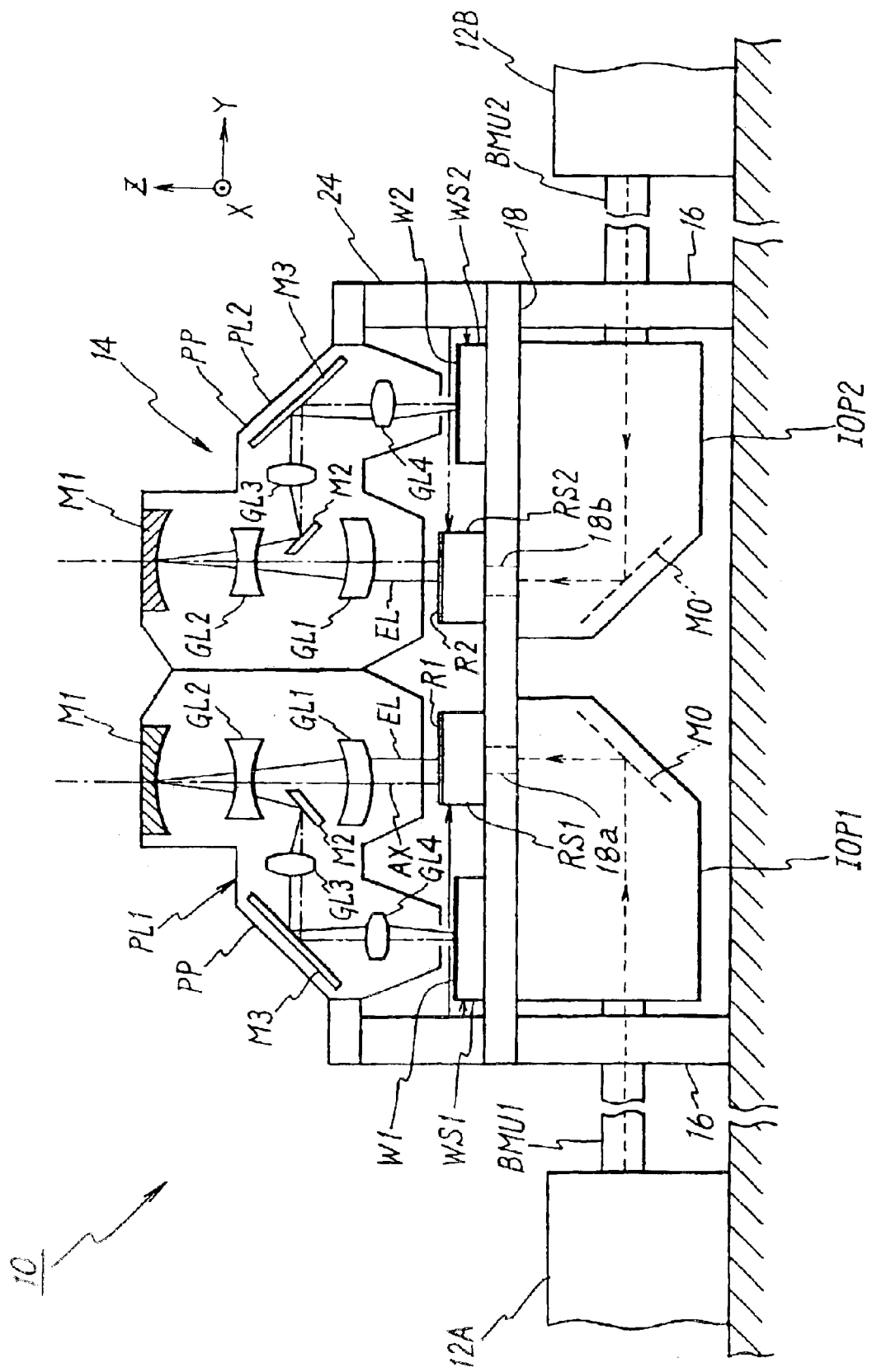
FIG. 1 schematically shows an arrangement of an exposure apparatus according to an embodiment of the present invention.
Figure 2:
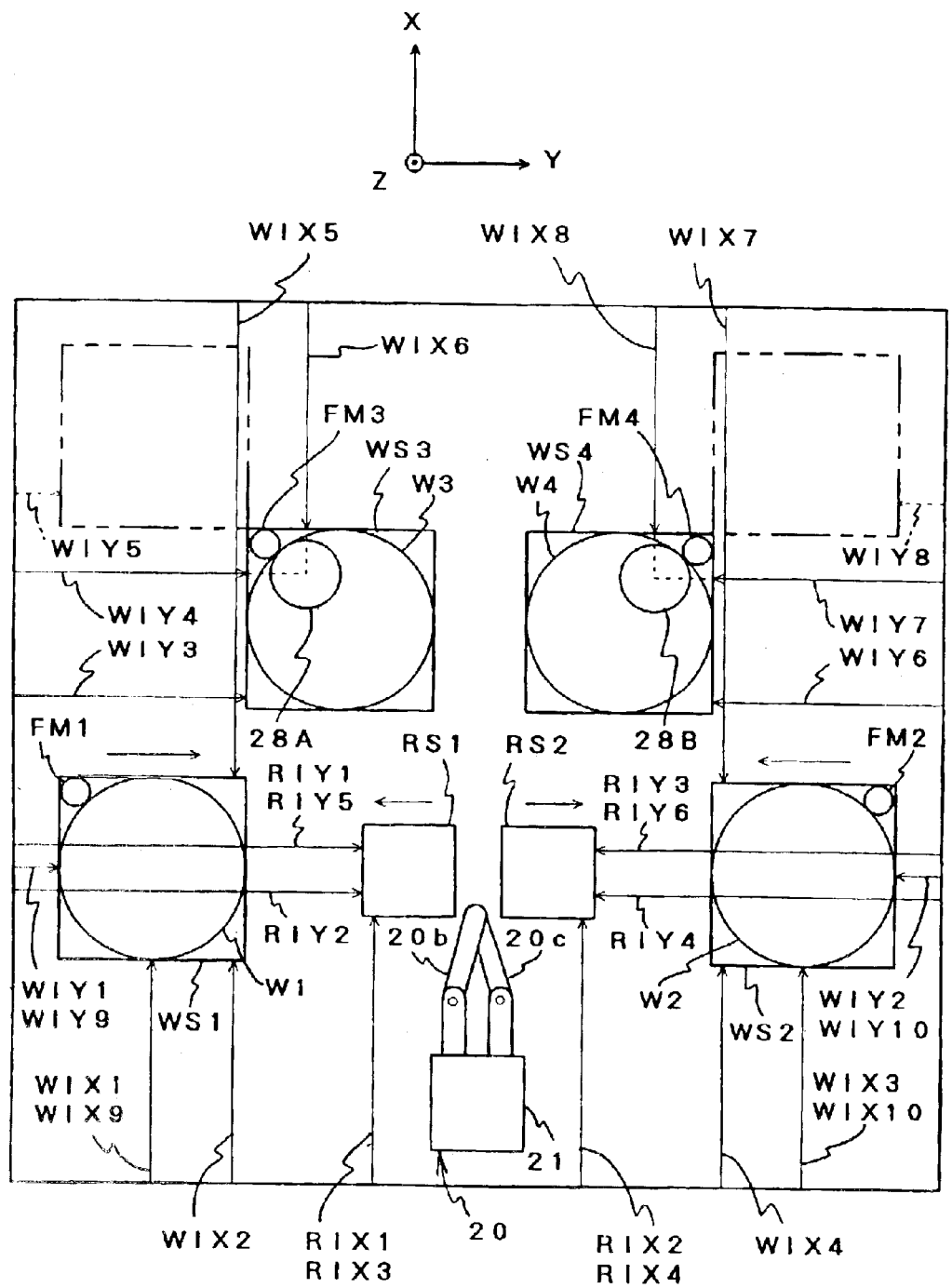
FIG. 2 shows a plan view of a main exposure apparatus body, obtained by removing projection optical systems for constructing the exposure apparatus shown in FIG. 1.

FIG. 1 schematically shows an arrangement of an exposure apparatus 10 according to the embodiment. FIG. 2 shows a plan view of a main exposure apparatus body, obtained by removing projection optical systems of the exposure apparatus 10.

The exposure apparatus 10 is a scanning exposure type projection exposure apparatus based on the so-called step-and-scan system. For example, Japanese Patent Application Laid-Open No. 2-229423 and U.S. Pat. No. 4,924,257 corresponding thereto disclose, as a projection exposure system based on the step-and-scan system, a combination of a method, i.e., a so-called scan & stitching method in which an excimer laser beam is used as an illumination light beam, an effective projection area of a reduction projection optical system having a circular projection field is restricted to a polygon (hexagon), and both ends of the effective projection area in the non-scanning direction are partially overlapped. A projection exposure apparatus, which adopts the scanning exposure system as described above, is also disclosed, for example, in Japanese Patent Application Laid-Open No. 4-196513 and U.S. Pat. No. 5,473,410 corresponding thereto, Japanese Patent Application Laid-Open No. 4-277612 and U.S. Pat. No. 5,194,893 corresponding thereto, and Japanese Patent Application Laid-Open No. 4-307720 and U.S. Pat. No. 5,506,684 corresponding thereto. The exposure systems are also applicable to the exposure apparatus and the exposure method of the present invention. The Japanese patent documents and the United States patent documents are incorporated herein by reference.

The exposure apparatus 10 comprises a pair of excimer laser light sources 12A, 12B, and a main exposure apparatus body 14 to which the excimer laser light sources 12A, 12B are connected via beam matching units BMU1, BMU2 respectively.

In FIG. 1, the excimer laser light sources 12A, 12B and the main exposure apparatus body 14 are drawn closely to one another for the purpose of convenience. However, actually, the main exposure apparatus body 14 is accommodated in an environmental chamber (not shown) which is installed in a super clean room and in which the internal space is highly prevented from dust, and the temperature is controlled highly accurately. The excimer laser light sources 12A, 12B are installed in another room (service room having low cleanness) isolated from the super clean room.

The main exposure apparatus body 14 comprises, for example, a base board 18 which is supported horizontally by a plurality of (in this embodiment, four of) vibration-preventive pads 16, first and second wafer stages WS1, WS1 as first and second substrate stages which are movable in the XY two-dimensional plane independently on the base board 18 while holding wafers W1, W2 as substrates (first and second substrates), first and second reticle stages RS1, RS2 as first and second mask stages which are movable on the base board 18 principally in a predetermined scanning direction, i.e., in the Y axis direction in this embodiment (right and left directions in the plane of paper in FIG. 1) while holding first and second reticles R1, R2 as first and second masks, first and second projection optical systems PL1, PL2 which are arranged over the stages WS1, RS1 and over the stages WS2, RS2 respectively, first and second illumination optical systems IOP1, IOP2 which are arranged under the base board 18, for illuminating the reticles R1, R2 from downward positions, and a control system.

As shown in FIG. 2, further two substrate stages, i.e., third and fourth wafer stages WS3, WS4 as third and fourth substrate stages are also arranged on the base board 18. A reticle exchange mechanism 20 as a mask exchange mechanism is also arranged on the base board 18.

Each of the excimer laser light sources 12A, 12B is used as an exposure light source. In this embodiment, each of the excimer laser light sources 12A, 12B pulse-emits an ArF excimer laser light beam having a wavelength of 193 nm. The pulse laser light beam in the ultraviolet region from the excimer laser light source 12A, 12B is used as the exposing illumination light beam in this embodiment in order to obtain the pattern resolving power of a minimum line width of about 0.25 to 0.10 μm necessary to mass-produce micro circuit devices having a degree of integration and a degree of fineness corresponding to semiconductor memory elements (D-RAM) of the class of 256 M (mega) bits to 4 G (giga) bits or more. The exposing illumination light beam is not limited to the ArF excimer laser light beam. For example, it is also preferable to use a KrF excimer laser light beam having a wavelength of 248 nm, an $F_2$ excimer laser light beam having a wavelength of 157 nm, a higher harmonic wave such as copper vapor laser and YAG laser, and a bright line in the ultraviolet region from super high voltage mercury lamp (for example, g-ray and i-ray), as well as a light beam (EUV light beam) in the soft X-ray region having a wavelength of 5 to 15 nm. However, in order to realize the minimum line width of 0.10 μm, it is desirable to use, for example, the $F_2$ excimer laser light beam and the EUV light beam.

The wavelength width of the ArF excimer laser light beam (pulse laser beam) is narrow-banded so that the chromatic aberration, which results from various refracting optical elements for constructing the projection optical systems. PL1, PL2 and the illumination optical system of the exposure apparatus, is within an allowable range. The absolute value of the central wavelength to be narrow-banded and the value of the narrow band width (between 0.2 pm to 300 pm) are displayed on an unillustrated operation panel, and they can be finely adjusted from the operation panel, if necessary. The operation panel can be used to set the mode of pulse light emission (representatively including three modes of self-exciting oscillation, external trigger oscillation, and oscillation for maintenance).

Examples of the exposure apparatus, which use the excimer laser as the light source, are disclosed, for example, in Japanese Patent Application Laid-Open No. 57-198631 (U.S. Pat. No. 4,458,994 corresponding thereto), Japanese Patent Application Laid-Open No. 1-259533 (U.S. Pat. No. 5,307,207 corresponding thereto), Japanese Patent Application Laid-Open No. 2-135723 (U.S. Pat. No. 5,191,374 corresponding thereto), and Japanese Patent Application Laid-Open No. 2-294013 (U.S. Pat. No. 5,383,217). Examples of the exposure apparatus, in which the excimer laser light source is utilized for the step-and-scan exposure, are disclosed, for example, in Japanese Patent Application Laid-Open No. 2-229423 (U.S. Pat. No. 4,924,257 corresponding thereto) described above, Japanese Patent Application. Laid-Open No. 6-132195 (U.S. Pat. No. 5,477,304 corresponding thereto), and Japanese Patent Application Laid-Open No. 7-142354 (U.S. Pat. No. 5,534,970 corresponding thereto). Therefore, the basic techniques disclosed in the respective patent documents described above can be also applied to the exposure apparatus 10 shown in FIG. 1, exactly as they are, or after they are partially altered. The Japanese patent documents and the United States patent documents described above are incorporated herein by reference.

The laser beams from the excimer laser light sources 12A, 12B pass through BMU1, BMU2 respectively, and they come into the first and second illumination optical systems IPO1, IPO2 respectively.

Each of the first and second illumination optical systems IPO1, IPO2 comprises, for example, a beam expander, a turret plate which holds a plurality of ND filters having different transmittances so that one of them is arranged in the illumination optical path, an illuminance-uniformalizing optical system which includes a (double) fly's eye lens system and a vibration mirror, a relay lens system, a fixed blind, and a movable blind (each of them is not shown). The arrangement, in which the double fly's eye lens system and the vibration mirror are combined, is disclosed in detail, for example, in Japanese Patent Application Laid-Open No. 1-235289 and U.S. Pat. No. 5,307,207 corresponding thereto and Japanese Patent Application Laid-Open No. 7-142354 and U.S. Pat. No. 5,534,970 corresponding thereto. The disclosure of the patent documents is incorporated herein by reference.

The function of the illumination optical systems IPO1, IPO2 will now be briefly explained. The laser beam, which is radiated from the excimer laser light source 12A, 12B, comes into the illumination optical system. The laser beam is shaped to have an appropriate beam diameter by the aid of the beam expander. The laser beam comes into the illuminance-uniformalizing optical system to reduce the speckle and uniformalize the illuminance therein. The laser beam passes through the movable blind which is installed at the position conjugate to the reticle R (reticle R1, R2) by the aid the lens system. The laser beam arrives at the fixed blind which is arranged at the position slightly defocused from the conjugate plane of the reticle R so that its cross-sectional configuration is defined to have a predetermined shape. After that, the laser beam passes through the relay lens system and the bending mirror MO, and it behaves as the uniform illumination light beam (exposure light beam) EL which illuminates an illumination area IAR (see FIG. 6) having a predetermined configuration, i.e., a rectangular slit-shaped configuration in this embodiment as defined by the fixed blind on the reticle R. The exposure light beam EL, which has transmitted through the illumination area IAR, comes into each of the first and second projection optical systems PL1, PL2 as described later on. In the embodiment of the present invention, the illumination system is constructed by the illumination optical systems IPO1, IPO2, the beam matching units BMU1, BMU2, and the laser light sources 12A, 12B. Apertures 18a, 18b, which are used to allow the illumination light beams EL bent by the bending mirrors MO to pass therethrough, are formed through the base board 18 respectively. The illumination light beams EL pass through the apertures 18a, 18b, and they arrive at the reticles R1, R2 held by the reticle stages RS1, RS2 respectively. The apertures 18a, 18b can be omitted as well by constructing the base board 18 with a light-transmissive material.

An pneumatic damper is used for the vibration-preventive pad 16. The vibration from the installation floor is successfully insulated at a micro G level.

Each of the four wafer stages WS1, WS2, WS3, WS4 has a square planar configuration. The masses of them (strictly, total sums of the respective wafer stages WS and the wafers W) m1, m2, m3, m4 are equal to one another. That is, the masses of the respective wafer stages are set so that m1, m2, m3, m4=m holds. Each of the four wafer stages WS1, WS2, WS3, WS4 is supported in a floating manner over the base board 18 while maintaining a spacing distance of several microns by the aid of a magnetically floating type two-dimensional linear actuator 22 (not shown in FIG. 1, see FIG. 5) provided on the base board 18. Each of the four wafer stages WS1, WS2, WS3, WS4 is independently driven two-dimensionally in the XY plane.

This arrangement will be described in further detail below. An unillustrated magnet is provided in the bottom surface of the wafer stage WS1, WS2, WS3, WS4. Coils (for constructing X circuit, Y circuit, and Z circuit) are embedded at predetermined intervals substantially over the entire surface except for certain portions at the inside of the base board 18. A part of the two-dimensional linear actuator (see FIG. 5) is constructed by the coils and the magnets provided at the bottom surfaces of the wafer stages WS1, WS2, WS3, WS4 respectively. In this arrangement, the wafer stage WS1, WS2, WS3, WS4 is supported in a floating manner over the base board 18 in accordance with the action of the magnetic force of the magnet provided at the bottom surface and the magnetic force in the Z direction generated by the current flowing through the coil for constructing the Z circuit. The wafer stage WS1, WS2, WS3, WS4 is freely driven independently in the XY two-dimensional plane, and it is finely driven as well in the Z axis direction and in the direction inclined with respect to the XY plane by controlling the current flowing through the coil by the aid of the main control unit 40 (not shown in FIG. 1, see FIG. 5) as described later on. Accordingly, this arrangement makes it possible to control the positions and the attitudes of the wafer stages WS1, WS2, WS3, WS4 in the directions of six degrees of freedom.

The first, second, third, and fourth wafers W1, W2, W3, W4 are fixed, for example, by means of vacuum suction by the aid of unillustrated wafer holders on the wafer stages WS1, WS2, WS3, WS4 respectively. Fiducial mark plates FM1, FM2, FM3, FM4, on which various fiducial marks (for example, a first fiducial mark and a pair of second fiducial marks as described later on) are formed, are installed on the upper surfaces of the wafer stages WS1, WS2, WS3, WS4 so that the fiducial mark plates FM1, FM2, FM3, FM4 are substantially at the same height as those of the wafers W1, W2, W3, W4 respectively. The fiducial mark plates FM1, FM2, FM3, FM4 are used, for example, when the reference position of each of the wafer stages is detected, and when the reticle alignment is performed.

Surfaces on the both sides in the X axis direction and both sides in the Y axis direction (i.e., surfaces in the four directions) of the wafer stages WS1, WS2, WS3, WS4 are reflecting surfaces which are mirror-finished. Interferometer beams of respective measuring axes, which constitute the interferometer system as described later on, are projected onto the reflecting surfaces. The reflected light beams therefrom are received by the respective interferometers. Accordingly, the displacement is measured from the reference position of each of the reflecting surfaces (in general, a fixed mirror is arranged on the side surface of the projection optical system or the side surface of the alignment optical system, and the concerning surface is regarded as the reference plane). Thus, the two-dimensional positions of the wafer stages WS1, WS2, WS3, WS4 are measured respectively. The arrangement of the measuring axes of the interferometer system will be described in detail later on.

Each of the first and second reticle stages RS1, RS2 has a square planar configuration, and it is supported in a floating manner over the base board 18 while maintaining a spacing distance of several microns by the aid of a magnetically floating type two-dimensional linear actuator provided on the base board 18. Each of the first and second reticle stages RS1, RS2 is independently driven in the Y axis direction (rightward and leftward directions on the plane of paper in FIG. 1) and in the X axis direction. Further, each of the first and second reticle stages RS1, RS2 is finely driven in the X axis direction and in the θ direction as well by the aid of the magnetically floating type two-dimensional linear actuator.

This arrangement will be described in further detail below. An unillustrated magnet is provided in the bottom surface of the reticle stage RS1, RS2. A part of the two-dimensional linear actuator 22 is constructed by the coils (for constructing X circuit, Y circuit, and Z circuit) embedded at the inside of the base board 18 and the magnets provided at the bottom surfaces of the reticle stages RS1, RS2 respectively. In this arrangement, the reticle stage RS1, RS2 is supported in a floating manner over the base board 18 in accordance with the action of the magnetic force of the magnet provided at the bottom surface of the reticle stage RS1, RS2 and the magnetic force in the Z direction generated by the current flowing through the coil for constructing the Z circuit. The reticle stage RS1, RS2 is driven independently at a predetermined stroke in the Y direction, and it is finely driven as well in the X direction and with respect to the plane in the rotational direction about the Z axis by controlling the current flowing through the coil by the aid of the main control unit 40 (see FIG. 5). Accordingly, this arrangement makes it possible to control the positions of the reticle stages RS1, RS2 in the XY plane.

The reticles R1, R2 are fixed, for example by means of vacuum suction on the reticle stages RS1, RS2 respectively. In the embodiment of the present invention, the mass of the reticle stage RS1 (more strictly, total sum of the reticle stage RS1 and the reticle R1) M1 is substantially equal to the mass of the reticle stage RS2 (more strictly, total sum of the reticle stage RS2 and the reticle R2) M2. That is, the masses of the respective reticle stages are set so that M1=M2=M holds. Further, in the embodiment of the present invention, assuming that the projection magnification of the projection optical system P1, P2 described later on is $\beta$, the mass M of the reticle stage is obtained by multiplying the mass m of the wafer stage by the projection magnification $\beta$. That is, the mass M of the reticle stage and the mass m of the wafer stage are determined respectively so that the relationship of M=$\beta$m holds.

A side surface on the first side in the Y direction (left side in FIG. 1) and a side surface on the first side in the X direction (front side in the plane of paper in FIG. 1) of the reticle stage RS1 are reflecting surfaces which are mirror-finished. Similarly, a side surface on the second side in the Y direction (right side in FIG. 1) and a side surface on the first side in the X direction (front side in the plane of paper in FIG. 1) of the reticle stage RS2 are reflecting surfaces which are mirror-finished. Interferometer beams of respective measuring axes, which constitute the interferometer system as described later on, are projected onto the reflecting surfaces. The reflected light beams therefrom are received by the respective interferometers. Accordingly, the displacement is measured from the reference position of each of the reflecting surfaces (in general, a fixed mirror is arranged on the side surface of the projection optical system, and the concerning surface is regarded as the reference plane). Thus, the two-dimensional positions of the reticle stages RS1, RS2 are measured respectively. The arrangement of the measuring axes of the interferometer system will be described in detail later on.

Body tubes PP of the respective first and second projection optical systems PL1, PL2 are integrated into one unit which is held on a main body column 24 provided on the base board 18. Each of the projection optical systems PL1, PL2 comprises the body tube PP which has openings at a surface portion opposed to the reticle and at a surface portion opposed to the wafer, and four lens groups GL1 to GL4 and three reflecting optical elements (convex mirror and plane mirror) M1 to M3 which constitute the reduction optical system (projection magnification β (β is, for example ¼)) as a whole.

Figure 3:
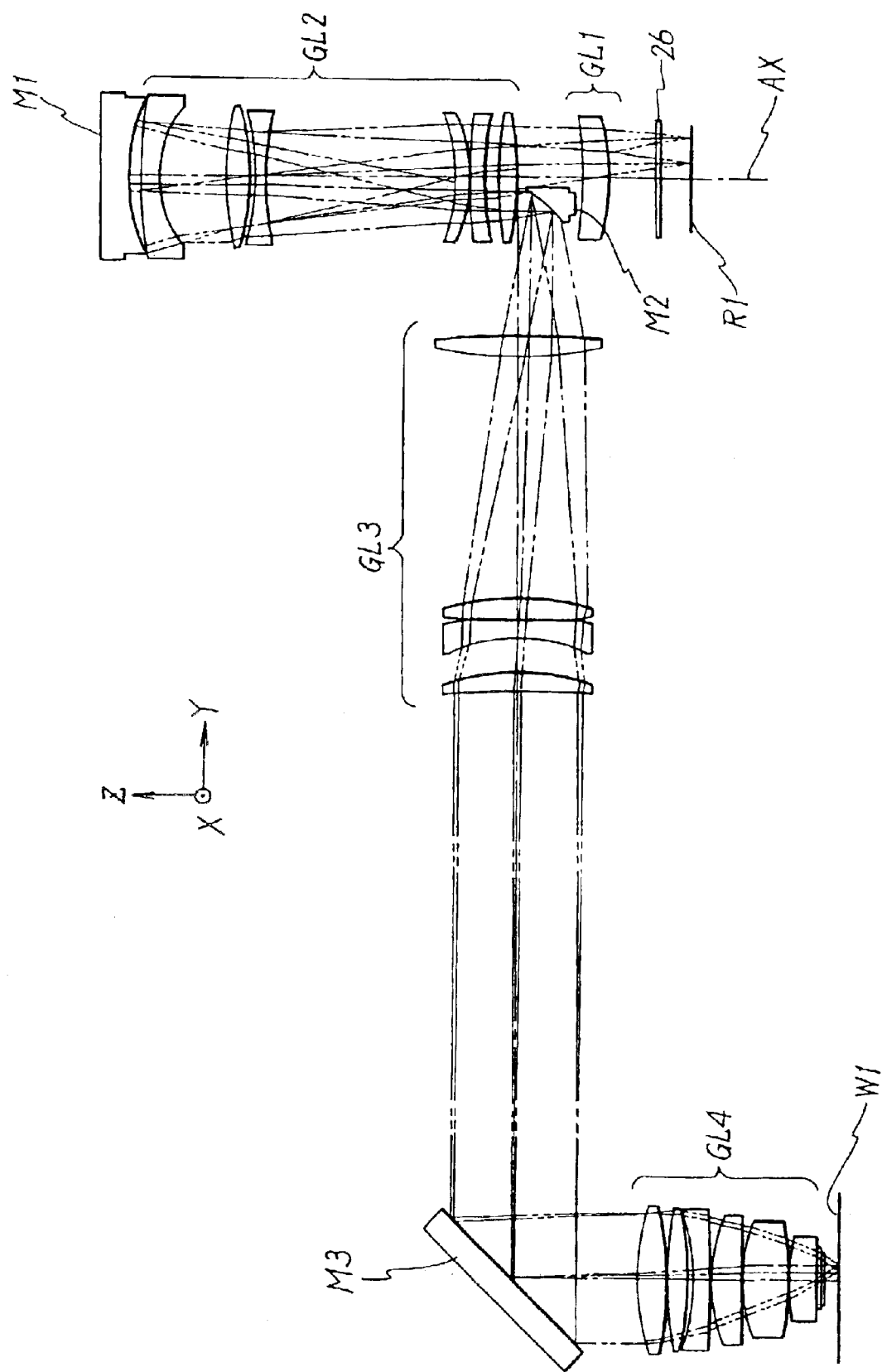
FIG. 3 shows a specified example of the arrangement of the projection optical system shown in FIG. 1.

FIG. 3 shows a specified example of the arrangement of the optical system for constructing the first projection optical system PL1. As shown in FIG. 3, the first lens group GL1 comprises a convex lens (or a plurality of lenses having a common optical axis AX in the Z axis direction) arranged over the reticle R1 with the optical axis AX which is in the Z axis direction. The second lens group GL2 comprises a plurality of concave lenses and convex lenses arranged over the first lens group GL1 with the common optical axis AX in the Z axis direction. The fourth lens group GL4 comprises a plurality of concave lenses and convex lenses arranged over the wafer W1 with a common optical axis in the Z axis direction.

A concave mirror M1 is arranged over the second lens group GL2 described above. A mirror M2 (or a reflecting surface thereof) is provided obliquely at a position of the pupil plane of the projection optical system PL1 under the second lens group GL2. A plane mirror M3 having a relatively large size is provided obliquely over the fourth lens group GL4. A third lens group GL3, which comprises a plurality of lenses with an optical axis in a direction perpendicular to the Z axis, is arranged between the mirror M2 and the plane mirror M3. In FIG. 3, an aberration correction plate 26, which is used to correct any rotationally asymmetrical aberration, for example, any distortion, is arranged between the reticle R1 and the first lens group GL1. It is also possible to use, as the projection optical systems PL1, PL2, a system (cata-dioptric system) obtained by combining a refractive optical element and a reflecting optical element (for example, concave mirror and beam splitter) as disclosed, for example, in Japanese Patent Application Laid-Open No. 3-282527 and U.S. Pat. No. 5,220,454 corresponding thereto. It is also possible to improve and use an optical system disclosed in Japanese Patent Application Laid-Open No. 8-304705 and U.S. Pat. No. 5,691,802 corresponding thereto. The disclosure of the Japanese patent documents and the United States patent documents is incorporated herein by reference.

As shown in FIG. 1, in the projection optical system PL1 described above, the exposure light beam EL, which is transmitted from a downward position to an upward position through the reticle R, is successively transmitted through right half portions of the first lens group GL1 and the second lens group GL2 in the projection optical system PL1, and it arrives at the concave mirror M1. The exposure light beam EL is reflected thereby in a direction symmetrical to the incoming direction with respect to the optical axis AX. The exposure light beam EL is transmitted through a left half portion of the second lens group GL2, and it arrives at the mirror M2. Subsequently, the exposure light beam EL is reflected by the mirror M2, it is transmitted through an upper half portion of the third lens group GL3, and it arrive at the plane mirror M3. The exposure light beam is reflected by the plane mirror M3, it is transmitted through a right half portion of the fourth lens group GL4, and it arrives at the wafer W1.

As described above, the projection optical system PL1 constitutes the reduction optical system which is telecentric on the both sides and which has the reduction magnification (projection magnification) β (β is, for example ¼) as a whole. The second projection optical system PL2 is also constructed in exactly the same manner as the projection optical system PL1 (provided that the arrangement of the respective optical elements is left-right symmetric). The second projection optical system PL2 constitutes the reduction optical system which is telecentric on the both sides and which has the reduction magnification (projection magnification) β (β is, for example ¼) as a whole. Therefore, the movement velocity in the scanning direction of the wafer stage WS1, WS2 (or wafer stage WS3, WS4) during the scanning exposure described later on is ¼ of the movement velocity of the reticle stage RS1, RS2.

Although not shown in FIG. 1, alignment systems 28A, 28B based on the off-axis system are actually arranged on the other sides in the X axis direction of the projection optical systems PL1, PL2 (deep sides in the plane of paper shown in FIG. 1) as shown in the plan view in FIG. 2. The alignment systems 28A, 28B based on the off-axis system, which have the same function as first and second mark detection systems, are installed at left-right symmetric positions which are separated in the Y direction by an identical distance with reference to the X axis passing through the boundary between the first and second projection optical systems PL1, PL2 (see FIG. 4). Each of the alignment systems 28A, 28B has three types of alignment sensors based on the LSA (Laser Step Alignment) system, the FIA (Field Image Alignment) system, and the LIA (Laser Interferometric Alignment) system. The alignment systems 28A, 28B make it possible to perform the position measurement in the X, Y two-dimensional directions for the fiducial mark on the fiducial mark plate and the alignment mark as the position adjustment mark on the wafer. It is also possible to use, as the alignment system 28A, 28B, an alignment sensor based on the off-axis system obtained by combining the FIA system and the LIA system while sharing a part of their optical systems as disclosed, for example, in Japanese Patent Application Laid-Open No. 7-321030 and U.S. Pat. No. 5,721,605 corresponding thereto. The disclosure of the Japanese patent document and the United States patent document is incorporated herein by reference.

The LSA system is the most versatile sensor for measuring the mark position by radiating a laser beam onto a mark and utilizing diffracted and scattered light, and it has been hitherto widely used for process wafers. The FIA system is a sensor for measuring the mark position by illuminating a mark with broad band (wide band) light emitted from a halogen lamp or the like and performing image processing for a mark image, and it is effectively used for an aluminum layer and an asymmetric mark on a wafer surface. The LIA system is a sensor for detecting the position information of a mark by radiating laser beams having slightly changed frequencies in two directions onto the mark having a diffraction grating-shaped configuration, and interfering two generated diffracted light beams to detect the position information of the mark from the phase, and it is effectively used for wafers having a low difference in level and surface roughness.

In the embodiment of the present invention, the three types of the alignment sensors are appropriately selected and used depending on the purpose to perform, for example, the so-called search alignment in which the one-dimensional mark position is detected at three points on the wafer to approximately measure the position of the wafer, and the fine alignment in which the correct position is measured for respective shot areas on the wafer.

In this arrangement, the alignment system 28A is used, for example, to measure the position of the alignment mark on the wafer W3 (or W1) held by the wafer stage WS3 (or WS1)

and the fiducial mark formed on the fiducial mark plate FM3 (or FM1). The alignment system 28B is used, for example, to measure the position of the alignment mark on the wafer W4 (or W2) held by the wafer stage WS4 (or WS2) and the fiducial mark formed on the fiducial mark plate FM4 (or FM2).

Figure 5:
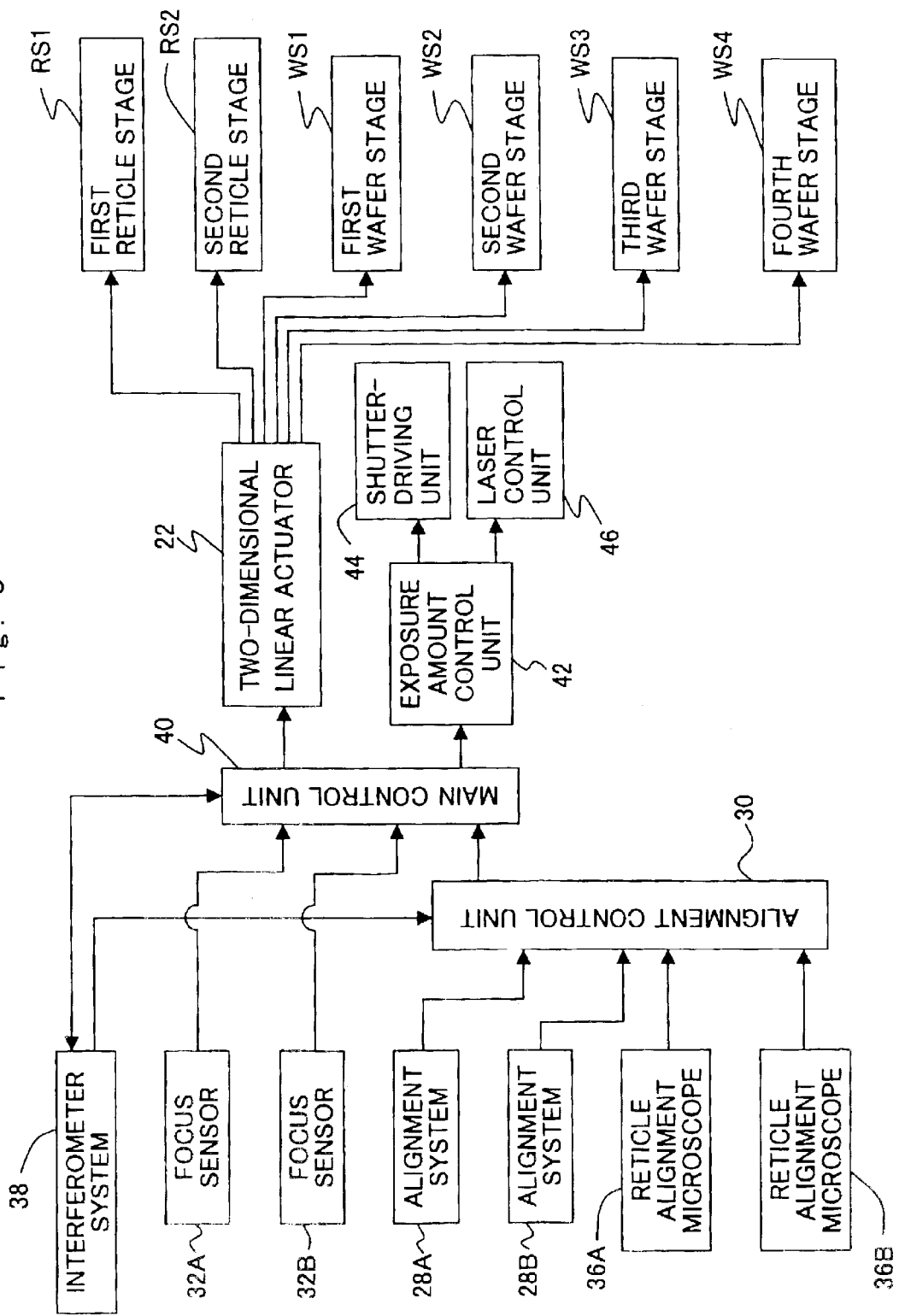
FIG. 5 shows a schematic arrangement of a control system of the apparatus shown in FIG. 1.

The information from the respective alignment sensors for constructing the alignment systems 28A, 28B is sent to an alignment control unit 30 (see FIG. 5). The alignment control unit 30 A/D-converts the information from the respective alignment sensors, and it calculates and processes the digitized waveform signal to detect the mark position. The result of the detection of the mark position is sent to the main control unit 40. The main control unit 40 controls the magnetically floating type two-dimensional linear actuator 22 depending on the result to perform, for example, the correction of the synchronization position during the exposure.

Figure 4:
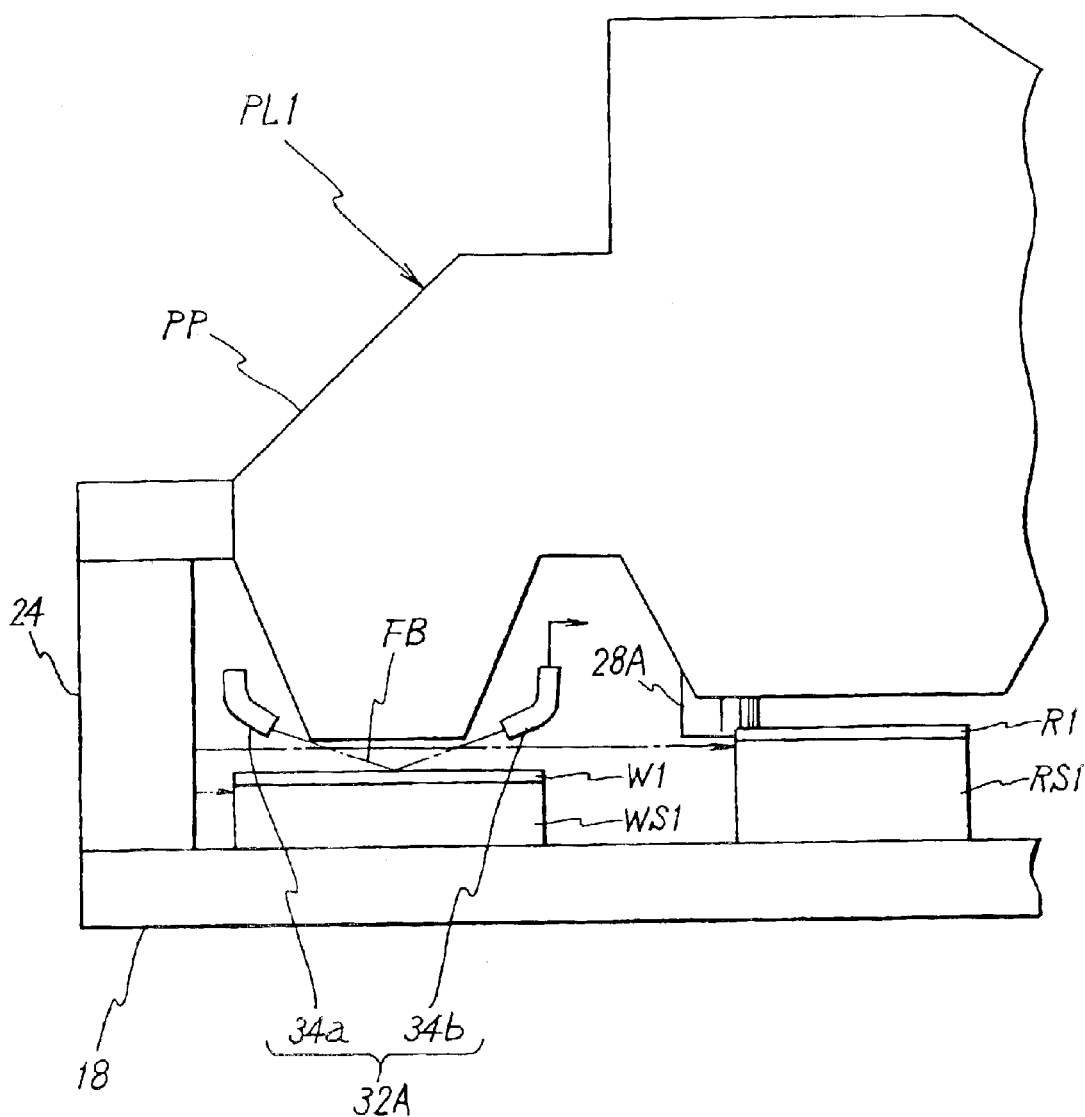
FIG. 4 shows, in a magnified manner, those disposed in the vicinity of a first wafer stage of the apparatus shown in FIG. 1.

Although not shown in FIG. 1, a focus sensor 32A (see FIG. 5) based on the oblique incidence system for detecting the position of the wafer W1 in the Z direction on the basis of the body tube PP is provided at a position in the vicinity of the end of the first projection optical system PL1 on the side opposed to the wafer. As shown in FIG. 4, the focus sensor 32A comprises a light-feeding system 34a which is fixed to the body tube PP by the aid of an unillustrated holding member, for radiating a detecting beam FB in an oblique direction onto the surface of the wafer W1, and a light-receiving system 34b which is fixed to the body tube PP by the aid of an unillustrated holding member as well, for receiving the detecting beam FB reflected by the surface of the wafer W1. A focus sensor 32B (see FIG. 5), which is constructed in exactly the same manner as the focus sensor 32A, is also provided at a position in the vicinity of the end of the second projection optical system PL2 on the side opposed to the wafer. Measured values obtained by the focus sensors 32A, 32B are supplied to the main control unit 40. Owing to the focus sensors 32A, 32B, the main control unit 40 can detect (calculate) not only the position in the Z direction of the wafer surface but also the inclination thereof. Those usable as the focus sensor 32A, 32B include, for example, a multiple focus position detection system disclosed in Japanese Patent Application Laid-Open No. 6-283403 and U.S. Pat. No. 5,448,332 corresponding thereto, and a focus leveling system disclosed in Japanese Patent Application Laid-Open No. 7-201699 and U.S. Pat. No. 5,473,424 corresponding thereto. The Japanese patent documents and the United States patent documents are incorporated herein by reference.

A focus sensor based on the oblique incidence system, which is similar to the focus sensors 32A, 32B, may be provided for the alignment system 28A, 28B. In this arrangement, the autofocus/autoleveling is executed on the basis of the focus leveling measurement and control in the same manner as in the exposure, during the measurement of the alignment mark by using the alignment system 28A, 28B. Thus, it is possible to perform the alignment measurement with a high degree of accuracy. In other words, no offset (error) is generated, which would be otherwise caused by the attitude of the wafer stage between the exposure and the alignment. Alternatively, in place of the focus sensor based on the oblique incidence system, for example, it is also possible to use a focus sensor based on the TTL system for detecting the position of the wafer in the Z direction by the aid of an object optical system of an alignment system based on the off-axis system, as disclosed in Japanese Patent Application Laid-Open No. 7-321030 and U.S. Pat. No. 5,721,605 corresponding thereto. The disclosure of the Japanese patent document and the United States patent document is incorporated herein by reference.

The exposure apparatus 10 according to the embodiment of the present invention further comprises, at the inside of the first and second illumination optical systems IOP1, IOP2, a pair of reticle alignment microscopes 36A, 36B (not shown in FIG. 1, see FIG. 5) composed of TTR (Through The Reticle) alignment optical systems based on the use of an exposure wavelength to simultaneously observe the reticle marks (not shown) on the reticles and the marks on the fiducial mark plates FM1 to FM4 by the aid of the projection optical systems PL1, PL2 respectively. Those having an arrangement equivalent to one disclosed, for example, in Japanese Patent Application Laid-Open No. 7-176468 and U.S. Pat. No. 5,646,413 corresponding thereto are used as the reticle alignment microscopes 36A, 36B. Detection signals obtained thereby are supplied to the alignment control unit 30 to calculate the relative positional relationship between the reticle mark and the fiducial mark on the fiducial mark plate. The result of the calculation is supplied to the main control unit 40. The Japanese patent document and the United States patent document are incorporated herein by reference.

Next, explanation will be made with reference to FIG. 2 for the interferometer system 38 (see FIG. 5) for managing the positions of the wafer stages WS1, WS2, WS3, WS4 and the reticle stages RS1, RS2. FIG. 2 representatively shows the concerning laser interferometers by using the measuring axes of the respective laser interferometers for constructing the interferometer system 38.

As shown in FIG. 2, the interferometer system 38 includes a total of ten of laser interferometers RIY1 to RIY6, RIX1 to RIX4 for measuring the positions of the reticle stages RS1, RS2 in the XY plane, and a total of twenty of laser interferometers WIY1 to WIY10, WIX1 to WIX10 for measuring the positions of the wafer stages WS1 to WS4 in the XY plane.

In FIG. 2, there is provided the interferometer RIY5 for radiating, onto the reflecting surface of the reticle stage RS1, the measuring beam parallel to the measuring beam of the interferometer RIY1 in the Y-Z plane. The difference in measured value between the two interferometers RIY1, RIY5 is divided by the spacing distance between the axes of the interferometers in the Z direction. Thus, it is possible to detect the angle of rotation of the reticle stage RS1 about the X axis. Similarly, the interferometer RIY6, which is based on the use of the measuring beam parallel to the measuring beam of the interferometer RIY3, is provided for the reticle stage RS2 as well. It is possible to detect the angle of rotation about the X axis.

Further, there is also provided the interferometer RIX3 for radiating, onto the reflecting surface of the reticle stage RS1, the measuring beam parallel to the measuring beam of the interferometer RIX1 in the X-Z plane. The difference in measured value between the two interferometers RIX1, RIX3 is divided by the spacing distance between the axes of the interferometers in the Z direction. Thus, it is possible to detect the angle of rotation of the reticle stage RS1 about the Y axis. Similarly, the interferometer RIY4, which is based on the use of the measuring beam parallel to the measuring beam of the interferometer RIX3, is provided for the reticle stage RS2 as well. It is possible to detect the angle of rotation about the Y axis.

The interferometer RIY1 measures the position of the reticle stage RS1 in the Y direction at the position of projection of the measuring beam by projecting the measuring beam in the Y direction onto the reflecting surface of the reticle stage RS1 and receiving the reflected light beam therefrom. Similarly, the interferometer RIY2 measures the position of the reticle stage RS1 in the Y direction at the position of projection of the measuring beam by projecting the measuring beam in the Y direction onto the reflecting surface of the reticle stage RS1 and receiving the reflected light beam therefrom. The center of the positions of projection of the measuring beams of the two interferometers RIY1, RIY2 is coincident with the center of the illumination area IAR (see FIG. 6) (center of the reticle R1 in the X direction). Therefore, the average value of the measured values of the two interferometers gives the position of the reticle stage RS1 in the Y direction, and the value obtained by dividing the difference between the both measured values by the spacing distance between the axes of the interferometers gives the angle of rotation of the reticle stage RS1 about the Z axis. The measured values obtained by the interferometers RIY1, RIY2 are supplied to the main control unit 40. The main control unit 40 calculates the average value, the angle of rotation, and the velocity information.

The interferometer RIX1 measures the position of the reticle stage RS1 in the X direction by projecting the measuring beam in the X direction onto the reflecting surface of the reticle stage RS1 and receiving the reflected light beam therefrom. The measured value obtained by the interferometer RIX1 is supplied to the main control unit 40.

The interferometer RIY3 measures the position of the reticle stage RS2 in the Y direction at the position of projection of the measuring beam by projecting the measuring beam in the Y direction onto the reflecting surface of the reticle stage RS2 and receiving the reflected light beam therefrom. Similarly, the interferometer RIY4 measures the position of the reticle stage RS2 in the Y direction at the position of projection of the measuring beam by projecting the measuring beam in the Y direction onto the reflecting surface of the reticle stage RS2 and receiving the reflected light beam therefrom. The center of the positions of projection of the measuring beams of the two interferometers RIY3, RIY4 is coincident with the center of the illumination area IAR (see FIG. 6) (center of the reticle R2 in the X direction). Therefore, the average value of the measured values of the two interferometers gives the position of the reticle stage RS2 in the Y direction, and the value obtained by dividing the difference between the both measured values by the spacing distance between the axes of the interferometers gives the angle of rotation of the reticle stage RS2 about the Z axis. The measured values obtained by the interferometers RIY3, RIY4 are supplied to the main control unit 40. The main control unit 40 calculates the average value, the angle of rotation, and the velocity information.

The interferometer RIX2 measures the position of the reticle stage RS2 in the X direction by projecting the measuring beam in the X direction onto the reflecting surface of the reticle stage RS2 and receiving the reflected light beam therefrom. The measured value obtained by the interferometer RIX2 is supplied to the main control unit 40.

In FIG. 2, there is provided the interferometer WIY9 for radiating, onto the reflecting surface of the wafer stage WS1 (or WS3), the measuring beam parallel to the measuring beam of the interferometer WIY1 in the Y-Z plane. The difference in measured value between the two interferometers WIY1, WIY9 is divided by the spacing distance between the axes of the interferometers in the Z direction. Thus, it is possible to detect the angle of rotation of the wafer stage WS1 (or WS3) about the X axis. Further, there is also provided the interferometer WIX9 for radiating, onto the reflecting surface of the wafer stage WS1 (or WS3), the measuring beam parallel to the measuring beam of the interferometer WIX1 in the X-Z plane. The difference in measured value between the two interferometers WIX1, WIX9 is divided by the spacing distance between the axes of the interferometers in the Z direction. Thus, it is possible to detect the angle of rotation of the wafer stage WS1 (or WS3) about the Y axis.

The interferometers WIY1, WIY9, WIX1, WIX2, WIX9 are principally used to manage the position of the wafer stage WS1 (or WS3) at the exposure position. The interferometer WIY1 measures the position of the wafer stage WS1 (or WS3) in the Y direction by projecting the measuring beam in the Y direction onto the reflecting surface of the wafer stage WS1 (or WS3) at the exposure position and receiving the reflected light beam therefrom. The position of radiation of the measuring beam of the interferometer WIY1 is coincident with the center in the X direction of the exposure area IA (see FIG. 6) on the wafer corresponding to the illumination area IRA.

The interferometer WIX1 measures the position of the wafer stage WS1 (or WS3) in the X direction at the position of projection of the measuring beam by projecting the measuring beam in the X direction onto the reflecting surface of the wafer stage WS1 (or WS3) at the exposure position and receiving the reflected light beam therefrom. The optical axis of the measuring beam of the interferometer WIX1 is coincident with the center in the X direction of the exposure area IA (see FIG. 6) on the wafer corresponding to the illumination area IRA. Further, the interferometer WIX2 measures the position of the wafer stage WS1 (or WS3) in the X direction at the position of projection of the measuring beam by projecting the measuring beam in the X direction onto the reflecting surface of the wafer stage WS1 (or WS3) and receiving the reflected light beam therefrom. The measured values of the two interferometers WIX1, WIX2 are supplied to the main control unit 40. The main control unit 40 manages the position of the wafer stage WS1 (or WS3) in the X direction during the exposure on the basis of the measured value of the interferometer WIX1. The main control unit 40 divides the difference between the measured values of the interferometers WIX1, WIX2 by the spacing distance between the axes of the interferometers in the Y direction to determine the angle of rotation of the wafer stage WS1 (or WS3) about the Z axis.

In FIG. 2, there is provided the interferometer WIY10 for radiating, onto the reflecting surface of the wafer stage WS2 (or WS4), the measuring beam parallel to the measuring beam of the interferometer WIY2 in the Y-Z plane. The difference in measured value between the two interferometers WIY2, WIY10 is divided by the spacing distance between the axes of the interferometers in the Z direction. Thus, it is possible to detect the angle of rotation of the wafer stage WS2 (or WS4) about the X axis. Further, there is also provided the interferometer WIX10 for radiating, onto the reflecting surface of the wafer stage WS2 (or WS4), the measuring beam parallel to the measuring beam of the interferometer WIX3 in the X-Z plane. The difference in measured value between the two interferometers WIX3, WIX10 is divided by the spacing distance between the axes of the interferometers in the Z direction. Thus, it is possible to detect the angle of rotation of the wafer stage WS2 (or WS4) about the Y axis.

Similarly, the interferometers WIY2, WIY3, WIY10, WIX4, WIX10 are principally used to manage the position of the wafer stage WS2 (or WS4) at the exposure position.

The interferometer WIY2 measures the position of the wafer stage WS2 (or WS4) in the Y direction by projecting the measuring beam in the Y direction onto the reflecting surface of the wafer stage WS2 (or WS4) at the exposure position and receiving the reflected light beam therefrom. The position of radiation of the measuring beam of the interferometer WIY2 is coincident with the center in the X direction of the exposure area IA (see FIG. 6) on the wafer corresponding to the illumination area IRA.

The interfetometer WIX3 measures the position of the wafer stage WS2 (or WS4) in the X direction at the position of projection of the measuring beam by projecting the measuring beam in the X direction onto the reflecting surface of the wafer stage WS2 (or WS4) at the exposure position and receiving the reflected light beam therefrom. The optical axis of the measuring beam of the interferometer WIX3 is coincident with the center in the Y direction of the exposure area IA (see FIG. 6) on the wafer corresponding to the illumination area IRA. Further, the interferometer WIX4 measures the position of the wafer stage WS2 (or WS4) in the X direction at the position of projection of the measuring beam by projecting the measuring beam in the X direction onto the reflecting surface of the wafer stage WS2 (or WS4) and receiving the reflected light beam therefrom. The measured values of the two interferometers WIX3, WIX4 are supplied to the main control unit 40. The main control unit 40 manages the position of the wafer stage WS2 (or WS4) in the X direction during the exposure on the basis of the measured value of the interferometer WIX3. The main control unit 40 divides the difference between the measured values of the interferometers WIX3, WIX4 by the spacing distance between the axes of the interferometers in the Y direction to determine the angle of rotation of the wafer stage WS2 (or WS4) about the Z axis.

The interferometers WIY4, WIX6 are used to manage the position of the wafer stage WS3 (or WS1) at the alignment position. The interferometer WIY4 measures the position of the wafer stage WS3 (or WS1) in the Y direction at the position of projection of the measuring beam by projecting the measuring beam in the Y direction onto the wafer stage WS3 (or WS1) at the alignment position and receiving the reflected light beam therefrom. As for the interferometer WIY4, only one measuring axis is depicted in FIG. 2 for the purpose of simplification. However, actually, the two-axis interferometer having two measuring axes is used. The central axis of the optical axes of the two measuring beams passes through the detection center of the alignment system 28A. The measured values of the respective measuring axes are supplied from the interferometer WIY4 to the alignment control unit 30 and the main control unit 40. The main control unit 40 manages the position in the Y direction and the θ rotation in the X-Y plane of the wafer stage WS3 (or WS1) during the alignment (during the detection of the alignment mark on the wafer) on the basis of the measured values of the interferometer WIY4.

The interferometer WIX6 measures the position of the wafer stage WS3 (or WS1) in the X direction at the position of projection of the measuring beam by projecting the measuring beam in the X direction onto the wafer stage WS3 (or WS1) at the alignment position and receiving the reflected light beam therefrom. The optical axis of the measuring beam of the interferometer WIX6 passes through the detection center of the alignment system 28A. The measured value of the interferometer WIX6 is supplied to the alignment control unit 30 and the main control unit 40.

The interferometers WIY7, WIX8 are used to manage the position of the wafer stage WS3 (or WS1) at the alignment position. The interferometer WIY7 measures the position of the wafer stage WS4 (or WS2) in the Y direction at the position of projection of the measuring beam by projecting the measuring beam in the Y direction onto the wafer stage WS4 (or WS2) at the alignment position and receiving the reflected light beam therefrom. As for the interferometer WIY7, only one measuring axis is depicted in FIG. 2 for the purpose of simplification. However, actually, the two-axis interferometer having two measuring axes is used. The central axis of the optical axes of the two measuring beams passes through the detection center of the alignment system 28A. The measured values of the respective measuring axes are supplied from the interferometer WIY7 to the alignment control unit 30 and the main control unit 40. The main control unit 40 manages the position in the Y direction and the θ rotation in the X-Y plane of the wafer stage WS4 (or WS2) during the alignment (during the detection of the alignment mark on the wafer) on the basis of the measured values of the interferometer WIY7.

The interferometer WIX8 measures the position of the wafer stage WS4 (or WS2) in the X direction at the position of projection of the measuring beam by projecting the measuring beam in the X direction onto the wafer stage WS4 (or WS2) at the alignment position and receiving the reflected light beam therefrom. The optical axis of the measuring beam of the interferometer WIX8 passes through the detection center of the alignment system 28A. The measured value of the interferometer WIX8 is supplied to the alignment control unit 30 and the main control unit 40.

The interferometer WIY4, which is used to control the position of the wafer stage WS3 (or WS1), is the two-axis interferometer. However, the interferometer WIY4 may be a three-axis interferometer which further has a measuring beam parallel to the two measuring axes in the Y-Z plane so that the angle of rotation about the X axis (in the Y-Z plane) is detected. Further, the interferometer WIX6 may be a two-axis interferometer which has two parallel measuring axes in the X-Z plane so that the angle of rotation of the wafer stage WS3 (or WS1) about the Y axis (in the X-Z plane) is detected. Similarly, one measuring beam may be added to each of the interferometers WIY7, WIY8 to be used for controlling the position of the wafer stage WS4 (WS2) so that the respective angles of refraction about the X axis and the Y axis (in the Y-Z plane and the X-Z plane) of the wafer stage WS4 (WS2) are detected.

As clarified from the above, in the embodiment of the present invention, the main control unit 40 is used to manage the XY two-dimensional positions of the respective wafer stages without involving the so-called Abbe error during any of the exposure and the alignment by the aid of the interferometer system 38. Especially, during the exposure, the positions in the X direction and the Y direction and the angles of refraction about the Z axis can be detected for the reticle stages and the wafer stages which are movable with the six degrees of freedom.

The interferometers WIY5, WIX5 are principally used to manage the wafer stage WS1 (see FIG. 7) (or WS3) at the wafer exchange position (loading position). The interferometer WIY5 measures the position in the Y direction of the wafer stage WS1 (or WS3) by projecting the measuring beam in the Y direction onto the wafer stage WS1 (or WS3) and receiving the reflected light beam therefrom. The interferometer WIX5 measures the position in the X direction of the wafer stage WS1 (or WS3) by projecting the measuring beam in the X direction onto the wafer stage WS1 (or WS3) and receiving the reflected light beam therefrom. The measured values of the interferometers WIY5, WIX5 are supplied to the main control unit 40.

Similarly, the interferometers WIY8, WIX7 are principally used to manage the wafer stage WS2 (see FIG. 7) (or WS4) at the wafer exchange position (loading position). The interferometer WIY8 measures the position in the Y direction of the wafer stage WS2 (or WS4) by projecting the measuring beam in the Y direction onto the wafer stage WS2 (or WS4) and receiving the reflected light beam therefrom. The interferometer WIX7 measures the position in the X direction of the wafer stage WS2 (or WS4) by projecting the measuring beam in the X direction onto the wafer stage WS2 (or WS4) and receiving the reflected light beam therefrom. The measured values of the interferometers WIY8, WIX7 are supplied to the main control unit 40. In the embodiment of the present invention, the interferometers WIX5, WIY5 or WIX7, WIY8 are used to control the position of the wafer stage at the loading position. However, for example, an encoder may be used to control the position of the wafer stage in place of the interferometer.

The remaining interferometer WIY3 is provided in order to manage the positions of the stages when the wafer stages WS1, WS3 are exchanged. The interferometer WIY6 is provided in order to manage the positions of the stages when the wafer stages WS2, WS4 are exchanged. The method for managing the movement of the wafer stage including the method for using the interferometers will be described later on.

The interferometers RIY1 to RIY6 for measuring the positions of the reticle stages RS1, RS2 have their measuring beams (measuring beams) which are disposed at positions higher than the upper surfaces of the wafer stages WS1, WS2 (or WS3, WS4). The beams are not intercepted by the movement of the wafer stages WS1, WS2 (or WS3, WS4).

Pairs of double-path interferometers may be used respectively for the interferometers RIY1, RIY2, RIY5 or RIY3, RIY4, RIY6 for managing the positions of the reticle stages RS1, RS2 in the Y direction which is the scanning direction (direction of the scanning). That is, for example, a pair of corner cube mirrors may be installed on the first side (left side in FIG. 1) in the Y direction of the reticle stage RS1. A pair of double-path interferometers for radiating measuring beams onto the corner cube mirrors may be used to manage the position of the reticle stage RS1 in the Y direction. By doing so, the respective double-path interferometers are not affected by the rotation (yawing) of the reticle stage. Therefore, it is possible to manage the position of the reticle stage more correctly.

Next, the reticle exchange mechanism 20 will be explained. The reticle exchange mechanism 20 comprises two articulated robot arms 20b, 20c for loading and unloading the reticle, and a driving unit 21 for driving the robot arms. The reticle exchange mechanism constitutes a part of the reticle transport system. The reticle is delivered between an unillustrated reticle loader and the reticle stages RS1, RS2 by the aid of the robot arms 20b, 20c. The reticles are also exchanged with each other between the reticle stages RS1, RS2. The mutual reticle exchange between the reticle stages RS1, RS2 is principally performed during the double exposure.

Further, the exposure apparatus 10 of the embodiment of the present invention comprises two unillustrated wafer exchange mechanisms. The respective wafer exchange mechanisms exchange the wafers between the wafer stage WS2 (or WS4) and the wafer stage WS1 (or WS3) at the loading positions.

Next, the control system for the exposure apparatus 10 will be explained on the basis of FIG. 5. The control system principally comprises the main control unit 40 which is composed of a work station (or a microcomputer) for integrally controlling the entire apparatus.

As shown in FIG. 5, for example, the interferometer system 38, the focus sensors 32A, 32B, and the alignment control unit 30 are connected to the main control unit 40. The magnetically floating type two-dimensional linear actuator 22 and the exposure amount control unit 42 are also connected to the main control unit 40. For example, the shutter-driving unit is connected to the exposure amount control unit 42.

The operation of the exposure apparatus 10 according to the embodiment of the present invention during the exposure will now be explained principally referring to the operation of the respective constitutive components of the control system described above.

The exposure amount control unit 42 gives the shutter-driving unit 44 an instruction to open unillustrated shutters provided at the outgoing ends of the light sources 12A, 12b, before starting the synchronous movement of the reticles R1, R2 and the wafers W1, W2 (or W3, W4). Further, the shutter-driving unit 44 drives the movable blinds arranged in the illumination optical systems IOP1, IOP2 respectively, in response to the scanning positions of the reticle R1 and the reticle R2. Accordingly, it is possible to prevent those other than the shot areas on the wafer to be subjected to the scanning exposure from being unnecessarily exposed with the illumination light beam passing through portions located outside the pattern area of the reticle immediately before the start and immediately before the completion of the scanning exposure.

After that, the main control unit 40 starts the synchronized scanning (scanning control) between the reticle R1 and the wafer W1 and between the reticle R2 and the wafer W2, i.e., between the reticle stage RS1 and the wafer stage WS1 and between the reticle stage RS2 and the wafer stage WS2 by the aid of the two-dimensional linear actuator 22. The synchronized scanning is performed by controlling the two-dimensional linear actuator 22 by the main control unit 40 while monitoring the measured values obtained by the interferometers RIY1, RIY2, RIX1, RIX5, WIY1, WIY9, WIX1, WIX2, WIX9 and the interferometers RIY3, RIY4, RIY6, RIX2, WIY2, WIY10, WIX3, WIX4, WIX10 which constitute the interferometer system 38 described above. That is, in the embodiment of the present invention, the driving unit is constructed by the main control unit 40 and the two-dimensional linear actuator 22 controlled thereby.

The reticle stage RS1 and the wafer stage WS1 as well as the reticle stage RS2 and the wafer stage WS2 are subjected to the constant velocity control within a predetermined allowable error. At this point of time, the exposure amount control unit 42 instructs the laser control units 46 provided in the excimer laser light sources 12A, 12B so that the pulse light emission is started. Accordingly, the rectangular illumination areas IAR, which are defined by the fixed blinds on the reticles R1, R2 with the patterns vapor-deposited with chromium, are illuminated with the illumination light beams (exposure light beams) EL from the illumination optical systems IOP1, IOP2. The images of the patterns in the illumination areas are reduced ¼-fold by the projection optical systems PL1, PL2, and they are projected onto the wafers W1, W2 with the photoresist applied on their surfaces.

Figure 6:
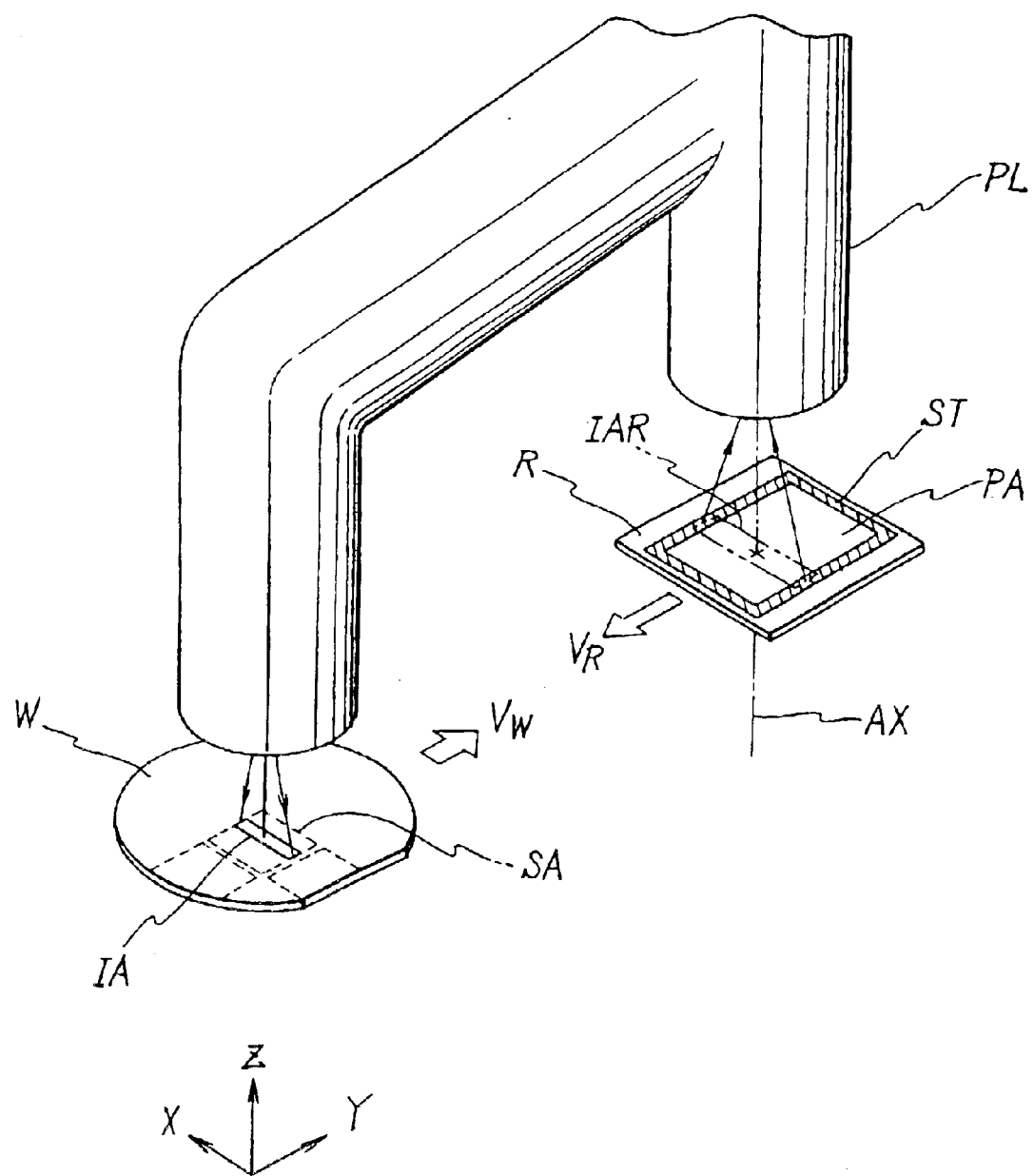
FIG. 6 explains the principle of the scanning exposure performed by the apparatus shown in FIG. 1.

FIG. 6 illustrates the principle of the scanning exposure. That is, as shown in FIG. 6, in the exposure apparatus 10 according to the embodiment of the present invention, the reticle R is illuminated with the oblong (slit-shaped) illumination area IAR which has its longitudinal direction in a direction perpendicular to the scanning direction (Y direction) of the reticle R (R1 or R2). The reticle R is scanned (subjected to scanning) at the velocity $V_R$ in the –Y direction during the exposure. The illumination area IAR (the center is approximately coincident with the optical axis AX) is projected onto the wafer W (W1 or W2) via the projection optical system PL (PL1 or PL2). Thus, the slit-shaped exposure area (projection area) IA is formed. The wafer W and the reticle R are in the relationship of inverted image with each other. Therefore, the wafer W is scanned at the velocity $V_W$ in synchronization with the reticle R on the straight line identical with the reticle R in the direction (+Y direction) opposite to the direction of the velocity $V_R$. The entire surface of the shot area (comparted area) SA on the wafer W can be subjected to the exposure. The ratio $V_W/V_R$ of the scanning velocity correctly corresponds to the reduction magnification of the projection optical system PL. The pattern in the pattern area PA of the reticle R is correctly reduced and transferred onto the shot area SA on the wafer W. If the size of the shot area SA in the scanning direction is changed, for example, due to any expansion or contraction of the wafer W, the velocity ratio can be actively changed from the reduction magnification to correct the magnification error between the shot area SA and the transferred image as well. The width of the illumination area IAR in the longitudinal direction is set such that it is wider than the pattern area PA on the reticle R, and it is narrower than the maximum width including the shielding area ST. Thus, the entire surface of the pattern area PA is illuminated by means of the scanning (scan).

As also clarified from FIG. 2, in the embodiment of the present invention, the positions of the respective stages are controlled by the main control unit 40 during the scanning exposure so that the first and second reticle stages RS1, RS2 are moved on the identical line in the mutually opposite directions concerning the Y direction, and the wafer stages WS1 (or WS3), WS2 (or WS4) are moved on the identical line in the mutually opposite directions concerning the Y direction in synchronization with the reticle stages RS1, RS2 respectively.

The operation as previously described will be continuously explained again. The exposure amount control unit 42 controls the driving of the vibration mirrors in the unillustrated illuminance-uniformalizing optical systems for constructing the illumination optical systems IOP1, IOP2 simultaneously with the start of the pulse light emission. The control is continuously performed until the pattern area on the reticle R completely passes over the illumination area IAR (see FIG. 6), i.e., until the image of the entire surface of the pattern is formed on the shot area on the wafer. Thus, the nonuniformity of the interference fringe is reduced, which would be otherwise caused, for example, by the fly's eye lens in the illuminance-uniformalizing optical system.

As for the pulse light emission effected by the laser control unit 46 described above, it is necessary that the light is emitted n times (n is a positive integer) during a period in which an arbitrary point on the wafer W1, W2 passes over the illumination field width (w). Therefore, assuming that the oscillation frequency is f, and the wafer scanning velocity is V, it is necessary to satisfy the following expression (2).

$$f/n=V/w \qquad (2)$$

Assuming that the radiation energy of one pulse radiated onto the wafer is P, and the resist sensitivity is E, it is necessary to satisfy the following expression (3).

$$nP=E \qquad (3)$$

As described above, the exposure amount control unit 42 performs calculation for all of the variable amounts such as the radiation energy P and the oscillation frequency f, and it gives the command to the laser control unit 46 to adjust the application voltage (or charging voltage) to the laser light sources 12A, 12B and the oscillation interval of the trigger pulse so that the radiation energy P and the oscillation frequency f are varied, and the shutter-driving unit 44 and the mirror-driving unit are controlled. When the sensitivity of the photoresist on the wafer W is greatly changed, the turret plate, which holds the plurality of ND filters, is rotated to exchange the ND filter in the illumination optical path. That is, the intensity of the pulse light beam on the reticle (wafer) is adjusted by changing the transmittance. Further, when the sensitivity of the photoresist on the wafer W is greatly changed, the exposure amount control unit 42 not only controls the application voltage to be applied to the light source, but also rotates the turret plate which holds the plurality of ND filters provided for the illumination optical system to exchange the ND filter to be arranged in the illumination optical path. That is, the intensity of the illumination light beam (pulse light beam) on the reticle (or the wafer) is adjusted by changing the transmittance.

For example, when the correction is made for the movement start position (synchronization position) of the reticle stage and the wafer stage which are subjected to the synchronized scanning during the scanning exposure, the main control unit 40 corrects the positions of the stages depending on the correction amount by the aid of the two-dimensional linear actuator 22 for driving the respective stages.

Next, explanation will be made on the basis of FIG. 2 and FIGS. 7 to 10 for the concurrent process for the four wafer stages WS1 to WS4, which is the feature of the embodiment of the present invention. However, in this case, the wafer stages WS1, WS2 and the wafer stages WS3, WS4 perform the same operation simultaneously in a concurrent manner. Therefore, in the following description, explanation will be made for only the operation of the wafer stages WS1, WS3 which are operated on the left half side of the base board 18 shown in FIG. 2, provided that no special explanation is required.

At first, explanation will be made for a case in which the ordinary exposure is performed on the wafers on the respective wafer stages. In the following description, it is assumed that the wafer exchange time is Tc, the alignment time (including the search alignment and the fine alignment) is Ta, and the exposure time is Te. Explanation will be made assuming that the 9-inch reticle is used for the reticle R1, and the 14-inch wafer is used for the wafers W1, W3.

In this case, Te>(Tc+Ta) is given for the relationship between the exposure time Te for one sheet of wafer and the total time (Tc+Ta) of the wafer exchange time Tc and the alignment time Ta. Therefore, during the period in which the exposure is performed for the wafer on one wafer stage, for example, the wafer stage WS1, the waiting time of course occurs for the other wafer stage, for example, the wafer stage WS3. Therefore, the waiting time is represented by Tw.

Figure 10:
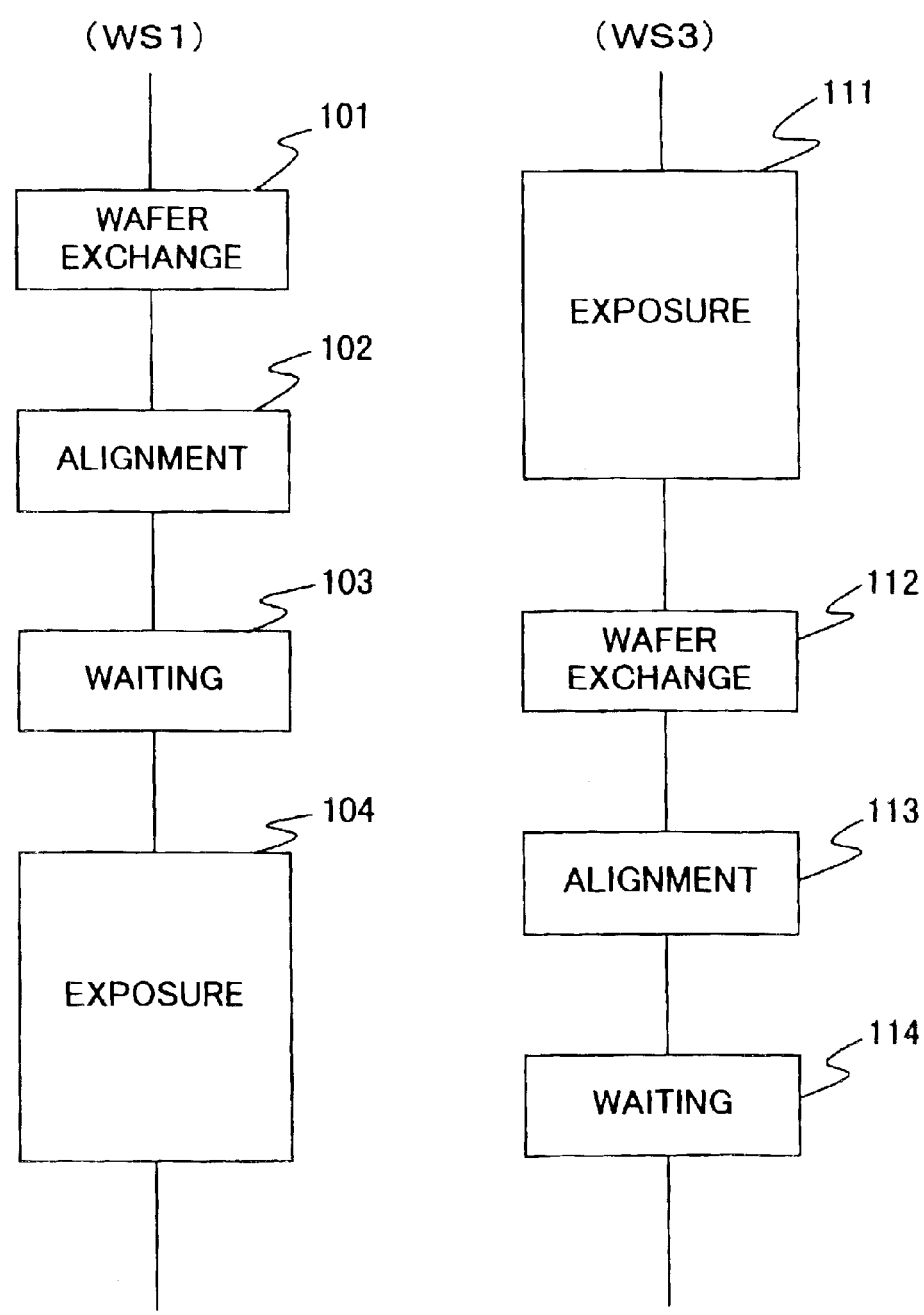
FIG. 10 shows flows of the concurrent process for the wafer stages WS1 and WS3 when the ordinary exposure is performed.

FIG. 10 shows the flow of the process for the wafer stages WS1 and WS3 in this case.

Figure 7:
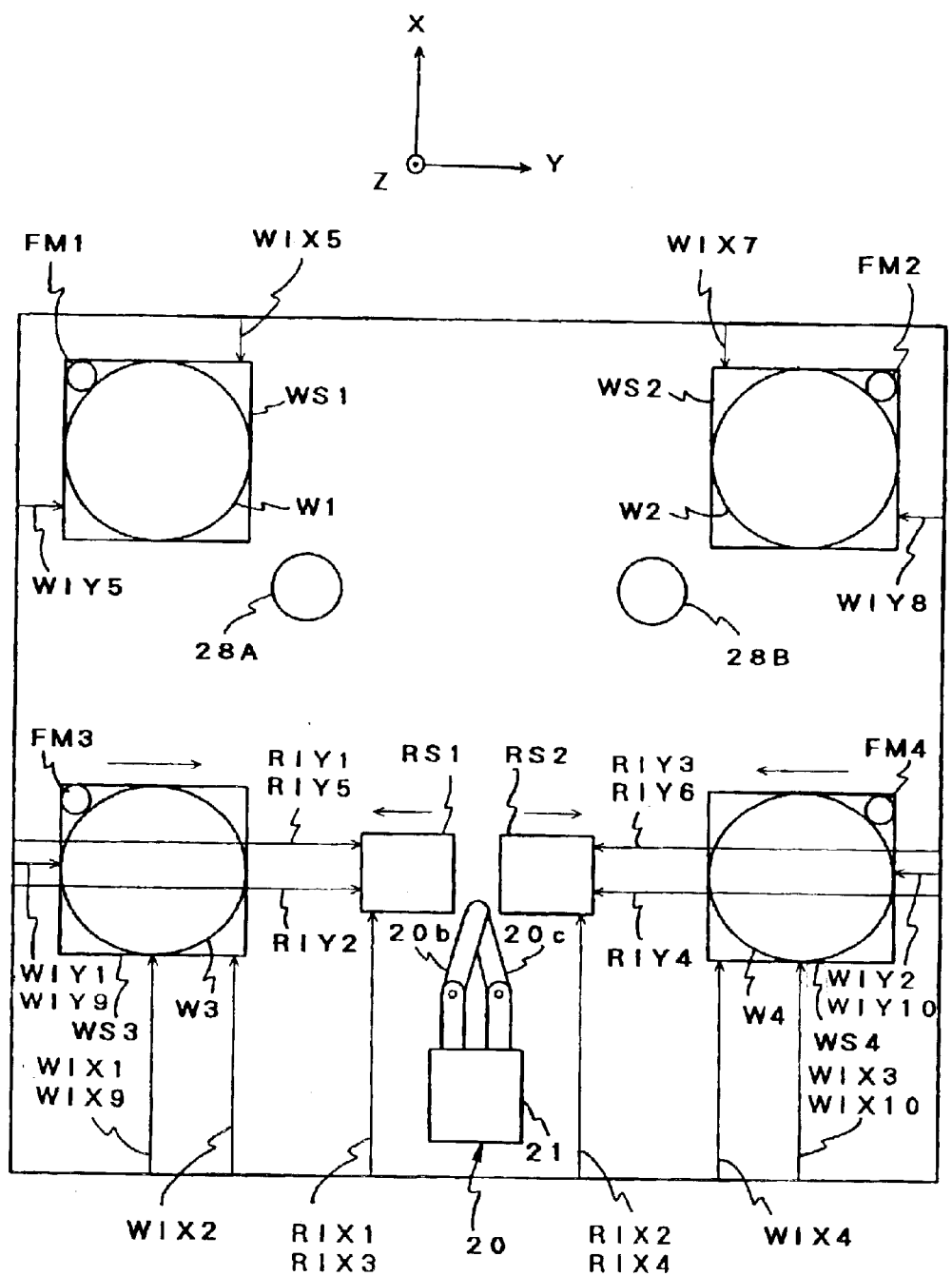
FIG. 7 explains the concurrent process performed by the four wafer stages WS1 to WS4, illustrating a state in which the scanning exposure and the wafer exchange are simultaneously performed.

In the step 101 shown in FIG. 10, the wafer exchange is performed on the wafer stage WS1. That is, the exposed wafer W1, which is disposed on the wafer stage WS1 at the loading position shown in FIG. 7, is exchanged with an unexposed new wafer (this wafer is also referred to as "wafer W1" for the purpose of convenience) by the aid of the unillustrated wafer exchange unit. The position of the wafer stage WS1 at the loading position is managed by the main control unit 40 on the basis of the measured values obtained by the interferometers WIY5 and WIX5.

Subsequently, in the step 102, the alignment operation is performed on the wafer stage WS1. Prior thereto, the wafer stage WS1 is moved from the loading position shown in FIG. 7 to the position shown in FIG. 8 in the vicinity of the alignment position at which the fiducial mark plate FM1 is located just under the alignment system 28A. During this movement, the position of the wafer stage WS1 is initially managed on the basis of the measured values of the interferometers WIY5 and WIX5. However, at a certain intermediate position, the measuring beams from the interferometers do not hit the wafer stage WS1. Therefore, the main control unit 40 is operated so that the respective measured values of the interferometer WIY5 and the interferometer WIY4 are allowed to correspond to one another and the respective measured values of the interferometer WIX5 and the interferometer WIX6 are allowed to correspond to one another, in a state in which the respective measuring beams of the interferometers WIY5, WIX5 and the interferometers WIY4, WIX6 are simultaneously radiated onto the reflecting surface of the wafer stage WS1. For example, the respective measured values of the interferometers WIY4, WIX6 are preset so that the measured value of the interferometer WIY4 is equal to the measured value of the interferometer WIY5 and the measured value of the interferometer WIX6 is equal to the measured value of the interferometer WIX5, in a state in which the fiducial mark plate FM1 is detected by the alignment system 28 to position the wafer stage WS1 at the position at which the positional discrepancy amount has a predetermined value (for example, zero). In place of the preset of the respective measured values of the interferometers WIY4, WIX6, it is enough that the measured values thereof are merely reset. It is preferable that when the respective measured values of the interferometers WIY5, WIY4 are allowed to correspond to one another, then the measuring beam of the interferometer WIY3 is adjusted so that it is also radiated on the reflecting surface of the wafer stage WS1, and the measured value of the interferometer WIY3 is also preset together with the measured value of the interferometer WIY4. Accordingly, for example, the position of the wafer stage WS1 is managed on the (X6, Y4) coordinate system defined by the interferometers WIY4 and WIX6 to use the origin of the detection center of the alignment system 28A.

In the alignment operation in the step 102, at first, the main control unit 40 moves the wafer stage WS1 to the origin position on the coordinate system (X6, Y4) to measure the relative positional relationship between the alignment system 28A and the first fiducial mark on the fiducial mark plate FM1 by using the alignment system 28A (index mark at the inside thereof). Accordingly, for example, the image of the first fiducial mark is picked up by the sensor of the FIA system for constructing the alignment system 28A. The position of the first fiducial mark based on the index center is measured on the coordinate system (X6, Y4) by the aid of the alignment control unit 30. The measurement result is supplied to the main control unit 40.

Subsequently, the search alignment is performed for the wafer W1 on the wafer stage WS1. The search alignment is the prealignment which is performed again on the wafer stage WS1, because the positional error is large if only the prealignment is performed during the transport of the wafer W1. Specifically, the positions of the three search alignment marks (not shown), which are formed on the wafer W1 placed on the stage WS1, are measured, for example, by using the LSA system of the alignment system 28A. The position adjustment is performed for the X, Y, and θ directions of the wafer W1 on the basis of the obtained measurement result. The operation of the respective components is controlled by the main control unit 40 during the search alignment.

After completing the search alignment, the fine alignment is performed to determine the array of the respective shot areas on the wafer W1 by using the EGA system in this embodiment. Specifically, at least three shot areas SA, which are selected from the plurality of shot areas SA on the wafer W1, are used as sample shots, and the alignment mark positions thereof are measured, for example, by using the FIA system of the alignment system 28A, while successively moving the wafer stage WS1, on the basis of the designed shot array data (alignment mark position data), while managing the position of the wafer stage WS1 on the coordinate system (X6, Y4). The all shot array data is calculated by the statistical calculation based on the least square method on the basis of the obtained measurement result and the designed coordinate data of the shot array. Accordingly, the coordinate positions of the respective shot areas SA are calculated on the coordinate system (X6, Y4) described above. The operation of the respective components is controlled by the main control unit 40 during EGA. The calculation is performed by the main control unit 40. The EGA measurement is disclosed, for example, Japanese Patent Application Laid-Open No. 61-44429 and U.S. Pat. No. 4,780,617 corresponding thereto. The disclosure of these patent documents is incorporated herein by reference.

The main control unit 40 calculates the relative positional relationship of the respective shots with respect to the first fiducial mark by subtracting the coordinate position of the first fiducial mark from the coordinate positions of the respective shots.

Figure 8:
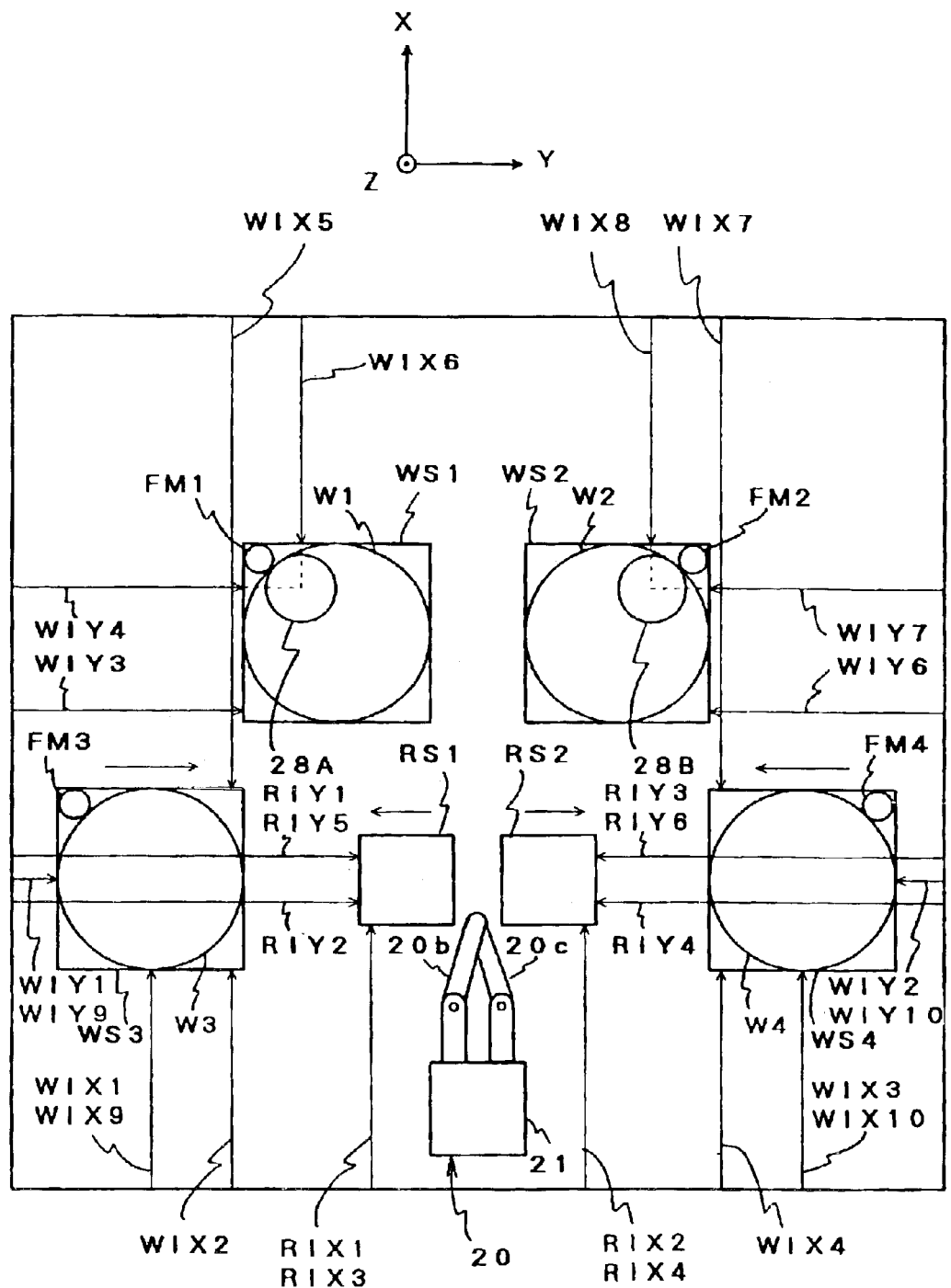
FIG. 8 explains the concurrent process performed by the four wafer stages WS1 to WS4, illustrating a state in which the scanning exposure and the alignment are simultaneously performed.

During the period in which the wafer exchange and the alignment operation are performed on the side of the wafer stage WS1, as shown in the step 111 in FIG. 10, the exposure is continuously performed in accordance with the step-and-scan system on the side of the wafer stage WS3 (see FIGS. 7 and 8).

Specifically, the relative positional relationship is calculated beforehand for the respective shots with respect to the first fiducial mark on the fiducial mark plate FM3 in the same manner as on the side of the wafer W1 described above. The scanning exposure is performed on the basis of the obtained result and the result of the detection of the relative positions of the pair of second fiducial marks on the fiducial mark plate FM3 and the projected image on the wafer surface of the mark on the reticle corresponding thereto by the aid of the reticle alignment microscopes 36A, 36B (as described in detail later on) by synchronously scanning the reticle stage RS1 and the wafer stage WS3 in the scanning direction (Y direction) every time when each of the shot areas is subjected to the exposure (transfer of the pattern of the reticle R1), while successively positioning the shot area on the wafer W3 at the position under the optical axis of the projection optical system PL1. In this procedure, when the transfer of the pattern of the reticle R1 to one shot area on the wafer W3 is completed, the wafer stage WS3 is moved (subjected to the stepping) at least in the X direction up to the scanning start position for the next shot for the purpose of the exposure of the next shot area. During the exposure, the main control unit 40 controls the both stages RS1, WS1, while managing the position and the velocity of the reticle stage RS1 on the basis of the measured values of the interferometers RIY1, RIY2, RIX1, and managing the position and the velocity of the wafer stage WS1 on the basis of the measured values of the interferometers WIY1, WIX1, WIX2.

Further, the main control unit 40 rotates at least one of the reticle stage RS1 and the wafer stage WS3 in the X-Y plane by the aid of the linear actuator 22 so that the relative rotational error of the reticle R1 and the wafer W1 is offset, on the basis of the amount of rotation (yawing amount) of the reticle stage RS1 obtained by the interferometers RIY1, RIY2 and the amount of rotation (yawing amount) of the wafer stage WS3 obtained by the interferometers WIX1, WIX2. In this embodiment, the following procedure is desirably adopted. That is, when the reticle stage RS1 is rotated, the center of rotation is the center of the illumination area IAR which is coincident with the optical axis of the projection optical system PL1. When the wafer stage WS3 is rotated, the center of rotation is the center of the exposure area IA which is coincident with the optical axis of the projection optical system PL1.

During the scanning exposure, the main control unit 40 controls the position in the Z direction and the angle of inclination of the wafer stage WS3 by the aid of the linear actuator 22 on the basis of the amounts of rotation about the X axis and the Y axis of the stage WS3 obtained from the detection result of the focus sensor 32A, the interferometers RIY1, RIY5, and the interferometers RIX1, RIX3 respectively, so that the surface of the wafer W1 is set to be within the depth of focus of the projection optical system PL1 in the exposure area IA. In this process, it is also preferable that the amounts of rotation about the X axis and the Y axis of the reticle stage RS1 obtained from the interferometers RIT1, RIY5 and the interferometers RIX1, RIX3 respectively are further used for the control of the position of the wafer stage WS3, i.e., for the focus/leveling control of the wafer W1. Further, it is also preferable that at least one optical element of the projection optical system PL1 is moved to compensate the change of the image formation characteristic (for example, aberration such as distortion) of the projection optical system PL1 which may be caused by the rotation, on the basis of the amounts of rotation of the reticle stage RS1 about the X axis and the Y axis.

Further, for example, it is also preferable that a focus sensor, which is constructed in the same manner as the focus sensor 32A, is provided on the side of the reticle stage RS1, and the focus sensor is used to control the movement of the reticle stage RS1 by the aid of the linear actuator 22 so that the change of the position and the inclination are offset on the basis of the position in the Z direction and the angle of inclination of the reticle R1 detected during the scanning exposure or before the scanning exposure beforehand. Alternatively, it is also preferable that the detection result of the focus sensor on the side of the reticle stage RS1 is used together with the detection result of the focus sensor 32A to control the movement of the wafer stage WS3 by the aid of the linear actuator 22 so that the focus/leveling control of the wafer W1 is performed.

In the embodiment of the present invention, the exposure time Te is longer than the total time of the wafer exchange time and the alignment time. Therefore, those on the side of the wafer stage WS1 wait until the completion of the exposure operation performed on the side of the wafer stage WS3 (see the step 103 in FIG. 10).

Figure 9:
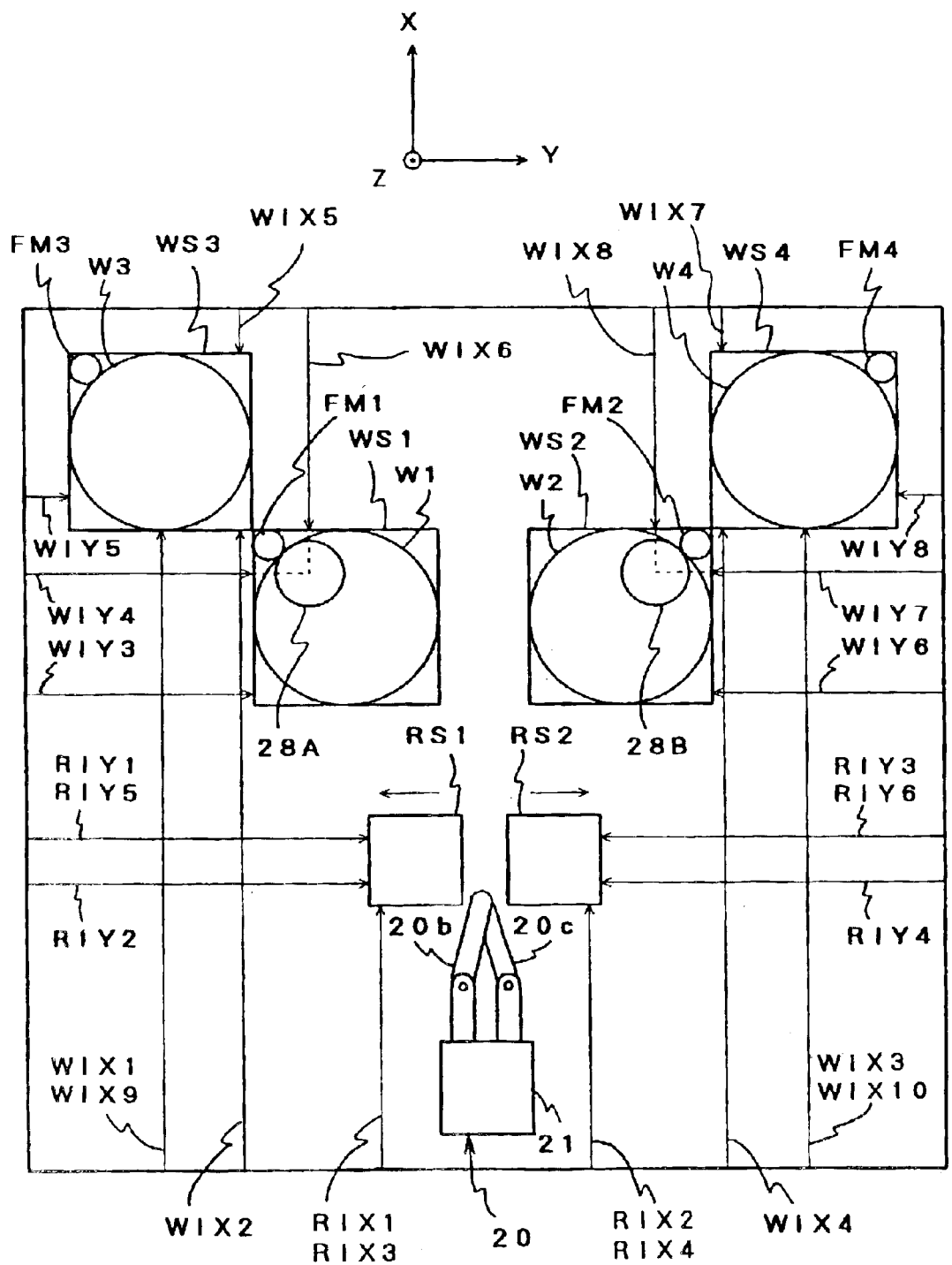
FIG. 9 explains the concurrent process performed by the four wafer stages WS1 to WS4, illustrating a state in which the wafer exchange and the alignment are simultaneously performed.

When the exposure operation on the side of the wafer stage WS3 is completed, the wafer stage WS3 is moved to the loading position as shown in FIG. 9. The movement is performed by the main control unit 40 in a state in which the Y coordinate is substantially fixed on the basis of the measured values of the interferometers WIX1, WIX2.

When the wafer stage WS3 is moved to the loading position, the wafer stage WS1, for which the alignment has been already completed, is moved to the exposure position shown in FIG. 2. During the movement, the position of the wafer stage WS1 is initially managed on the basis of the measured values of the interferometers WIY4 (and WIY3), WIX6. However, during the movement, the measuring beams from the interferometers WIY4, WIX6 do not hit the wafer stage WS1. However, before the situation described above occurs, the measuring beams from the interferometers WIX1, WIX2 hit the wafer stage WS1 in a state in which the measuring beam from the interferometer WIY3 hits the wafer stage WS1. Therefore, the main control unit 40 resets the interferometers WIX1, WIX2 at that point of time. After that, the movement is effected toward the exposure position while managing the position of the wafer stage WS1 in the XY plane on the basis of the measured values of the three interferometers, i.e., the interferometer WIY3 and the interferometers WIX1, WIX2. During the movement, before the measuring beam from the interferometer WIY3 does not hit the wafer stage WS1, the measuring beams from the interferometers WIY1, WIY9 hit the wafer stage WS1 respectively. Therefore, the main control unit 40 resets the interferometers WIY1, WIY9 at the point of time at which the measuring beam hits the wafer stage WS1. Accordingly, the position of the wafer stage WS1 can be managed on the coordinate system (Xe, Ye) defined by the interferometers WIY1 (WIY9), WIX1, WIX2. In this embodiment, the interferometers WIX1, WIX2 and the interferometers WIY1, WIY9 are reset in the chronological order. However, it is also preferable that the interferometers WIX1, WIX2 and the interferometers WIY1, WIY9 are reset substantially simultaneously in a state in which the respective measuring beams of the six interferometers WIX1, WIX2, WIX6, WIY1, WIY3, WIY9 are radiated onto the wafer stage WS1. That is, in the state in which the respective measuring beams of the six interferometers WIX1, WIX2, WIX6, WIY1, WIY3, WIY9 are radiated onto the wafer stage WS1, for example, the reticle alignment microscopes 36A, 36B are used to detect the pair of second fiducial marks on the fiducial mark plate FM1 and the pair of marks on the reticle R1 corresponding thereto. The measured values of the interferometers WIX1, WIX2 and the interferometers WIY1, WIY9 are simultaneously reset in a state in which the wafer stage WS1 is positioned at a position at which the positional discrepancy amount between the marks on the reticle and the second fiducial marks detected by the reticle alignment microscopes 36A, 36B respectively has a predetermined value (for example, zero). In this case, the position information of the reticle stage RS1, which is obtained upon the reset of the interferometers WIX1, WIX2 and the interferometers WIY1, WIY9, is detected by the interferometers RIX1, RIY1, RIY2. The position information is stored in the internal memory of the main control unit 40. Accordingly, the rectangular coordinate system (Xe, Ye) on the wafer side, which is defined by the interferometers WIX1, WIX2, WIY1, is allowed to correspond to the rectangular coordinate system on the reticle side which is defined by the interferometers RIX1, RIY1, RIY2. It is unnecessary to perform the reticle alignment in this embodiment as described later on. During the scanning exposure, the main control unit 40 controls the movement of the reticle stage RS1 on the basis of the stored position information and the respective measured values of the interferometers RIX1, RIX3, RIY1, RIY2.

In place of the reset of the respective measured values of the interferometers WIX1, WIX2 and the interferometers WIY1, WIY9, it is also preferable that the respective measured values of the interferometers WIX1, WIX2 and the interferometers WIY1, WIY9 are preset so that the respective measured values of the interferometers WIX1, WIX2 are equal to the measured value of the interferometer WIX6, and the respective measured values of the interferometers WIY1, WIY9 are equal to the measured value of the interferometer WIY3. In this case, the coordinate positions on the coordinate system (X6, Y4) of the respective shot areas on the wafer W1 determined by the EGA system described above can be used as they are as the coordinate positions on the coordinate system (Xe, Ye) defined by the interferometers WIX1, WIX2, WIY1. Therefore, it is unnecessary to determined the relative positional relationship of the respective shot areas on the, wafer with respect to the first fiducial mark by subtracting the coordinate position of the first fiducial mark on the fiducial mark plate FM1 from the coordinate positions of the respective shot areas on the wafer determined by the EGA system as described above.

When the movement of the wafer stage WS1 to the exposure position is completed as described above, the exposure is performed in the same manner as described above for the wafer W1 on the wafer stage WS1 as shown in by the step 104 in FIG. 10. Prior to the exposure, the reticle alignment microscopes 36A, 36B are used to perform the relative position detection (reticle alignment) as follows for the pair of second fiducial marks on the fiducial mark plate FM1 and the projected image on the wafer surface of the mark on the reticle corresponding thereto.

That is, the main control unit 40 moves the wafer stage WS1 to the origin position on the coordinate system (Xe, Ye). The reticle alignment microscopes 36A, 36B are used to perform the relative position detection for the pair of second fiducial marks on the fiducial mark plate FM1 and the projected image on the wafer surface of the mark on the reticle corresponding thereto by using the exposure light beam.

Accordingly, the coordinate positions of the pair of second fiducial marks on the fiducial mark plate FM1 and the coordinate position of the projected image on the wafer surface of the mark RMK on the reticle R on the coordinate system (Xe, Ye) are detected. The relative positional relationship between the exposure position (projection center of the projection optical system PL1) and the coordinate positions of the pair of second fiducial marks on the fiducial mark plate FM1 is determined from the difference between the both.

The main control unit 40 finally calculates the relative positional relationship between the exposure position and the respective shots, from the relative positional relationship of the respective shots with respect to the first fiducial mark on the fiducial mark plate FM1 previously determined, and the relative positional relationship between the exposure position and the coordinate positions of the pair of second fiducial marks on the fiducial mark plate FM1. The exposure is performed for the respective shots on the wafer W1 depending on the obtained result.

The reason why the highly accurate alignment can be performed even when the reset operation of the interferometer is performed as described above is as follows. That is, the spacing distance between the first fiducial mark and the imaginary position calculated by measuring the wafer mark is calculated by using the identical sensor, by measuring the first fiducial mark on the fiducial mark plate FM1 with the alignment system 28A, and then measuring the alignment marks of the respective shot areas on the wafer W1. At this point of time, the relative positional relationship (relative distance) between the first fiducial mark and the position subjected to the exposure is determined. Therefore, if the exposure position is allowed to correspond to the position of the second fiducial mark (positional relationship with respect to the first fiducial mark is known) by the aid of the reticle alignment microscopes 36A, 36B before the exposure, it is possible to perform the highly accurate exposure operation by adding the relative distance to the concerning value, even when the beam of the interferometer is intercepted during the movement of the wafer stage and the reset is performed again.

The first fiducial mark and the pair of second fiducial marks are always disposed on the identical fiducial mark plate. Therefore, only the offset management is required, and there is no factor of variation, provided that the drawing error is determined beforehand. There is a possibility that the pair of second fiducial marks also involve the offset due to the reticle drawing error. However, for example, as disclosed in Japanese Patent Application Laid-Open No. 7-176468 and U.S. Pat. No. 5,646,413 corresponding thereto, such a possibility can be similarly dealt with by means of only the offset management, provided that the drawing error is mitigated by using a plurality of marks during the reticle alignment, or the drawing error of the reticle mark is measured beforehand. The Japanese patent document and the United States patent document are incorporated herein by reference.

The present applicant has disclosed, in International Patent Publication WO98/24115, an exposure method and an exposure apparatus in which two wafer stages are used so that the exposure operation is performed on one wafer stage, while the wafer exchange and the alignment are performed on the other wafer stage. This International Patent Publication discloses a method for resetting the interferometer and a method for chasing the position of the wafer stage by using the fiducial mark formed on the stage, when the wafer stage is moved over a range in which the stage cannot be followed by one measuring beam of the interferometer upon the alignment for the two wafer stages. The methods are also applicable to the method of the present invention. International Patent Publication WO98/24115 is incorporated herein by reference.

The reticle alignment is performed, and the exposure is performed on the wafer stage WS1 as described above, during which the operations are performed on the side of the wafer stage WS3 concurrently therewith, including the wafer exchange, the alignment, the waiting (steps 112 to 114), in the same manner as on the side of the wafer stage WS1 explained above.

When the exposure in the step 104 is completed, the concurrent process is repeated thereafter in the same manner as described above.

In the exposure apparatus 10 of the embodiment of the present invention, simultaneously with the concurrent operations of the wafer stages WS1, WS3 as described above, the same concurrent operations are also performed on the side of the remaining wafer stages WS2, WS4 so that the operations of the wafer stages WS1, WS2 and the wafer stages WS3, WS4 are completely left-right symmetric.

As a result of test calculation in accordance with simple simulation performed by the present inventors, the following conclusion has been obtained for the arrangement of double reticle stage+double wafer stage as the basic arrangement adopted by the exposure apparatus 10. That is, when the required exposure time Te is twice the total sum (Tc+Ta) of the wafer exchange time and the alignment time, the throughput is improved about three times in accordance with the ordinary exposure described above as compared with the conventional exposure apparatus. When the exposure time Te is equivalent to the time (Tc+Ta), the throughput is improved about four times.

Next, explanation will be made for a case in which the double exposure is performed by using the first reticle R1 and the second reticle R2 described above. In this case, it is assumed that a first divided pattern (referred to as "A pattern") of a pattern to be transferred is formed on the first reticle R1, and a second divided pattern (referred to as "B pattern") of the pattern to be transferred is formed on the second reticle R2.

Figure 11:
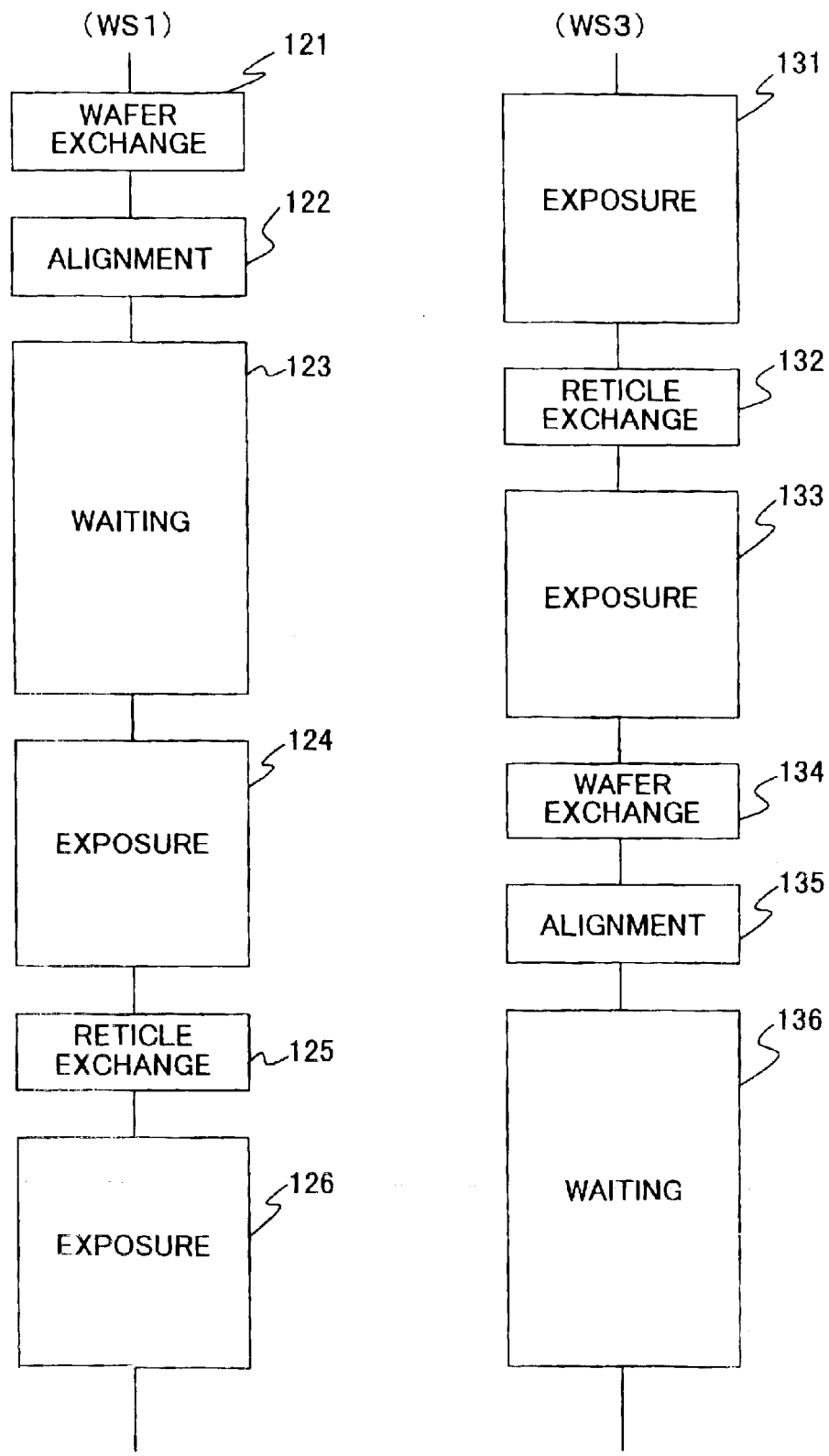
FIG. 11 shows flows of the concurrent process for the wafer stages WS1 and WS3 when the double exposure is performed.

FIG. 11 shows the flow of the process for the wafer stages WS1, WS3 in this case.

In the steps 121 to 122 shown in FIG. 11, the wafer exchange and the alignment operation are performed on the wafer stage WS1 in the same manner as in the ordinary exposure described above. During this process, the exposure based on the step-and-scan system is performed on the side of the wafer stage WS3 in the same manner as described above. The pattern on the first reticle R1 is successively transferred to the respective shot areas on the wafer W3 (step 131).

During the exposure in the step 131, the wafer stage WS1 enters the waiting state. However, in this case, the wafer exchange is not performed immediately on the side of the wafer stage WS3 even when the exposure in the step 131 is completed. Therefore, the wafer stage WS1 continues the waiting state.

During the period in which the exposure operation is performed in the step 131, the exposure based on the step-and-scan system is performed simultaneously therewith on the side of the wafer stage WS4 in the same manner as on the wafer stage WS3. The pattern on the second reticle R2 is successively transferred to the respective shot areas on the wafer W3. The exposure operation on the side of the wafer stage WS4 is also completed substantially simultaneously with the completion of the exposure operation in the step 131.

When the exposure operation is completed, the reticle exchange mechanism 20 is operated to exchange the reticle R1 on the reticle stage RS1 with the reticle R2 on the reticle stage RS2 (step 132 in FIG. 11). The reticle exchange is performed by using the robot arms 20b, 20c by the aid of the driving unit 21. When the reticle exchange is completed, the reticle alignment is performed on the side of the wafer stage WS3 in the same manner as described above. Subsequently, the exposure is performed in accordance with the step-and-scan system. The pattern on the second reticle R2 is successively transferred to the respective shot areas on the wafer W3 (step 133). Accordingly, the second divided pattern, which is depicted on the second reticle R2, is overlay-transferred to the respective shot areas on the wafer W3 to which the first divided pattern depicted on the first reticle R1 has been transferred in the step S131 described above. The reticle alignment and the exposure based on the step-and-scan system are performed on the side of the wafer stage WS4 concurrently with the operations in the steps 132, 133. The first divided pattern on the first reticle R1 is overlay-transferred to the respective shot areas on the wafer W4 to which the second divided pattern on the second reticle R2 has been transferred at the same timing as that in the step S133 described above.

The waiting state is also continued as shown in the step 123 in FIG. 11 on the side of the wafer stage WS1 during the period in which the exposure operation in the step 133 is performed.

Figure 12A:
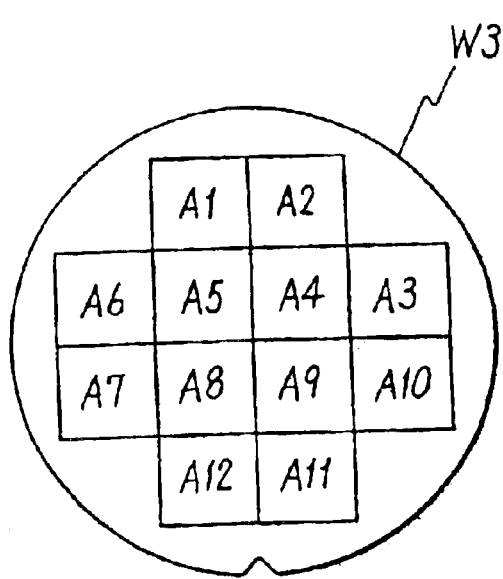
FIGS. 12A and 12B show a situation of the double exposure on the wafer.
Figure 12B:
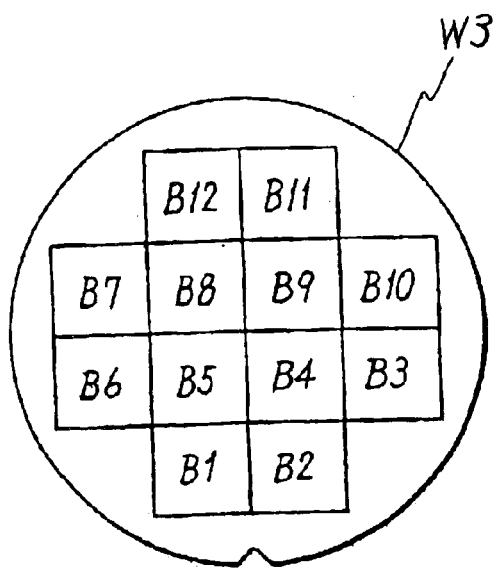

In this case, the specified exposure sequence of the double exposure on the wafer W3 is as follows. That is, as shown in FIG. 12A, the respective shot areas on the wafer W3 are successively subjected to the scanning exposure from A1 to A12 with the reticle R1 (A pattern). After that, the scanning exposure is successively performed with the reticle R2 (B pattern) in the sequence from B1 to B12 as shown in FIG. 12B.

When the double exposure operation is completed on the side of the wafer stage WS3, the wafer stage WS3 is moved to the loading position. The movement is performed in the same manner as in the ordinary exposure.

When the wafer stage WS3 is moved to the loading position, the wafer stage WS1, for which the alignment has been already completed, is moved to the exposure position in the same manner as in the ordinary exposure described above.

When the movement of the wafer stage WS1 to the exposure position is completed as described above, the transfer of the pattern of the reticle R2 to the wafer W1 (step 124), the reticle exchange (step 125), the transfer of the pattern of the reticle R1 to the wafer W1 (step 126) are performed on the wafer stage WS1 in the same manner as described above.

During the period in which the double exposure is performed on the wafer stage WS1 as described above, the operations of the wafer exchange, the alignment, and the waiting (steps 134 to 136) are performed concurrently therewith on the side of the wafer stage WS3 in the same manner as on the side of the wafer stage WS1 explained above.

When the exposure in the step 126 is completed, the concurrent process is repeated thereafter in the same manner as described above.

The operations of the respective sections during the double exposure are also controlled by the main control unit 40.

In the exposure apparatus 10 of the embodiment of the present invention, the same concurrent operations are performed on the side of the remaining wafer stages WS2, WS4 simultaneously with the concurrent operations of the wafer stages WS1, WS3 as described above in such a way that the operations of the wafer stages WS1, WS2 and the wafer stages WS3, WS4 are exactly left-right symmetric.

As a result of test calculation in accordance with simple simulation performed by the present inventors, the following conclusion has been obtained for the arrangement of double reticle stage+double wafer stage as the basic arrangement adopted by the exposure apparatus 10. That is, the throughput is improved about 2.4 times by the double exposure described above as compared with the conventional exposure apparatus, assuming that one time of exposure time Te for one sheet of wafer is twice the total sum (Tc+Ta) of the wafer exchange time and the alignment time, and the reticle exchange time is about a half of the exposure time Te.

As described above, according to the exposure apparatus 10 of the embodiment of the present invention, the throughput, which has been the most difficult task for the conventional double exposure, can be remarkably improved. Therefore, when the various double exposure methods explained above are used, it is possible to realize the exposure up to 0.1 μm L/S owing to the high resolution and the improvement effect of DOF. Thus, it is possible to realize the mass production of 256 M bits and 1 G bits DRAM with a high throughput.

The foregoing explanation has been made on the assumption that the waiting time exists, for example, in the steps 103 and 114 in FIG. 10 and in the steps 123 and 136 in FIG. 11. However, the waiting time does not contribute to the production of the device at all. Therefore, as a technique to effectively use the waiting time, it is conceived to increase the number of alignment marks to be detected for the sample shots of EGA and/or one sample shot. By doing so, the alignment accuracy is improved, and the useless waiting time is consequently decreased. For example, in the case of the ordinary exposure explained above, it is also preferable to increase the number of sample shots to such an extent that the waiting time almost disappears.

According to the exposure apparatus 10 of the embodiment of the present invention, the following numerous effects are also obtained, in addition to the effect of the improvement in throughput.

For example, when the two wafer stages are merely used to perform the concurrent process for the exposure operation together with another operation, for example, the alignment operation, the following inconvenience may occur. That is, the reaction force, which is generated during the acceleration or deceleration of the reticle stage or the wafer stage when the scanning exposure is performed on the side of one wafer stage, vibrates the body including the base board 18. The alignment accuracy is deteriorated on the side of the other wafer stage due to the vibration. However, in the embodiment of the present invention, such an inconvenience does not occur because of the following reason.

That is, the first and second reticle stages RS1, RS2 have the substantially identical mass M. The first, second, third, and fourth wafer stages WS1, WS2, WS3, WS4 have the substantially identical mass m. Further, the scanning exposure is performed at the identical scanning velocity while moving the first reticle stage RS1 and the second reticle stage RS2 in the mutually opposite directions, and hence moving the wafer stages WS1, WS2 in the mutually opposite directions concerning the identical direction. Therefore, the reaction forces, which are generated on the base board 18 during the acceleration and deceleration of the reticle stage RS1 and the reticle stage RS2, are counteracted with each other. Further, the reaction forces, which are generated on the base board 18 during the acceleration and deceleration of the wafer stages WS1, WS2, are counteracted with each other. In this case, the reticle stages RS1, RS2 and the wafer stages WS1, WS2 are moved along the identical straight line on the identical plane. Therefore, the $\theta$ rotation, the rolling, and the pitching scarcely occur on the base board 18 as well.

Therefore, although the scanning exposure operations of the wafer stages WS1, WS2 and the alignment operations of the wafer stages WS3, WS4 are performed simultaneously in the concurrent manner, for example, it is possible to reliably avoid the occurrence of such an inconvenience that the alignment accuracy is deteriorated due to the vibration of the body. Further, the alignment operations of the wafer stages WS3, WS4 are also performed while moving the stages simultaneously along with the sequence and the route in which the movement of the center of gravity of the body including the base board 18 scarcely occurs. Thus, the vibration scarcely occurs in the body only by insulating the vibration from the installation floor at the micro G level by using, for example, the passive air pad as the vibration-preventive pad 16. Therefore, it is possible to improve the accuracy for both of the alignment and the exposure without providing any special equipment such as a synchronous control circuit and an active vibration-preventive apparatus. Thus, it is possible to scan the reticle stages RS1, RS2 and the two wafer stages with substantially no synchronization error.

In the embodiment of the present invention, the first and second projection optical systems PL1, PL2 have the same projection magnification $\beta$. The mass M of each of the reticle stages RS1, RS2 is obtained by multiplying the mass m of each of the wafer stages (WS1, WS2, WS3, WS4) by the projection magnification $\beta$. Therefore, even if the scanning velocity differs between the reticle stages RS1, RS2, the main control unit 40 operates the two-dimensional linear actuator 22 to adjust the acceleration distance (deceleration distance) for at least one of the reticle stages RS1, RS2 and for at least one of the wafer stages WS1 (or WS3), WS2 (or WS4) respectively so as to control the movement so that the rate of acceleration (rate of deceleration) is substantially identical between the reticle stages RS1 and RS2, and the rate of acceleration (rate of deceleration) is substantially identical between the wafer stages WS1 (or WS3) and WS2 (or WS4). Accordingly, the reticle stage RS1 and the wafer stage WS1 (or WS3) are synchronously moved in the first direction at the velocity ratio corresponding to the projection magnification $\beta$ of the first projection optical system PL1, and the reticle stage RS1 and the wafer stage WS2 (or WS4) are synchronously moved in the first direction at the velocity ratio corresponding to the projection magnification $\beta$ of the second projection optical system PL2. Thus, the law of conservation of momentum holds between the reticle stages and the wafer stages which are mutually moved synchronously. Accordingly, it is possible to perform the scanning with substantially no synchronization error without providing any special apparatus such as a synchronous control circuit and an active vibration-preventive apparatus.

In the embodiment of the present invention, each of the projection optical systems PL1, PL2 is the cata-dioptric system including the three mirrors. Therefore, the fine pattern in the submicron order or less can be transferred highly accurately by using the illumination light beam having the wavelength of not more than 200 nm without enlarging the projection optical system so much. Further, according to the embodiment of the present invention, it is possible to obtain the high throughput as described above. Therefore, even when the off-axis alignment system is installed greatly separated from the projection optical system PL, there is little influence of the deterioration of the throughput. Accordingly, it is possible to design and install the optical system of the normal cylinder type with the high N.A. (numerical aperture) having the small aberration. However, it is a matter of course that the exposure apparatus and the exposure method according to the present invention are not limited to the embodiment described above.

For example, it is not necessarily indispensable that the mass ratio between the first reticle stage RS1 and the wafer stage WS1 (or WS3) is equal to the projection magnification of the first projection optical system PL1. Similarly, it is not necessarily indispensable that the mass ratio between the reticle stage RS2 and the wafer stage WS2 (or WS4) is equal to the projection magnification of the second projection optical system PL2 as well. In this case, the following arrangement is available. That is, the reaction force, which remains without being offset during the acceleration or deceleration even when the first reticle stage RS1 and the first wafer stage WS1 are moved in the opposite directions, is mutually counteracted by the reaction force which remains without being offset during the acceleration or deceleration even when the second reticle stage RS2 and the second wafer stage WS2 are moved in the opposite directions. Specifically, when at least one of the masses of the first and second reticle stages RS1, RS2 and the masses of the first and second wafer stages WS1, WS2 differs, it is preferable that the rate of acceleration or deceleration is allowed to differ between the first reticle stage RS1 and the first wafer stage WS1 and the second reticle stage RS2 and the second wafer stage WS2, and the reaction forces generated during the acceleration or deceleration are made substantially equal to one another so that they are counteracted with each other. In this case, for example, the acceleration start position and the run-up distance before and after the scanning exposure are adjusted depending on each of the rates of acceleration or deceleration for the first reticle stage RS1 and the first wafer stage WS1 and the second reticle stage RS2 and the second wafer stage WS2.

Further, it is not necessarily indispensable that the masses of the first and second reticle stages RS1, RS2 are not equal to one another, and the masses of the first and second wafer stages WS1, WS2 are not equal to one another. In this case, the following arrangement is available. That is, the reaction force, which remains without being offset during the acceleration or deceleration even when the first and second reticle stages RS1, RS2 are moved in the opposite directions, is mutually counteracted by the reaction force which remains without being offset during the acceleration or deceleration even when the first and second wafer stages WS1, WS2 are moved in the opposite directions. For example, it is preferable that the mass ratio between the first reticle stage RS1 and the first wafer stage WS1 is substantially equal to the projection magnification of the first projection optical system PL1, and the mass ratio between the second reticle stage RS2 and the second wafer stage WS2 is substantially equal to the projection magnification of the second projection optical system PL2.

Alternatively, when at least one of the mass ratio between the first reticle stage RS1 and the first wafer stage WS1 and the magnification of the first projection optical system PL1 and the mass ratio between the second reticle stage RS2 and the second wafer stage WS2 and the magnification of the second projection optical system PL1 differs, it is preferable that the rate of acceleration or deceleration of the first reticle stage RS1 and the first wafer stage WS1 is made different from the rate of acceleration or deceleration of the second reticle stage RS2 and the second wafer stage WS2, and the reaction forces generated during the acceleration or deceleration are made substantially equal to one another so that they are counteracted with each other. In this case, for example, the acceleration start position and the run-up distance before and after the scanning exposure are adjusted depending on each of the rates of acceleration or deceleration for the first reticle stage RS1 and the first wafer stage WS1 and the second reticle stage RS2 and the second wafer stage WS2.

The sensitivity characteristic of the photoresist differs in some cases between the first wafer W1 and the second wafer W2. Also in this case, the movement velocity during the scanning exposure is not difference but identical between the first wafer W1 and the second wafer W2. The first and second wafer stages WS1, WS2 are driven under the same condition. Accordingly, the rate of acceleration during the run-up period before the scanning exposure can be made identical, and the acceleration start time can be made identical as well for the first and second wafer stages WS1, WS2. The scanning exposure completion time is identical for the first wafer W1 and the second wafer W2. It is possible to make coincidence for the deceleration start time therebetween, and it is possible to use the identical rate of deceleration therebetween as well. Considering the throughput, it is desirable that the scanning velocity of the first and second wafers W1, W2 is set to be the maximum movement velocity of the wafer stage. However, when the identical scanning velocity is used for the first and second wafers W1, W2 which are different in sensitivity characteristic of the photoresist, the scanning exposure condition is changed as well for at least one of the first and second wafers W1, W2 on the basis of the scanning velocity and the sensitivity characteristic of the photoresist in order to give the appropriate exposure dose corresponding to the sensitivity characteristic of the photoresist to the first and second wafers W1, W2 respectively. When the exposing illumination light beam is a continuous light beam, it is sufficient to adjust at least one of the intensity of the illumination light beam on the wafer and the width of the illumination light beam in the scanning direction on the wafer. When the exposing illumination light beam is a pulse light beam, it is sufficient to adjust at least one of the intensity of the illumination light beam on the wafer, the width of the illumination light beam in the scanning direction on the wafer, and the oscillation frequency of the pulse light source.

When at least one of the masses of the first and second reticle stages RS1, RS2 and the masses of the first and second wafer stages WS1, WS2 differs, it is preferable that the rate of acceleration is made different so that the reaction force generated during the prescanning is substantially identical between the first wafer W1 and the second wafer W2 as described above. Further, for example, it is desirable that the run-up distance and the acceleration start position are adjusted for at least one of the first and second wafers so that the scanning exposure start time is identical for the first wafer W1 and the second wafer W2, and the time difference of the generation of the reaction force is made as small as possible.

When the scanning velocity differs between the first wafer W1 and the second wafer W2, the scanning exposure time per one shot, i.e., the scanning exposure completion time may differ between the first wafer W1 and the second wafer W2. Accordingly, for example, when the scanning exposure completion time of the first wafer W1 is earlier than the scanning exposure completion time of the second wafer W2, then the first wafer W1 is continuously moved at the movement velocity as used during the scanning exposure even after the completion of the scanning exposure, and the deceleration of the first wafer W1 is started substantially simultaneously with the start of the deceleration of the second wafer W2 after the completion of the scanning exposure. In this process, the rates of deceleration of the first and second wafers after the scanning exposure are determined respectively depending on the respective masses of the first and second reticle stages RS1, RS2 and the first and second wafer stages WS1, WS2. Accordingly, it is possible to offset the reaction forces generated during the deceleration period substantially completely.

Even when the sensitivity characteristic is identical between the first wafer W1 and the second wafer W2, if the width of the shot area in the scanning direction differs, then the scanning exposure time per one shot differs between the first wafer W1 and the second wafer W2. In such a case, it is desirable that the scanning exposure time is made coincident with each other by adjusting the scanning velocity of at least one of the first and second wafers W1, W2 in the same manner as described above. In this process, the scanning exposure condition is changed as well for at least one of the first and second wafers W1, W2 for which the scanning velocity is adjusted, on the basis of the adjusted scanning velocity and the sensitivity of the photoresist in order to give the appropriate exposure dose to the first and second wafers respectively.

The foregoing embodiment has been explained for the case in which both of the first and second projection optical systems PL1, PL2 project the partial inverted image of the reticle pattern onto the wafer. However, for example, it is also conceived that the first projection optical system PL1 projects a partial erecting image of the pattern of the reticle R1 onto the first wafer W1. In such a case, the first reticle R1 and the first wafer W1 are moved in the identical direction concerning the Y direction at the velocity ratio corresponding to the magnification of the first projection optical system PL1. In this case, the following arrangement is available. That is, the second projection optical system PL2 also projects a partial erecting image of the second reticle pattern onto the second wafer W2. Further, the second reticle R2 and the second wafer W2 are moved in the identical direction concerning the Y direction, and the movement direction is determined to be opposite to the movement direction of the first reticle R1 and the first wafer W1. Accordingly, the reaction force generated by the synchronous movement of the first reticle R1 and the first wafer W1 and the reaction force generated by the synchronous movement of the second reticle R2 and the second wafer W2 are offset substantially completely.

When the pattern on the first reticle R1 is successively transferred to the plurality of comparted areas (shot areas) on the first wafer W1, and the pattern on the second reticle R2 is successively transferred to the plurality of comparted areas (shot areas) on the second wafer W2, then the first and second wafer stages WS1, WS2 are moved in the direction (X direction) perpendicular to the scanning direction (Y direction) respectively every time when the scanning exposure is completed for one comparted area. In this process, it is desirable that the first and second wafer stages WS1, WS2 are subjected to the stepping in the mutually opposite directions along the X direction. Accordingly, the reaction forces generated in the X direction are offset substantially completely. However, in this case, the first and second wafer stages WS1, WS2 are not subjected to the stepping on an identical straight line. Therefore, the angular moment is generated on the base board 18 to cause the vibration. In this case, it is also preferable that a frame is provided on the floor (or the base plate) on which the vibration-preventive pads 16 are installed, separately from the vibration-preventive pads 16 for placing the base board 18 on which the first and second wafer stages WS1, WS2 are arranged, wherein for example, a voice coil motor is arranged between the base board 18 and the frame, and the force to offset the angular moment is given to the base board 18.

The foregoing embodiment has been explained for the case in which the first wafer stage WS1 and the second wafer stage WS2 always perform the same operation on the assumption that the number of shot areas is identical between the first wafer W1 and the second wafer W2. However, for example, the number of shot areas (comparted areas) to which the pattern is to be transferred differs in some cases between the first wafer W1 and the second wafer W2. For example, when the number of comparted areas on the first wafer W1 is larger than the number of comparted areas on the second wafer W2, it is desirable that the second reticle stage RS2 and the second wafer stage WS2 are moved (subjected to empty movement) concurrently with the synchronous movement of the first reticle stage RS1 and the first wafer stage WS1 until the transfer of the pattern on the first reticle R1 is completed for all of the comparted areas on the first wafer W1 even after the transfer of the pattern on the second reticle R2 is completed for all of the comparted areas on the second wafer W2.

Figure 15:
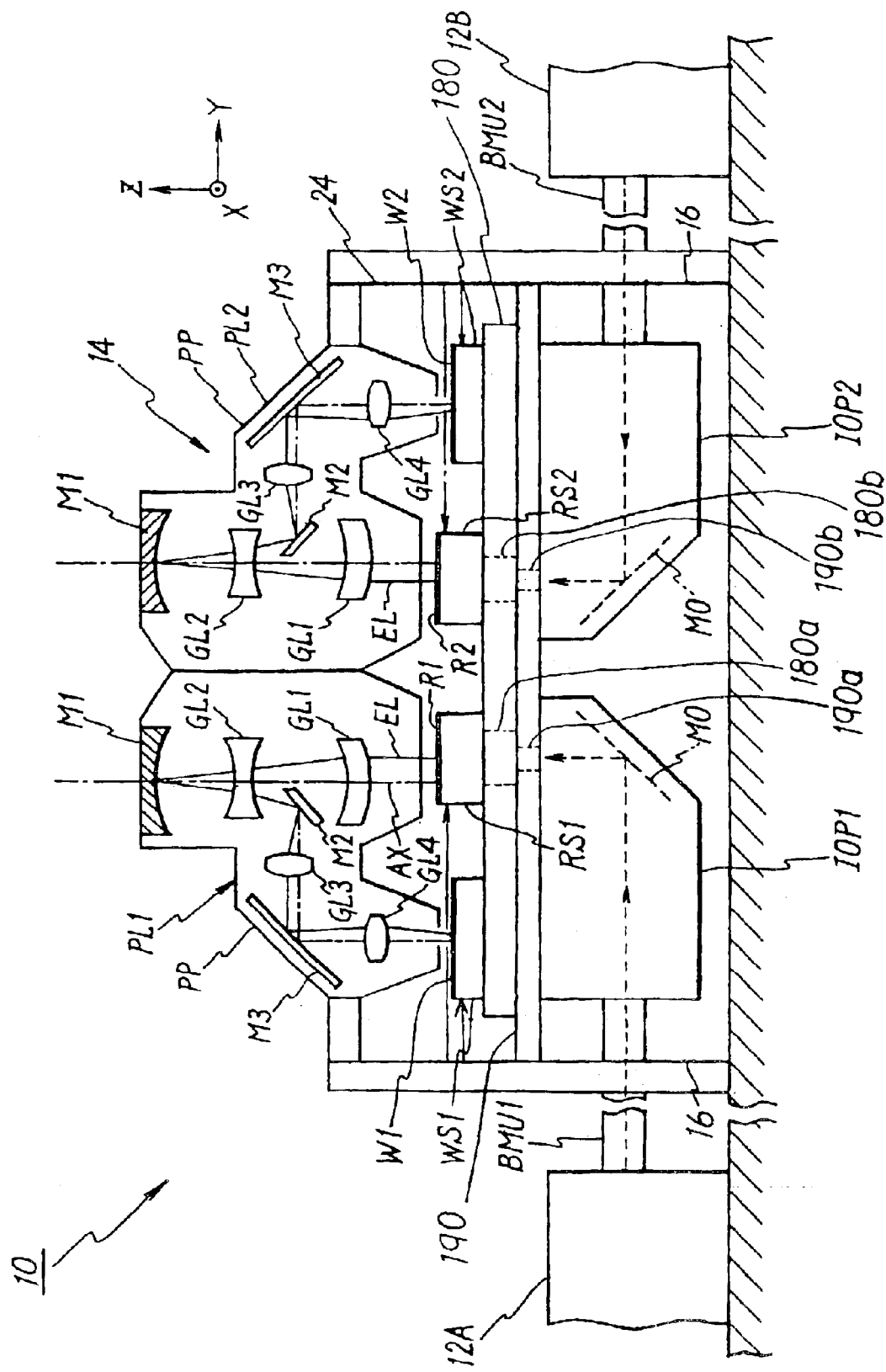
FIG. 15 shows a modified embodiment of the exposure apparatus of the present invention shown in FIG. 1, illustrating a schematic arrangement of an exposure apparatus which is provided with a surface plate supported by vibration-preventive pads, with a base board being supported in a floating manner over the surface plate.

It is also possible that the exposure apparatus of the present invention is constructed as in a modified embodiment as shown in FIG. 15. In the case of the exposure apparatus 10 shown in FIG. 1, the base board 18 is supported by the four vibration-preventive pads 16. However, the exposure apparatus 200 shown in FIG. 15 is constructed such that a surface plate 190, which is supported horizontally by the four vibration-preventive pads 16, is provided, and the base board 18 is supported over the surface plate 190 so that the base board 18 is capable of floating. That is, in the case of the exposure apparatus shown in FIG. 1, the wafer stages WS1 to WS4 and the reticle stages RS1, RS2 are supported in the floating manner over the base board (18) by the aid of the two-dimensional linear actuator (first linear actuator 22). However, in this modified embodiment, the base board 180 is also supported over the surface plate 190 by the aid of a second linear actuator (not shown). In the same manner as the first linear actuator, the second linear actuator can be constructed by a plurality of magnets embedded in the bottom surface of the base board 180, and coils embedded over the entire surface of the surface plate 190. Apertures 180a, 180b, 190a, 190b are formed through the base board 180 and the surface plate 190 at portions for allowing the exposure light beams EL to pass therethrough.

In the exposure apparatus 200 shown in FIG. 15, when any one of the wafer stages WS1 to WS4 and the reticle stages RS1, RS2 is moved, the reaction force is exerted on the base board 180 as a result of the movement of the stage. The base board 180 is moved with respect to the surface plate 190 in response to the reaction force. During this process, the base board is moved so that the momentum of the system including the base board and the stages is equal to the momentum of the stage. Even when the average position of the center of gravity of the stages is changed to cause any unbalanced load on the base board 180, it is possible to cancel the unbalanced load by means of the movement of the center of gravity of the base board 180. Therefore, it is possible to hold the center of gravity of the entire exposure apparatus 200 at a predetermined position. The exposure apparatus itself is prevented from vibration which would be otherwise caused by the movement of the stage.

Especially, in this modified embodiment, when one reticle stage is moved, or when two or more reticle stages are moved, if the reaction force of the reticle stage on the base board is not canceled, for example, if the reticle stages are not moved in the mutually opposite directions, or if the weight differs between the reticle stages, then the base board 180 is successfully moved with respect to the surface plate 190 in response to the reaction force generated on the base board 180, and thus it is possible to prevent the vibration of the exposure apparatus 200. Therefore, it is unnecessary for the exposure apparatus 200 of this type to adjust the movement route and the velocity of the stages between the stages in order to mutually cancel the reaction forces generated for the plurality of stages as described above when the plurality of reticle stages and the plurality of wafer stages are moved. It is possible to mitigate the sequence control when the exposure is exposed in the plurality of subunits of the exposure apparatus. Therefore, the exposure apparatus 200 of this modified embodiment is more effective, as the number of stages is further increased, and as the movement route of the stage is more complicated.

If the pattern, which is formed on one comparted area on the wafer, is defective, the patterns for the next layer and the followings are not transferred to the concerning comparted area in ordinary cases. However, in the case of the exposure apparatus 10 of the embodiment described above, in order to offset the reaction force, it is desirable that the reticle and the wafer are synchronously moved to transfer the reticle pattern to the comparted area, or the reticle stage and the wafer stage are subjected to the empty movement, even in the case of the comparted area on which the defective pattern is formed.

In the exposure apparatus 10 of the embodiment described above, for example, when the reticle pattern is successively transferred to one comparted area and another comparted area on the wafer, it is desirable that the wafer stage is moved without any stop between the scanning exposure for the one comparted area and the scanning exposure for the another comparted area. Further, it is desirable that the movement is performed so that the movement locus of the wafer between the scanning exposure operations is parabolic (or U-shaped). In such a case, the acceleration in the stepping direction is started for the wafer stage during the deceleration of the reticle stage, and the wafer stage is decelerated during the acceleration of the reticle stage for the exposure of the next shot. In this process, it is desirable that the stepping direction of the first stage WS1 is opposite to that of the second wafer stage WS2, and the timing of acceleration and deceleration is coincident with each other between the first wafer stage WS1 and the second wafer stage WS2.

The foregoing embodiment has been explained for the case in which the four wafer stages, which are moved on the identical plane, are provided. However, the present invention is not limited thereto. For example, it is also preferable that there is provided a third wafer stage WS3 which is movable on the same plane as that for the first and second wafer stages WS1, WS2, and only one alignment system is provided for detecting the alignment mark, because of the following reason. That is, even in such a case, the position adjustment mark, which is formed on the wafer W3 on the third wafer stage, can be detected by using the alignment system during the period in which the reticle pattern is transferred to the wafers W1, W2 on the first and second wafer stages WS1, WS2 respectively in accordance with the scanning exposure as described above. Therefore, the exposure operation for the wafers on the two wafer stages is performed simultaneously in a concurrent manner together with the mark position-detecting operation (alignment operation) for the wafer on the one wafer stage. In this arrangement, the driving unit (22, 40) is preferably operated as follows. That is, the third wafer stage WS2, for which the detection of the mark position is completed, is exchanged with the first wafer stage WS1 or the second wafer stage WS2 after the completion of the exposure operation for the wafers on the two wafer stages, and the third wafer stage WS3 is moved in synchronization with the first reticle stage RS1 or the second reticle stage RS2. Accordingly, it is possible to perform the scanning exposure for transferring the reticle pattern to the wafer W3 on the third wafer stage WS3 immediately after the completion of the exposure operation for the first and second wafers W1, W2. In this case, the alignment time for the third wafer W3 is completely overlapped with the exposure time for the first and second wafers. Therefore, it is possible to improve the throughput as compared with the conventional technique.

The foregoing embodiment is illustrative of the case in which the square wafer stage is used for the wafer stages WS1 to WS4. However, the present invention is not limited thereto. For example, it is allowable to use a triangular wafer stage. In this arrangement, the position of the wafer stage can be managed by using an interferometer having a measuring axis in a direction inclined by a predetermined angle with respect to the XY axes. Therefore, it is believed that the position of the wafer stage is easily managed during the movement from the alignment completion position to the exposure position.

Figure 16:
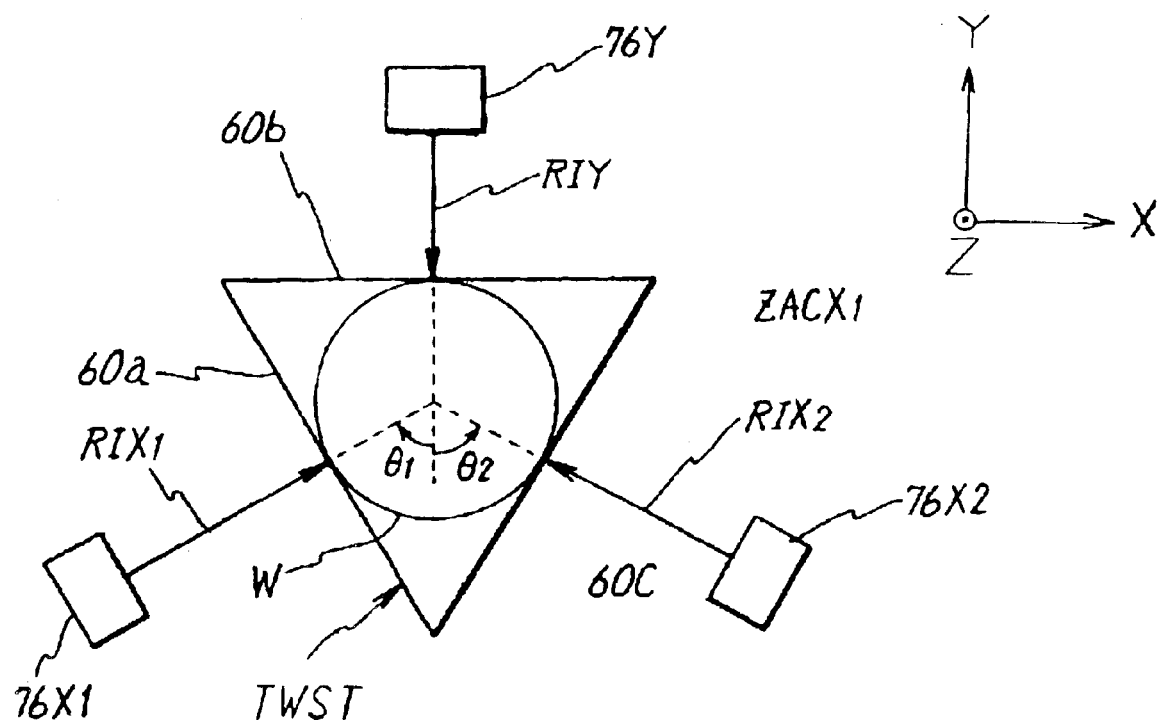
FIG. 16 shows a schematic plan view illustrating a triangular stage and a position-measuring system therefor, capable of being used for the exposure apparatus of the present invention.

An example of the triangular stage is shown in FIG. 16. FIG. 16 shows a plan view illustrating, together with a triangular wafer stage TWST, first, second, and third interferometers 76X1, 76Y, 76X2 for constructing a position-measuring system for the triangular stage, and beams RIX1, RIY, RIX2 from the three interferometers. The triangular wafer stage TWST is formed to have a regular triangular configuration as viewed in the plan view. The three side surfaces thereof are mirror-finished respectively to form first, second, and third reflecting surfaces 60a, 60b, 60c. The second interferometer 76Y measures the position of the wafer stage TWST in the Y axis direction by perpendicularly radiating, onto the second reflecting surface 60b, the interferometer beam RIY in the Y axis direction (first axis direction) in which the wafer stage TWST is moved during the scanning exposure, and receiving the reflected light beam therefrom. The first interferometer 76X1 measures the position (or velocity) in the third axis direction which is the direction of the interferometer beam RIX1 by perpendicularly radiating, onto the first reflecting surface 60a, the interferometer beam RIX1 in the direction inclined by a predetermined angle $\theta 1$ with respect to the Y axis direction, and receiving the reflected light beam therefrom. Similarly, the third interferometer 76X2 measures the position in the fourth axis direction which is the direction of the interferometer beam RIX2 by perpendicularly radiating, onto the third reflecting surface 60c, the interferometer beam RIX2 in the direction inclined by a predetermined angle $\theta 2$ with respect to the Y axis direction, and receiving the reflected light beam therefrom. The position of the stage in the X axis direction (second axis direction) perpendicular to the Y axis can be determined by calculation by using the values of the position of the stage in the third axis direction and/or the fourth axis direction and the angle $\theta 1$ and/or $\theta 2$ obtained as described above. Alternatively, the position of the stage in the X axis and Y axis directions can be determined by calculation by using only the position of the stage in the third axis direction and the angle $\theta 1$. When such a triangular stage is used, it is possible to realize a small size and a light weight of the stage as compared with the conventional stage which is provided with reflecting mirrors arranged in the X axis and Y axis directions. This arrangement is extremely effective for the exposure apparatus which supports the plurality of mask stages and the plurality of substrate stages on the common base board as in the exposure apparatus of the present invention.

For the purpose of explanation, the foregoing embodiment has been explained for the case in which the one-axis interferometers are used as almost all of the interferometers for constructing the interferometer system. However, it is of course allowable to use multi-axis interferometers capable of performing the yawing measurement or the like.

The exposing illumination light beam is not limited to the vacuum ultraviolet light beam (VUV light beam) such as the $F_2$ laser and the ArF excimer laser which has the wavelength of not more than about 200 nm. The exposing illumination light beam may be an ultraviolet light beam having a wavelength of not less than about 200 nm (for example, KrF excimer laser, i-ray, and g-ray), or it may be an EUV light beam (XUV light beam) in the soft X-ray region having a wavelength of 5 to 15 nm, for example, 13.4 nm or 11.5 nm. Further, for example, in place of the super high voltage mercury lamp, the excimer laser, or the $F_2$ laser, it is also preferable to use a high harmonic wave obtained by amplifying a single wavelength laser in the infrared region or in the visible region oscillated from a DFB semiconductor laser or a fiber laser with a fiber amplifier doped, for example, with erbium (or both of erbium and ytterbium), and converting the wavelength into the ultraviolet light with nonlinear optical crystal.

For example, when the oscillation wavelength of the single wavelength laser is within a range of 1.51 to 1.59 μm, an 8-fold high harmonic wave with an emitted wavelength within a range of 189 to 199 nm or a 10-fold high harmonic wave with an emitted wavelength within a range of 151 to 159 nm is outputted. Especially, when the oscillation wavelength is within a range of 1.544 to 1.553 μm, an 8-fold high harmonic wave within a range of 193 to 194 nm, i.e., an ultraviolet light beam having substantially the same wavelength as that of the ArF excimer laser is obtained. When the oscillation wavelength is within a range of 1.57 to 1.58 μm, a 10-fold high harmonic wave within a range of 157 to 158 nm, i.e., an ultraviolet light beam having substantially the same wavelength as that of the $F_2$ laser is obtained.

When the oscillation wavelength is within a range of 1.03 to 1.12 μm, a 7-fold high harmonic wave having an emitted wavelength within a range of 147 to 160 nm is outputted. Especially, when the oscillation wavelength is within a range of 1.099 to 1.106 μm, a 7-fold high harmonic wave having an emitted wavelength within a range of 157 to 158 nm, i.e., an ultraviolet light beam having substantially the same wavelength as that of the $F_2$ laser is obtained. A ytterbium dope fiber laser is used as the single wavelength oscillation laser.

The present invention is not limited to the exposure apparatus for being used to produce semiconductor devices, but it is also applicable, for example, to the exposure apparatus for transferring a device pattern onto a glass plate, the exposure apparatus for transferring a device pattern onto a ceramic wafer to be used to produce thin film magnetic heads, and the exposure apparatus for being used to produce image-pickup devices (for example, CCD). The present invention is not limited to the production of the microdevice such as semiconductor devices, but it is also applicable to the exposure apparatus for transferring a circuit pattern, for example, onto a glass substrate or a silicon wafer in order to produce the reticle or mask to be used, for example, for the light exposure apparatus, the EUV exposure apparatus, the X-ray exposure apparatus, and the electron beam exposure apparatus. In general, the transmitting type reticle is used for the exposure apparatus based on the use of DUV (far ultraviolet) and VUV (vacuum ultraviolet). Those used as the reticle substrate include, for example, quartz glass, quartz glass doped with fluorine, fluorite, magnesium fluoride, and quartz crystal. For example, in the case of the X-ray exposure apparatus or the electron beam exposure apparatus based on the proximity system, the transmitting type mask (stencil mask, membrane mask) is used, and the silicon wafer or the like is used as the mask substrate. The transmitting type reticle is held by the reticle stage so that its pattern plane is directed downwardly (opposed to the illumination system in FIG. 1). When the reticle is prevented from adhesion of foreign matters to the pattern plane, for example, by means of the pellicle, the reticle may be held on the reticle stage so that its pattern plane is directed upwardly (opposed to the projection optical system). When the vacuum ultraviolet light beam or the ultraviolet light beam having the wavelength of not less than about 200 nm (for example, KrF excimer laser, i-ray, and g-ray) is used as the exposing illumination light beam, for example, the following arrangement may be available. That is, the reticle is of the reflecting type, the beam splitter is arranged between the reticle and the projection optical system, and the exposing illumination light beam is radiated onto the reticle by the aid of the beam splitter, wherein the illumination optical system is arranged on the same side as that of the projection optical system with respect to the reticle.

The foregoing embodiment has been explained as exemplified by the case in which the double exposure is performed. However, the pattern on the first reticle and the pattern on the second reticle may be transferred to different shot areas on an identical wafer respectively. Alternatively, in order to obtain a device which is larger than one time of scanning exposure range, it is also preferable to perform the so-called stitching exposure in which a plurality of reticle patterns are transferred to mutually adjoining shot areas on an identical wafer. In this case, in the same manner as in the double exposure described above, the development process for the wafer is not performed after the transfer of the first reticle pattern in accordance with the first scanning exposure operation, and the second scanning exposure operation is performed continuously to the first scanning exposure operation. The transferred image of the second reticle pattern is formed on the photoresist on the wafer on which the transferred image of the first reticle pattern is formed.

In the embodiment described above, the illumination optical systems IOP1, IOP2 are fixed to the base 18 respectively. However, the illumination optical systems IOP1, IOP2 may be arranged on the floor on which the pedestal 16 for supporting the base 18 or the surface plate 190 is arranged, by the aid of a vibration-preventive mechanism. Alternatively, the illumination optical systems IOP1, IOP2 may be arranged in another room (for example, utility space under the floor) which is different from the clean room in which the main exposure apparatus body is arranged, together with the exposure light sources 12A, 12B. The projection optical systems PL1, PL2 are supported on the base 18 or the surface plate 190 by the aid of the pedestal 24. However, the projection optical systems PL1, PL2 may be held by another pedestal which is different from the pedestal 16 for supporting the base 18 or the surface plate 190.

In the exposure apparatus explained in the foregoing embodiment, when the vacuum ultraviolet light beam having a wavelength of not more than about 200 nm is used as the exposing illumination light beam, it is possible to substitute, with inert gas such as nitrogen and helium, the interiors of the laser light source, the light-feeding system including BMU, the illumination optical system, and the projection optical system respectively. When the EUV light beam (XUV light beam) having a wavelength of 5 to 15 nm is used as the exposing illumination light beam, it is preferable that the optical path ranging from SOR or the laser plasma light source to the wafer is substantially in vacuum.

When the EUV light beam (XUV light beam) having a wavelength of 5 to 15 nm is used as the exposing illumination light beam, the reflecting type reticle is adopted for the reticle as described above. Therefore, the following arrangement is available. That is, the illumination optical system is arranged on the same side as that of the projection optical system with respect to the reticle. The EUV light beam comes into the reticle with its main light beam inclined with respect to the direction perpendicular to the reticle. The projection optical system may be an optical system which is constructed by only a plurality of reflecting optical elements and in which the reticle side is non-telecentric.

Alternatively, the scanning exposure conditions may differ with each other depending on the patterns formed on the first and second reticles respectively, between the first scanning exposure based on the use of the first reticle and the scanning exposure based on the use of the second reticle. One of the scanning exposure conditions is the intensity distribution of the illumination light beam on the plane (corresponding to the pupil plane) which is in the relationship of Fourier transformation with respect to the pattern plane of the reticle in the illumination optical system. For example, when the cluster pattern (for example, the line and space pattern) is formed on the first reticle, and the contact hole pattern is formed on the second reticle, then the first illumination optical system IOP1 may adopt the modified illumination method in which the intensity distribution of the illumination light beam on the Fourier transformation plane (pupil plane) is higher at circumferential portions as compared with central portions, and the second illumination optical system IOP2 may adopt the ordinary illumination method in which the intensity distribution is approximately constant in a substantially circular (or rectangular) area about the center of the optical axis. The modified illumination method includes, for example, the zonal illumination method in which the intensity distribution is higher in the zonal area disposed substantially about the center of the optical axis of the illumination optical system as compared with the inside thereof, and the SHRINC method in which the intensity distribution is higher in four local areas respectively as compared with a cross-shaped area for defining the four local areas separated by substantially identical distances from the optical axis of the illumination optical system. Alternatively, both of the first and second illumination optical systems may adopt the ordinary illumination method, and only the size (cross-sectional area) of the illumination light beam on the pupil plane, i.e., the so-called coherent factor ($\sigma$ value), which is the ratio between the numerical aperture of the illumination light beam incoming into the reticle and the numerical aperture on the side of the reticle of the projection optical system, may be made different. Alternatively, the zonal illumination method may be used in one of the first and second illumination optical systems, and the SHRINC method may be used in the other.

Further, the scanning exposure conditions include the numerical aperture of the projection optical system. It is also preferable that the numerical aperture differs between the first and second projection optical systems PL1, PL2. In the embodiment of the present invention, the scanning exposure conditions also include the presence or absence of the pupil filter arranged for the plane (corresponding to the pupil plane) which resides in the relationship of the Fourier transformation with respect to the pattern plane of the reticle in the projection optical system, and the presence or absence of the so-called progressive focus method (for example, FLEX method) and the conditions thereof (for example, the amplitude) in which the image plane of the projection optical system and the wafer are relatively moved in the optical axis direction during the period in which one point on the shot area traverse the illumination light beam during the scanning exposure. The pupil filter includes, for example, the pupil filter of the central shield type for intercepting the light flux distributed in a circular area about the center of the optical axis of the projection optical system, and the pupil filter for reducing the interference for the light flux passing through a circular area about the center of the optical axis of the projection optical system and the light flux passing through the outside of the circular area. Further, it is also preferable that a reticle having a conventional chromium pattern is used as the first reticle, and a phase shift reticle having a phase shifter (for example, those of the half tone type, the spatial frequency modulation type, and the edge enhancement type) is used as the second reticle.

In the embodiment described above, both of the first and second illumination optical systems IOP1, IOP2 radiate the illumination light beam (ArF excimer laser or $F_2$ laser) having the identical wavelength. That is, the identical light source is used as the exposure light sources 12A, 12B. However, it is also preferable that illumination light sources having mutually different wavelengths are used for the first illumination optical system and the second illumination optical system. For example, it is also preferable that the ArF excimer laser is used for the first illumination optical system to transfer the line and space pattern of 130 nm onto the wafer, and the $F_2$ laser or the EUV (XUV) light beam is used for the second illumination optical system to transfer the line and space pattern of 100 nm onto the wafer. Further, the structure and the resolving power may be identical or different between the first and second projection optical systems PL1, PL2. The arrangement may be identical, or a part thereof may be different between the first and second illumination optical systems.

Method for Producing Device

Next, explanation will be made for an embodiment of the method for producing the device in which the exposure apparatus and the exposure method described above are used in the lithography step.

Figure 13:
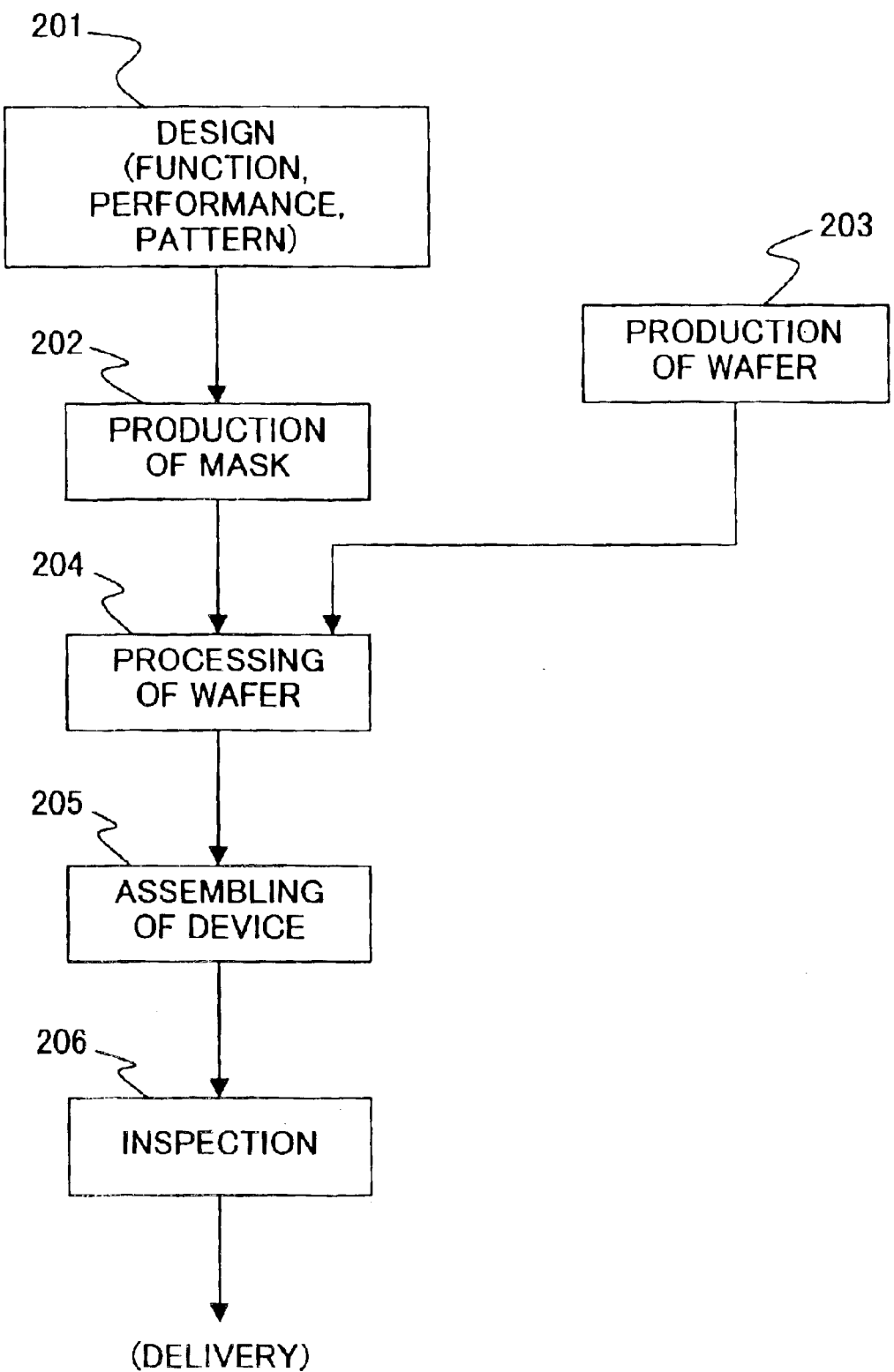
FIG. 13 shows a flow chart illustrating an embodiment of the method for producing the device according to the present invention.

FIG. 13 shows a flow chart depicting illustrative production of the device (for example, semiconductor chip such as IC and LSI, liquid crystal panel, CCD, thin film magnetic head, and micromachine). As shown in FIG. 13, at first, in the step 201 (design step), the function and the performance of the device are designed (for example, circuit design of semiconductor device), and the pattern is designed to realize the function. Subsequently, in the step 202 (mask production step), the mask, on which the designed circuit pattern is formed, is produced. On the other hand, in the step 203 (wafer production step), the wafer is produced with a material such as silicon.

Subsequently, in the step 204 (wafer processing step), the mask and the wafer, which are prepared in the steps 201 to 203, are used to form, for example, an actual circuit on the wafer by means of the lithography technique or the like as described later on. Subsequently, in the step 205 (device assembling step), the wafer, which is processed in the step 204, is used to assemble the device. The step 205 includes, for example, the steps of dicing, bonding, and packaging (chip sealing), if necessary. Finally, in the step 206 (inspection step), the inspection is performed, for example, for the operation confirmation test and the durability test for the device produced in the step 205. After executing the steps as described above, the device is completed, and it is shipped.

Figure 14:
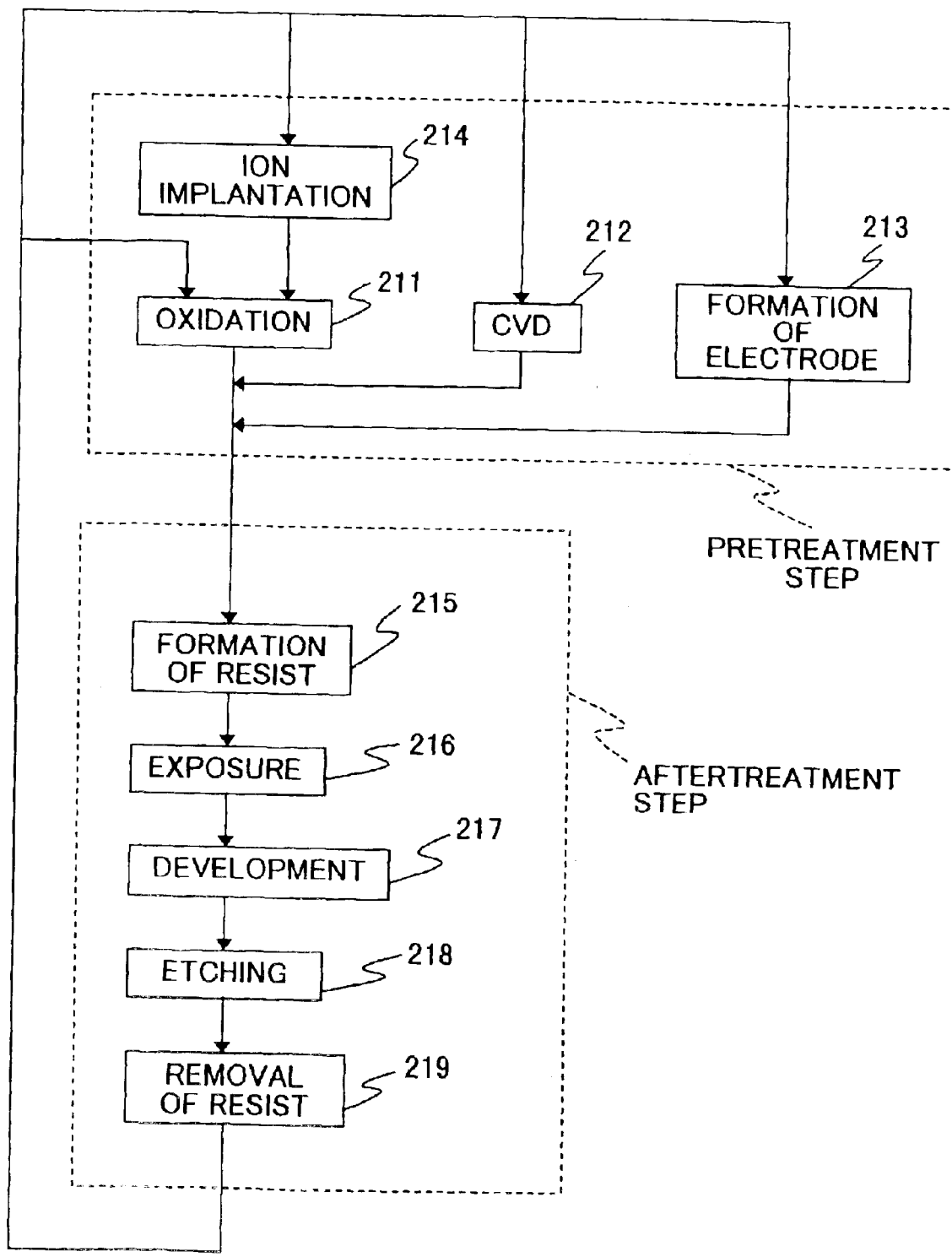
FIG. 14 shows a flow chart illustrating the process in a step 204 shown in FIG. 13.

FIG. 14 shows an example of the detailed flow of the step 204 described above in the case of the semiconductor device. With reference to FIG. 14, the surface of the wafer is oxidized in the step 211 (oxidation step). In the step 212 (CVD step), an insulative film is formed on the surface of the wafer. In the step 213 (electrode formation step), the electrode is formed on the wafer by means of the vapor deposition. In the step 214 (ion implantation step), the ion is implanted into the wafer. Each of the step 211 to the step 214 constitutes the pretreatment step at the respective stages of the wafer processing, and each of them is selected and executed depending on the necessary processing at each of the stages.

When the pretreatment step is completed at the respective stages of the wafer process, the aftertreatment step is executed as follows. In the aftertreatment step, at first, in the step 215 (resist formation step), a photosensitive agent is applied to the wafer. Subsequently, in the step 216 (exposure step), the circuit pattern on the mask is transferred to the wafer by means of the exposure apparatus and the exposure method described above. Subsequently, in the step 217 (development step), the exposed wafer is developed. In the step 218 (etching step), the exposed material, which is located at portions other than portions at which the resist remains, is removed by means of the etching. In the step 219,(resist removal step), the resist, which is unnecessary after the completion of the etching, is removed. The circuit patterns are formed in a multiple manner on the wafer by repeating the pretreatment step and the aftertreatment step.

When the method for producing the device according to the embodiment of the present invention described above is employed, the exposure apparatus 100 is used in the exposure step (step 216). Therefore, the cost can be reduced owing to the improvement in throughput. Especially, when the double exposure is performed, the device of the high degree of integration, which has been hitherto difficult to be produced, can be produced at low cost owing to the improvement in resolving power and the improvement of DOF. The exposure apparatus according to each of the embodiments of the present invention explained above can be produced by assembling the respective constitutive components in accordance with the method for producing the exposure apparatus according to the present invention.

As described above, according to the exposure apparatus (exposure apparatus produced by the production method of the present invention) and the exposure method concerning the present invention, it is possible to improve the throughput. Further, it is possible to improve the productivity per a certain occupied a real size of floor.

Especially, according to the exposure apparatus and the exposure method of the present invention, it is possible to improve the throughput, and it is possible to realize the highly accurate exposure for the fine pattern. Further, according to the method for producing the device concerning the present invention, an excellent effect is obtained in that the microdevice can be produced at the high throughput and the low cost.

What is claimed is:

1. An exposure apparatus which transfers patterns formed on masks onto substrates, the exposure apparatus comprising:

first and second mask stages which are movable along a first axial direction while holding the masks respectively;

illumination optical systems which radiate illumination light beams onto the respective masks;

first and second projection optical systems which project the illumination light beams outgoing from the respective masks onto the substrates;

first and second substrate stages which are arranged on the same side as that of the first and second mask stages with respect to the first and second projection optical systems respectively and which are movable while holding the substrates respectively, the first mask stage and the first substrate stage are movable independent from each other during exposure, the second mask stage and the second substrate stage are movable independent from each other during exposure; and a driving unit which synchronously moves the first mask stage and the first substrate stage along the first axial direction at a velocity ratio corresponding to a projection magnification of the first projection optical system and which synchronously moves the second mask stage and the second substrate stage along the first axial direction at a velocity ratio corresponding to a projection magnification of the second projection optical system.

2. The exposure apparatus according to claim 1, wherein the first mask stage and the second mask stage are moved during the synchronous movement in mutually opposite directions, and the first substrate stage and the second substrate stage are moved during the synchronous movement in mutually opposite directions.

3. The exposure apparatus according to claim 1, wherein the respective mask stages and the respective substrate stages are moved on an identical plane.

4. The exposure apparatus according to claim 1, further comprising a common base board on which the first and second mask stages and the first and second substrate stages are movably supported.

5. The exposure apparatus according to claim 4, wherein the driving unit is a linear actuator which moves, in a floating manner, the first and second mask stages and the first and second substrate stages over the common base board.

6. The exposure apparatus according to claim 4, further comprising a surface plate, wherein the base board is supported movably on the surface plate, and the base board is movable in response to a reaction force generated by the movement of at least one stage of the first and second mask stages and the first and second substrate stages.

7. The exposure apparatus according to claim 6, further comprising a linear actuator which supports, in a non-contact manner, the base board over the surface plate.

8. The exposure apparatus according to claim 1, further comprising a third substrate stage which is movable on the same plane as that for the first and second substrate stages; and a first mark detection system which detects a position adjustment mark formed on the substrate held on the third substrate stage.

9. The exposure apparatus according to claim 8, wherein the driving unit moves a third substrate stage in synchronization with the first mask stage or the second mask stage, in place of the first substrate stage or the second substrate stage.

10. The exposure apparatus according to claim 8, further comprising:

a fourth substrate stage which is movable on the same plane as that for the first, second, and third substrate stages while holding the substrate; and a second mark detection system which detects a position adjustment mark formed on the substrate held on the fourth substrate stage.

11. The exposure apparatus according to claim 10, wherein the driving unit moves the third substrate stage and the fourth substrate stage in synchronization with the first mask stage and the second mask stage respectively, in place of the first substrate stage and the second substrate stage.

12. The exposure apparatus according to claim 1, wherein the respective mask stages have a substantially identical mass, and the respective substrate stages have a substantially identical mass.

13. The exposure apparatus according to claim 2, wherein the respective projection optical systems have an identical projection magnification, and a mass of each of the mask stages is equal to a value obtained by multiplying a mass of each of the substrate stages by the projection magnification.

14. The exposure apparatus according to claim 12, wherein the driving unit drives the first and second mask stages and the first and second substrate stages on an identical straight line.

15. The exposure apparatus according to claim 1, further comprising a mask exchange mechanism which exchanges the mask on the first mask stage for the mask on the second mask stage.

16. The exposure apparatus according to claim 1, wherein each of the projection optical systems is a cata-dioptric system, and the illumination light beam has a wavelength of not more than 200 nm.

17. An exposure method for transferring patterns formed on masks onto substrates, the method comprising:
 a first step of irradiating a first mask with an illumination light beam, while synchronously and independently moving the first mask and a first substrate in a first direction at a velocity ratio corresponding to a projection magnification of a first projection optical system, so that the pattern formed on the first mask is transferred to a first comparted area on the first substrate via the first projection optical system;
 a second step of irradiating a second mask with an illumination light beam, while synchronously and independently moving the second mask and a second substrate in the first direction at a velocity ratio corresponding to a projection magnification of a second projection optical system, simultaneously with the first step, so that the pattern formed on the second mask is transferred to a second comparted area on the second substrate via the second projection optical system; and
 a third step of detecting position adjustment marks formed on a third substrate and a fourth substrate which are different from the first and second substrates respectively, simultaneously with the first and second steps.

18. The exposure method according to claim 17, wherein the first substrate and the second substrate are moved with a first substrate stage and a second substrate stage on which fiducial marks are formed respectively, and exposure areas defined in the first substrate and the second substrate are determined on the basis of the fiducial marks.

19. An exposure apparatus used in a photolithography process to produce a microdevice, the exposure apparatus comprising:
 a first mask stage which holds a first mask;
 a first projection optical system which has at least two reflecting optical elements;
 a first substrate stage which holds a first substrate on a side of the first mask stage with respect to the first projection optical system;
 a second mask stage which holds a second mask;
 a second projection optical system which has at least two reflecting optical elements;
 a second substrate stage which holds a second substrate on a side of the second mask stage with respect to the second projection optical system; and
 a driving unit which drives the first and second substrate stages in mutually opposite directions concerning a predetermined direction when the first and second substrates are subjected to scanning exposure respectively.

20. The exposure apparatus according to claim 19, further comprising a common base board on which the first and second mask stages and the first and second substrate stages are movably supported.

21. The exposure apparatus according to claim 20, wherein the driving unit is a linear actuator for the common base board, which moves, in a floating manner, the first and second mask stages and the first and second substrate stages over the common base board.

22. The exposure apparatus according to claim 20, further comprising a surface plate, wherein the base board is supported movably on surface plate, and the base board is movable in response to a reaction force generated by the movement of at least one stage of the first and second mask stages and the first and second substrate stages.

23. The exposure apparatus according to claim 22, further comprising a linear actuator which supports, in a non-contact manner, the base board over the surface plate.

24. An exposure method for transferring a device pattern onto substrates by using a predetermined exposure apparatus, the exposure method comprising:
 a first step of arranging a first substrate on a side of a first mask with respect to a first projection optical system arranged in the exposure apparatus so that the first mask and the first substrate are synchronously moved to transfer a pattern on the first mask onto the first substrate; and
 a second step of arranging a second substrate on a side of a second mask with respect to a second projection optical system arranged in the exposure apparatus so that the second mask and the second substrate are synchronously moved to transfer a pattern on the second mask onto the second substrate, wherein:
 the first and second steps are executed substantially simultaneously, and the first and second substrates are moved in mutually opposite directions concerning a predetermined direction.

25. The exposure method according to claim 24, wherein the first mask is moved in a direction opposite to the first substrate concerning the predetermined direction, and the second mask is moved in a direction opposite to the second substrate concerning the predetermined direction.

26. The exposure method according to claim 25, wherein the first and second masks and the first and second substrates are moved on an identical straight line.

27. The exposure method according to claim 24, wherein a reaction force, which is generated by the synchronous movement of the first mask and the first substrate, is mutually counteracted by a reaction force which is generated by the synchronous movement of the second mask and the second substrate.

28. The exposure method according to claim 27, wherein the first substrate and the second substrate are moved in mutually opposite directions concerning a direction perpendicular to the predetermined direction respectively after the first and second steps.

29. The exposure method according to claim 24, wherein the first substrate and the second substrate are moved with a first substrate stage and a second substrate stage on which fiducial marks are formed respectively, and exposure areas defined in the first substrate and the second substrate are determined on the basis of the fiducial marks.

30. A method for producing a device, comprising a lithography process which uses the exposure apparatus as defined in claim 1.

31. A method for producing a device, which uses the exposure method as defined claim 17.

32. An exposure apparatus which radiates energy beams onto exposure patterns formed on masks to expose objective exposure members with the patterns, the exposure apparatus comprising:
 a plurality of mask stages which are movable while holding the masks respectively;

a plurality of object stages which are movable while holding the objective exposure members respectively;

a common base board which movably supports the plurality of mask stages and the plurality of object stages; and a plurality of projection systems which project the energy beams outgoing from the respective masks onto the corresponding objective exposure members, wherein:

the objective exposure members are exposed with the patterns on the respective masks by synchronously moving the respective mask stages and the object stages corresponding thereto with respect to the respective projection systems.

33. The exposure apparatus according to claim 32, further comprising a driving unit which moves the mask stages and the object stages in a floating manner over the base board.

34. The exposure apparatus according to claim 33, wherein the driving unit is a linear actuator.

35. The exposure apparatus according to claim 33, further comprising a control unit which controls the driving unit, wherein the control unit controls the driving unit so that at least two of the mask stages are moved in mutually opposite directions.

36. The exposure apparatus according to claim 32, further comprising a support stand, on which the base board is fixed.

37. The exposure apparatus according to claim 33, further comprising a surface plate, wherein the base board is supported movably on the surface plate, and the base board is movable in response to a reaction force generated by the movement of at least one stage of the mask stage and the object stage.

38. The exposure apparatus according to claim 37, wherein the base board is supported in a non-contact manner over the surface plate.

39. The exposure apparatus according to claim 38, further comprising a linear actuator which supports the base board in a non-contact manner over the surface plate.

40. The exposure apparatus according to claim 32, wherein the energy beam from a radiation system is radiated from a back surface of the base board, and is transmitted through the mask on the mask stage supported on a front surface of the base board.

41. The exposure apparatus according to claim 32, further comprising a plurality of radiation systems which radiate the energy beams onto the respective projection systems.

42. The exposure apparatus according to claim 41, wherein the two projection systems are provided, and the projection systems are arranged symmetrically on the base board.

43. The exposure apparatus according to claim 32, further comprising an interferometer which measures positions of the plurality of mask stages and the plurality of object stages on the base board.

44. The exposure apparatus according to claim 43, wherein the plurality of mask stages and the plurality of object stages include reflecting members which reflect beams radiated from the interferometer respectively.

45. A method for producing a device, which uses the exposure method as defined claim 24.

46. The exposure apparatus according to claim 44, wherein:

a two-dimensional position on the base board is determined by using a rectangular coordinate system defined, on the base board, by a predetermined first axis and a second axis perpendicular thereto;

at least one stage of the plurality of mask stages and the plurality of object stages includes a reflecting surface extending in a direction of a third axis intersecting the first axis and the second axis;

a position of the one stage in the direction of the third axis is measured by the interferometer by radiating the beam to the reflecting surface and receiving a reflected light beam therefrom; and the exposure apparatus further comprises a calculating unit which calculates a position coordinate of the one stage on the rectangular coordinate system defined by the first axis and the second axis on the basis of the measured position in the direction of the third axis.

47. The exposure apparatus according to claim 32, wherein the objective exposure member is a photosensitive substrate, and the exposure apparatus is a projection exposure apparatus used in a lithography process for producing a device.

48. The exposure apparatus according to claim 32, wherein a fiducial mark is formed on each of the object stages, and an exposure area, which is defined on the objective exposure member, is determined on the basis of the fiducial mark.

49. An exposure apparatus for exposing second objects with energy beams radiated to first objects each having a pattern, the exposure apparatus comprising:

a plurality of first movable members which holds the first objects, the first movable members being arranged on a first surface plate and movable on the first surface plate to relatively move the first objects with respect to the energy beams;

a plurality of second movable members which holds the second objects, the second movable members being arranged on the first surface plate and movable on the first surface plate to relatively move the second objects with respect to the energy beams in synchronization with the movement of the first objects during scanning exposure for the second objects; and illumination optical systems each of which includes at least one optical element arranged on a side opposite to the first object with respect to the first surface plate in order to radiate the energy beam to the first object held by each of the first movable members.

50. The exposure apparatus according to claim 49, further comprising a second surface plate which supports the first surface plate so that the first surface plate is moved in response to movement of at least one of the plurality of first and second movable members.

51. The exposure apparatus according to claim 50, wherein the second surface plate is provided with a second linear actuator which supports the first surface plate in a non-contact manner.

52. The exposure apparatus according to claim 49, wherein the first surface plate is provided with a first linear actuator which supports the plurality of first and second movable members in a non-contact manner respectively.

53. The exposure apparatus according to claim 52, wherein the first linear actuator moves the plurality of first and second movable members with six degrees of freedom respectively.

54. The exposure apparatus according to claim 49, further comprising actuators which are provided on the first surface plate and which move two of the plurality of first movable members in mutually opposite directions during the scanning exposure for the second objects.

55. The exposure apparatus according to claim 54, wherein the actuators move two of the second movable members corresponding to the two first movable members in mutually opposite directions.

56. The exposure apparatus according to claim 55, wherein the actuators move one of the two first movable members and the second movable member corresponding thereto in the mutually opposite directions.

57. The exposure apparatus according to claim 55, wherein the actuators move the two first movable members and the two second movable members on substantially identical straight lines.

58. The exposure apparatus according to claim 49, further comprising a plurality of first interferometers which detect position information on the plurality of first movable members respectively.

59. The exposure apparatus according to claim 58, wherein the plurality of first interferometers have a plurality of first measuring axes which are used to detect the position information in relation to a direction of a first axis in which the first object is moved during the scanning exposure and a direction of a second axis perpendicular thereto respectively.

60. The exposure apparatus according to claim 59, wherein the plurality of first measuring axes include a measuring axis which is used to detect information in relation to rotation of the first movable member about a third axis perpendicular to the first and second axes.

61. The exposure apparatus according to claim 60, wherein the plurality of first measuring axes include at least one measuring axis which is used to detect information in relation to rotation of the first movable member concerning at least one of the first and second axes.

62. The exposure apparatus according to claim 58, further comprising a plurality of second interferometers which detect position information on the plurality of second movable members respectively.

63. The exposure apparatus according to claim 62, wherein the plurality of second interferometers have a plurality of second measuring axes which are used to detect the position information in relation to a direction of a first axis in which the second object is moved during the scanning exposure and a direction of a second axis perpendicular thereto respectively.

64. The exposure apparatus according to claim 63, wherein the plurality of second measuring axes include a measuring axis which is used to detect information in relation to rotation of the second movable member about a third axis perpendicular to the first and second axes.

65. The exposure apparatus according to claim 64, wherein the plurality of second measuring axes include at least one measuring axis which is used to detect information in relation to rotation of the second movable member about at least one of the first and second axes.

66. The exposure apparatus according to claim 49, wherein a number of the plurality of second movable members is larger than that of the plurality of first movable members by at least one.

67. The exposure apparatus according to claim 66, further comprising a first linear actuator which is provided on the first surface plate in order that the plurality of first movable members and the plurality of second movable members corresponding thereto are synchronously moved respectively, and the at least one second movable member is moved irrelevant to the synchronous movement.

68. The exposure apparatus according to claim 67, further comprising a plurality of second interferometers which have two second measuring axes intersecting at least within a radiation area of the energy beam in order to detect position information of the plurality of second movable members which are synchronously moved, and a third interferometer which has two third measuring axes intersecting outside the radiation area in order to detect position information of the at least one second movable member.

69. The exposure apparatus according to claim 68, wherein one of the plurality of second interferometers and the third interferometer are arranged so that one of the plurality of second movable members is simultaneously detected by at least one second measuring axis of the one second interferometer and at least one third measuring axis of the third interferometer.

70. The exposure apparatus according to claim 68, further comprising a mark detection system which has a detection center substantially at a point of intersection of the two third measuring axes, for detecting a mark on the second object held by the at least one second movable member.

71. The exposure apparatus according to claim 67, wherein the first linear actuator exchanges the one second movable member which is synchronously moved with one of the plurality of first movable members, for another second movable member which is moved irrelevant to the synchronous movement, after completion of the scanning exposure for the second object which is held by the one second movable member.

72. An exposure method for exposing substrates with energy beams radiated onto masks, comprising:
synchronously moving a first mask and a first substrate therefor, and synchronously moving a second mask and a second substrate therefor, in order to perform scanning exposure for the first and second substrates with the energy beams respectively, wherein the first and second masks or the first and second substrates are moved in opposite directions on an identical plane.

73. The exposure method according to claim 72, wherein the synchronous movement of the first mask and the first substrate is performed substantially simultaneously with the synchronous movement of the second mask and the second substrate.

74. The exposure method according to claim 72, wherein the first and second masks and the first and second substrates are arranged on the identical plane.

75. The exposure method according to claim 72, wherein the first and second masks and the first and second substrates are moved in the opposite directions respectively.

76. The exposure method according to claim 75, wherein the first mask and the first substrate are moved in the opposite directions.

77. The exposure method according to claim 76, wherein the first and second masks and the first and second substrates are moved on a substantially identical straight line.

78. The exposure method according to claim 72, wherein second scanning exposure based on the use of the second mask is performed for the first substrate continuously to first scanning exposure based on the use of the first mask.

79. The exposure method according to claim 78, wherein the first mask is exchanged with the second mask before the second scanning exposure.

80. The exposure method according to claim 78, wherein the first substrate is subjected to multiple exposure by the first scanning exposure and the second scanning exposure.

81. The exposure method according to claim 78, wherein a first pattern on the first mask and a second pattern on the second mask are transferred to different areas of the first substrate by the first scanning exposure and the second scanning exposure.

82. The exposure method according to claim 72, wherein a mark on a third substrate is detected concurrently with scanning exposure operation for the first substrate, a mark on the first mask is detected before the scanning exposure for the third substrate, and results of the detection are used for the scanning exposure for the third substrate.

83. The exposure method according to claim 82, wherein the mark on the first mask is detected together with a fiducial mark provided on a movable member for holding the third substrate.

84. The exposure method according to claim 83, wherein mutually different interferometers are used for the detection of the mark on the third substrate and the detection of the fiducial mark.

85. The exposure method according to claim 84, wherein when the movable member is simultaneously detected by a measuring axis of an interferometer to be used for the detection of the mark on the third substrate and a measuring axis of an interferometer to be used for the detection of the fiducial mark, respective measured values of the two interferometers are allowed to correspond to one another.

86. The exposure method according to claim 72, wherein a scanning exposure condition for the first substrate is different from a scanning exposure condition for the second substrate.

87. The exposure method according to claim 86, wherein the scanning exposure condition includes an intensity distribution of the energy beam on a pupil plane of an illumination optical system which radiates the energy beam, and a numerical aperture of a projection optical system through which the energy beam passes.

88. The exposure method according to claim 72, wherein the first and second masks are transmitting type masks, and the energy beams are radiated respectively to the first and second masks on an opposite side with respect to a base on which the first and second masks are arranged.

89. The exposure method according to claim 88, wherein the energy beam is a vacuum ultraviolet light beam having a wavelength of not more than about 200 nm.

90. The exposure method according to claim 72, wherein the first and second masks are reflecting type masks, and the energy beams are radiated respectively to the first and second masks on an identical side with respect to a base on which the first and second masks are arranged.

91. The exposure method according to claim 90, wherein the energy beam is an EUV light beam having a wavelength within a range of 5 to 15 nm, and a main light beam thereof is inclined with respect to a direction perpendicular to the first and second masks.

92. A method for producing a device, which uses the exposure method as defined in claim 72.

93. A method for producing an exposure apparatus which transfers patterns formed on masks onto substrates, the method comprising:
providing first and second mask stages which are movable along a first axial direction while holding the masks respectively;
providing illumination optical systems which radiate illumination light beams onto the respective masks;
providing first and second projection optical systems which project the illumination light beams outgoing from the respective masks onto the substrates respectively;
providing first and second substrate stages which are arranged on the same side as that of the first and second mask stages with respect to the first and second projection optical systems respectively and which are movable while holding the substrates respectively, the first mask stage and the first substrate stage are movable independent from each other during exposure, the second mask stage and the second substrate stage are movable independent from each other during exposure; and
providing a driving unit which synchronously moves the first mask stage and the first substrate stage along the first axial direction at a velocity ratio corresponding to a projection magnification of the first projection optical system and which synchronously moves the second mask stage and the second substrate stage along the first axial direction at a velocity ratio corresponding to a projection magnification of the second projection optical system.

94. A method for producing an exposure apparatus used in a photolithography process to produce a microdevice, the method comprising:
providing a first mask stage which holds a first mask;
providing a first projection optical system which has at least two reflecting optical elements;
providing a first substrate stage which holds a first substrate on a side of the first mask stage with respect to the first projection optical system;
providing a second mask stage which holds a second mask;
providing a second projection optical system which has at least two reflecting optical elements;
providing a second substrate stage which holds a second substrate on a side of the second mask stage with respect to the second projection optical system; and
providing a driving unit which drives the first and second substrate stages in mutually opposite directions concerning a predetermined direction when the first and second substrates are subjected to scanning exposure respectively.

95. A method for producing an exposure apparatus which radiates energy beams onto exposure patterns formed on masks to expose objective exposure members with the patterns, the method comprising:
providing a plurality of mask stages which are movable while holding the masks respectively;
providing a plurality of object stages which are movable while holding the objective exposure members respectively;
providing a common base board which movably supports the plurality of mask stages and the plurality of object stages; and
providing a plurality of projection systems which project the energy beams outgoing from the respective masks onto the corresponding objective exposure members respectively, wherein:
the exposure apparatus is operated such that the objective exposure members are exposed with the patterns on the respective masks by synchronously moving the respective mask stages and the object stages corresponding thereto with respect to the respective projection systems.

96. A method for producing a device, comprising a lithography process which uses the exposure apparatus as defined in claim 19.

97. An exposure apparatus used in a photolithography process to produce a microdevice, the exposure apparatus comprising:
a first mask stage which holds a first mask;
a first substrate stage which holds a first substrate;
a first projection optical system which projects a mask pattern formed on the first mask onto the first substrate;

a second mask stage which holds a second mask;

a second substrate stage which holds a second substrate;

a second projection optical system which projects a mask pattern formed on the second mask onto the second substrate; and a driving unit which drives the first and second substrate stages in mutually opposite directions concerning a predetermined direction when the first and second substrates are subjected to scanning exposure respectively.

98. An exposure method for transferring a device pattern onto substrates by using a predetermined exposure apparatus, the exposure method comprising:

a first step of synchronously moving a first mask and a first substrate so that a pattern on the first mask is transferred onto the first substrate through a first projection optical system arranged in the exposure apparatus; and a second step of synchronously moving a second mask and a second substrate so that a pattern on the second mask is transferred onto the second substrate through a second projection optical system arranged in the exposure apparatus, wherein:

the first and second steps are executed substantially simultaneously, and the first and second substrates are moved in mutually opposite directions concerning a predetermined direction.

99. The exposure method according to claim 98, wherein the first mask is moved in a direction opposite to the first substrate concerning the predetermined direction, and the second mask is moved in a direction opposite to the second substrate concerning the predetermined direction.

100. The exposure method according to claim 98, wherein the first substrate and the second substrate are moved in mutually opposite directions concerning a direction perpendicular to the predetermined direction respectively after the first and second steps.

101. The exposure method according to claim 98, wherein the first substrate and the second substrate are moved with a first substrate stage and a second substrate stage on which fiducial marks are formed respectively, and exposure areas defined in the first substrate and the second substrate are determined on the basis of the fiducial marks.

102. A method for producing a device, comprising a lithography process which uses the exposure apparatus as defined in claim 97.

103. An exposure method for transferring patterns formed on masks onto substrates, the method comprising:

a first step of irradiating a first mask with an illumination light beam, while synchronously and independently moving the first mask and a first substrate in a first direction at a velocity ratio corresponding to a projection magnification of a first projection optical system, so that the pattern formed on the first mask is transferred to a first comparted area on the first substrate via the first projection optical system;

a second step of irradiating a second mask with an illumination light beam, while synchronously and independently moving the second mask and a second substrate in the first direction at a velocity ratio corresponding to a projection magnification of a second projection optical system, simultaneously with the first step, so that the pattern formed on the second mask is transferred to a second comparted area on the second substrate via the second projection optical system;

a third step of irradiating the second mask with the illumination light beam, while synchronously moving the second mask and the first substrate in the first direction at the velocity ratio corresponding to the projection magnification of the first projection optical system after completing the first and second steps, so that the pattern formed on the second mask is overlay-transferred to the first comparted area on the first substrate via the first projection optical system; and a fourth step of irradiating the first mask with the illumination light beam, while synchronously moving the first mask and the second substrate in the first direction at the velocity ratio corresponding to the projection magnification of the second projection optical system, simultaneously with the third step, so that the pattern formed on the first mask is overlay-transferred to the second comparted area on the second substrate via the second projection optical system.

* * * * *